United States Patent
Yamazaki et al.

(10) Patent No.: US 9,306,074 B2
(45) Date of Patent: Apr. 5, 2016

(54) SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Masahiko Hayakawa, Tochigi (JP); Shinpei Matsuda, Kanagawa (JP); Daisuke Matsubayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 8 days.

(21) Appl. No.: 14/293,484

(22) Filed: Jun. 2, 2014

(65) Prior Publication Data

US 2014/0361292 A1    Dec. 11, 2014

(30) Foreign Application Priority Data

Jun. 5, 2013  (JP) ................................ 2013-119146
Jan. 14, 2014 (JP) ................................ 2014-004227
Mar. 18, 2014 (JP) ................................ 2014-054449

(51) Int. Cl.
*H01L 29/10*    (2006.01)
*H01L 29/12*    (2006.01)
*H01L 29/786*   (2006.01)

(52) U.S. Cl.
CPC ...... *H01L 29/7869* (2013.01); *H01L 29/78648* (2013.01); *H01L 29/78696* (2013.01)

(58) Field of Classification Search
CPC ..................... H01L 29/7869; H01L 29/78648; H01L 29/78696
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1 737 044 A1    12/2006
EP    2 226 847 A2    9/2010
(Continued)

OTHER PUBLICATIONS

Prins, M.W.J. et al., "A Ferroelectric Transparent Thin-Film Transistor," Applied Physics Letters, Jun. 17, 1996, vol. 68, No. 25, pp. 3650-3652.
(Continued)

*Primary Examiner* — Victor A Mandala
(74) *Attorney, Agent, or Firm* — Husch Blackwell LLP

(57) ABSTRACT

Provided is a semiconductor device including a transistor having excellent electrical characteristics (e.g., on-state current, field-effect mobility, or frequency characteristics) or a semiconductor device including a transistor with high reliability. In the channel width direction of a channel-etched transistor in which an oxide semiconductor film is between first and second gate electrodes, the first and second gate electrodes are connected to each other through an opening portion in first and second gate insulating films. In addition, the first and second gate electrodes surround the oxide semiconductor film in a cross-section in the channel width direction, with the first gate insulating film provided between the first gate electrode and the oxide semiconductor film and the second gate insulating film provided between the second gate electrode and the oxide semiconductor film. Furthermore, the channel length of the transistor is 0.5 μm or longer and 6.5 μm or shorter.

8 Claims, 41 Drawing Sheets

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 * | 11/2007 | Hoffman ............ H01L 29/7869 257/43 |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0244029 | A1 | 9/2010 | Yamazaki et al. |
| 2011/0140100 | A1 | 6/2011 | Takata et al. |
| 2012/0119205 | A1 | 5/2012 | Taniguchi et al. |
| 2012/0280238 | A1 * | 11/2012 | Kimura ............ H01L 27/1225 257/59 |
| 2014/0042395 | A1 * | 2/2014 | Shim ................. H01L 29/786 257/40 |
| 2014/0339539 | A1 | 11/2014 | Yamazaki et al. |
| 2014/0339542 | A1 | 11/2014 | Yamazaki et al. |
| 2014/0340608 | A1 | 11/2014 | Yamazaki et al. |
| 2014/0361290 | A1 | 12/2014 | Yamazaki et al. |
| 2014/0362324 | A1 | 12/2014 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2011-124360 | A | 6/2011 |
| JP | 2011-138934 | A | 7/2011 |
| WO | WO 2004/114391 | A1 | 12/2004 |

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y. et al., "29.1:Polarizer-Free Reflective LCD Combined With Ultra Low-Power Driving Technology," SID Digest '09: SID International Symposium Digest of Technical Papers, May 31, 2009, pp. 395-398.

Chern, H.-N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D.-H. et al., "21.2:Al and Sn-Doped Zinc Indium Oxide Thin Film Transistors for AMOLED Back-Plane," SID Digest'09: SID International Symposium Digest of Technical Papers, May 31, 2009, pp. 280-283.

Clark, S.J. et al., "First Principles Methods Using Castep," Zeitschrift fur Kristallographie, 2005, vol. 220, pp. 567-570.

(56) References Cited

OTHER PUBLICATIONS

Coates, D. et al., "Optical Studies of the Amorphous Liquid-Cholesteric Liquid Crystal Transition:The Blue Phase," Physics Letters, Sep. 10, 1973, vol. 45A, No. 2, pp. 115-116.
Costello, M.J. et al., "Electron Microscopy of a Cholesteric Liquid Crystal and Its Blue Phase," Physical Review. A, May 1, 1984, vol. 29, No. 5, pp. 2957-2959.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E. et al., "Wide-Bandgap High-Mobility Zno Thin-Film Transistors Produced at Room Temperature," Applied Physics Letters, Sep. 27, 2004, vol. 85, No. 13, pp. 2541-2543.
Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H. et al., "P-9:Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R. et al., "42.1: Invited Paper: Improved Amorphous In—Ga—Zn—O TFTS", SID Digest '08: SID International Symposium Digest of Technical Papers, May 20, 2008, vol. 39, pp. 621-624.
Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Hosono, H., "68.3:Invited Paper:Transparent Amorphous Oxide Semiconductors for High Performance TFT," SID Digest '07: SID International Symposium Digest of Technical Papers, 2007, vol. 38, pp. 1830-1833.
Hsieh, H.-H. et al., "P-29:Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Ikeda, T. et al., "21.2: Full-Functional System Liquid Crystal Display Using CG-Silicon Technology," SID Digest '04: SID International Symposium Digest of Technical Papers, 2004, vol. 35, pp. 860-863.
Janotti, A. et al., "Native Point Defects in ZnO," Physical Review. B, Oct. 4, 2007, vol. 76, No. 16, pp. 165202-1-165202-22.
Janotti, A. et al., "Oxygen Vacancies in ZnO," Applied Physics Letters, 2005, vol. 87, pp. 122102-1-122102-3.
Jeong, J.K. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Jin, D.-U. et al., "65.2:Distinguished Paper: World-Largest (6.5") Flexible Full Color Top Emission AMOLED Display on Plastic Film and its Bending Properties," SID Digest '09: SID International Symposium Digest of Technical Papers, May 31, 2009, pp. 983-985.
Kanno, H. et al., "White Stacked Electrophosphorecent Organic Light-Emitting Devices Employing MOO3 As A Charge-Generation Layer," Advanced Materials, 2006, vol. 18, No. 3, pp. 339-342.
Kikuchi, H. et al., "39.1:Invited Paper:Optically Isotropic Nano-Structured Liquid Crystal Composites for Display Applications," SID Digest '09: SID International Symposium Digest of Technical Papers, May 31, 2009, pp. 578-581.
Kikuchi, H. et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.
Kimizuka, N. et al., "Spinel,YBFE2O4, and YB2FE3O7 Types of Structures for Compounds in the IN2O3 and SC2O3—A2O3—BO Systems [A; FE, GA, OR AL; B: MG, MN, FE, NI, CU,OR ZN] at Temperatures Over 1000° C," Journal of Solid State Chemistry, 1985, vol. 60, pp. 382-384.
Kimizuka, N. et al., "Syntheses and Single-Crystal Data of Homologous Compounds, In2O3(ZnO)m (m = 3, 4, and 5), InGaO3(ZnO)3, and Ga2O3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Kitzerow, H.-S. et al., "Observation of Blue Phases in Chiral Networks," Liquid Crystals, 1993, vol. 14, No. 3, pp. 911-916.
Kurokawa, Y. et al., "UHF RFCPUs on Flexible and Glass Substrates for Secure RFID Systems," Journal of Solid-State Circuits, 2008, vol. 43, No. 1, pp. 292-299.
Lany, S. et al., "Dopability, Intrinsic Conductivity, and Nonstoichiometry of Transparent Conducting Oxides," Physical Review Letters, Jan. 26, 2007, vol. 98, pp. 0455001-1-045501-4.
Lee, H.-N. et al., "Current Status of, Challenges to, and Perspective View of AM-OLED," IDW '06: Proceedings of the 13th International Display Workshops, Dec. 7, 2006, pp. 663-666.
Lee, J.-H. et al., "42.2: World's Largest (15-inch) XGA AMLCD Panel Using IGZO OXIDE TFT," SID Digest '08: SID International Symposium Digest of Technical Papers, May 20, 2008, vol. 39, pp. 625-628.
Lee, M.-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.
Meiboom, S. et al., "Theory of the Blue Phase of Cholesteric Liquid Crystals," Physical Review Letters, May 4, 1981, vol. 46, No. 18, pp. 1216-1219.
Miyasaka, M., "58.2: Invited Paper: Suftla Flexible Microelectronics on their Way to Business," SID Digest '07: SID International Symposium Digest of Technical Papers, 2007, vol. 38, pp. 1673-1676.
Mo, Y.-G. et al., "Amorphous Oxide TFT Backplanes for Large Size AMOLED Displays," IDW '08: Proceedings of the 6th International Display Workshops, Dec. 3, 2008, pp. 581-584.
Nakamura, M. et al., "The Phase Relations in the In2O3—Ga2ZnO4—ZnO System at 1350° C,"Journal of Solid State Chemistry, Aug. 1, 1991, vol. 93, No. 2, pp. 298-315.
Nakamura, M., "Synthesis of Homologous Compound with New Long-Period Structure," NIRIM Newsletter, Mar. 1, 1995, vol. 150, pp. 1-4.
Nomura, K. et al., "Amorphous Oxide Semiconductors for High-Performance Flexible Thin-Film Transistors," Japanese Journal of Applied Physics, 2006, vol. 45, No. 5B, pp. 4303-4308.
Nomura, K. et al., "Carrier Transport in Transparent Oxide Semiconductor with Intrinsic Structural Randomness Probed using Single-Crystalline InGaO3(ZnO)5 Films," Applied Physics Letters, Sep. 13, 2004, vol. 85, No. 11, pp. 1993-1995.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Nomura, K. et al., "Thin-Film Transistor Fabricated in Single-Crystalline Transparent Oxide Semiconductor," Science, May 23, 2003, vol. 300, No. 5623, pp. 1269-1272.
Nowatari, H. et al., "60.2: Intermediate Connector with Suppressed Voltage Loss for White Tandem OLEDS," SID Digest '09: SID International Symposium Digest of Technical Papers, May 31, 2009, vol. 40, pp. 899-902.

(56) References Cited

OTHER PUBLICATIONS

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZNO Thin-Film Transistors with Aluminum Dielectric Layers," Journal of the Electrochemical Society, 2008, vo. 155, No. 12, pp. H1009-H1014.

Ohara, H. et al., "21.3:4.0 in. QVGA AMOLED Display Using In—Ga—Zn—Oxide TFTs with a Novel Passivation Layer," SID Digest '09: SID International Symposium Digest of Technical Papers, May 31, 2009, pp. 284-287.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Osada, T. et al., "Development of Driver-Integrated Panel Using Amorphous In—Ga—Oxide TFT," AM-FPD '09 Digest of Technical Papers, Jul. 1, 2009, pp. 33-36.

Park, J.-S. et al., "Amorphous Indium—Gallium—Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J.-S. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Park, J.-C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J.-S. et al., "Improvments in the Device Charcteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S.-H.K. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparebt Thin-Film Transistor," Applied Physics Letters, Jun. 17, 1996, vol. 68, No. 25, pp. 3650-3652.

Sakata, J. et al., "Development of 4.0-in. AMOLED Display with Driver Circuit Using Amorphous In—Ga—Zn—Oxide TFTs," IDW'09: Proceedings of the 16th International Display Workshops, 2009, pp. 689-692.

Son, K.-S. et al., "42.4L: Late-News Paper: 4 inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of Igzo Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 with Sputtered Al2O3 Gate Insulator," Applied Physics Letters, Sep. 1, 2003, vol. 83, No. 9, pp. 1755-1757.

Van de Walle, C.G. "Hydrogen as a Cause of Doping in Zinc Oxide," Physical Review Letters, Jul. 31, 2000, vol. 85, No. 5, pp. 1012-1015.

\* cited by examiner

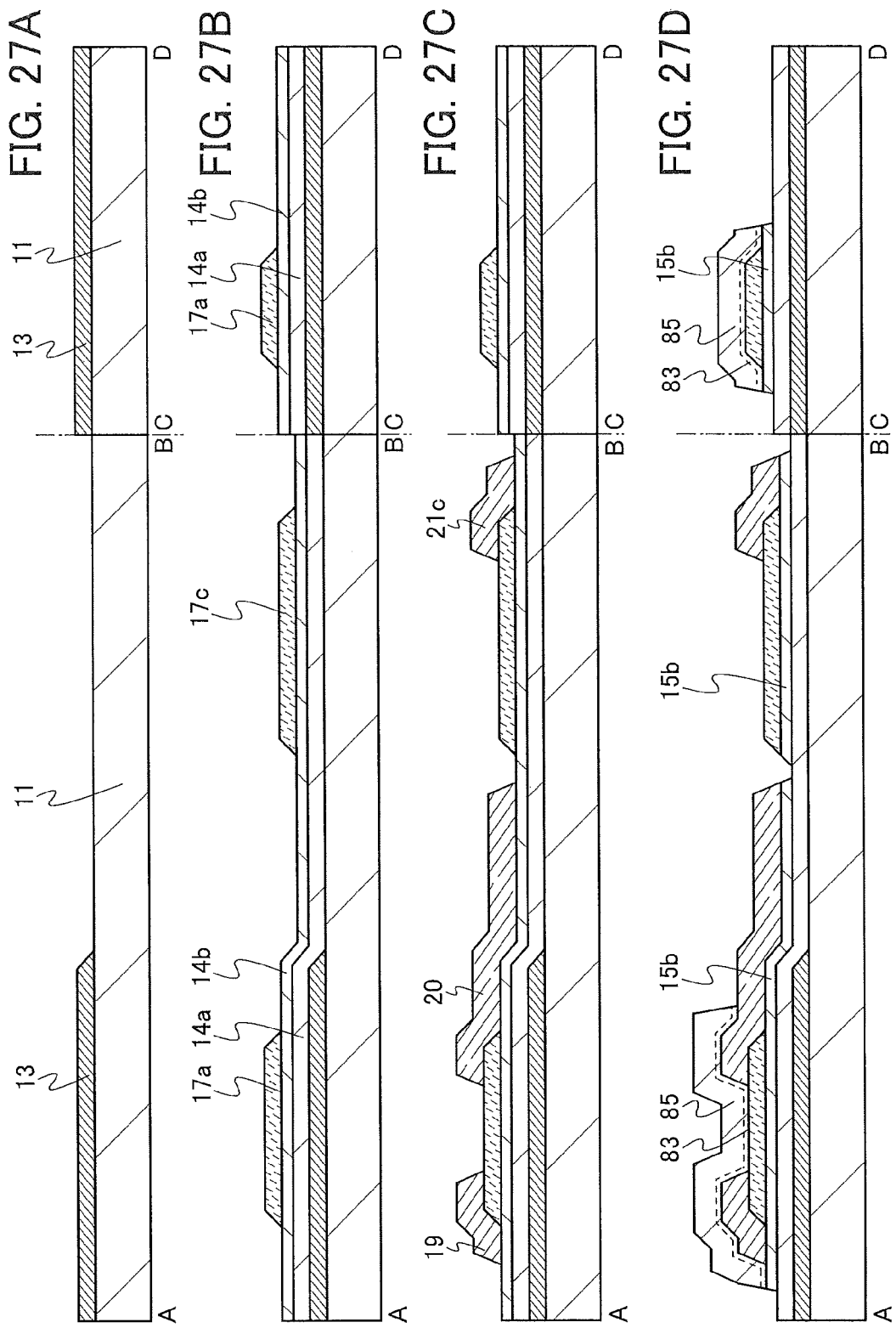

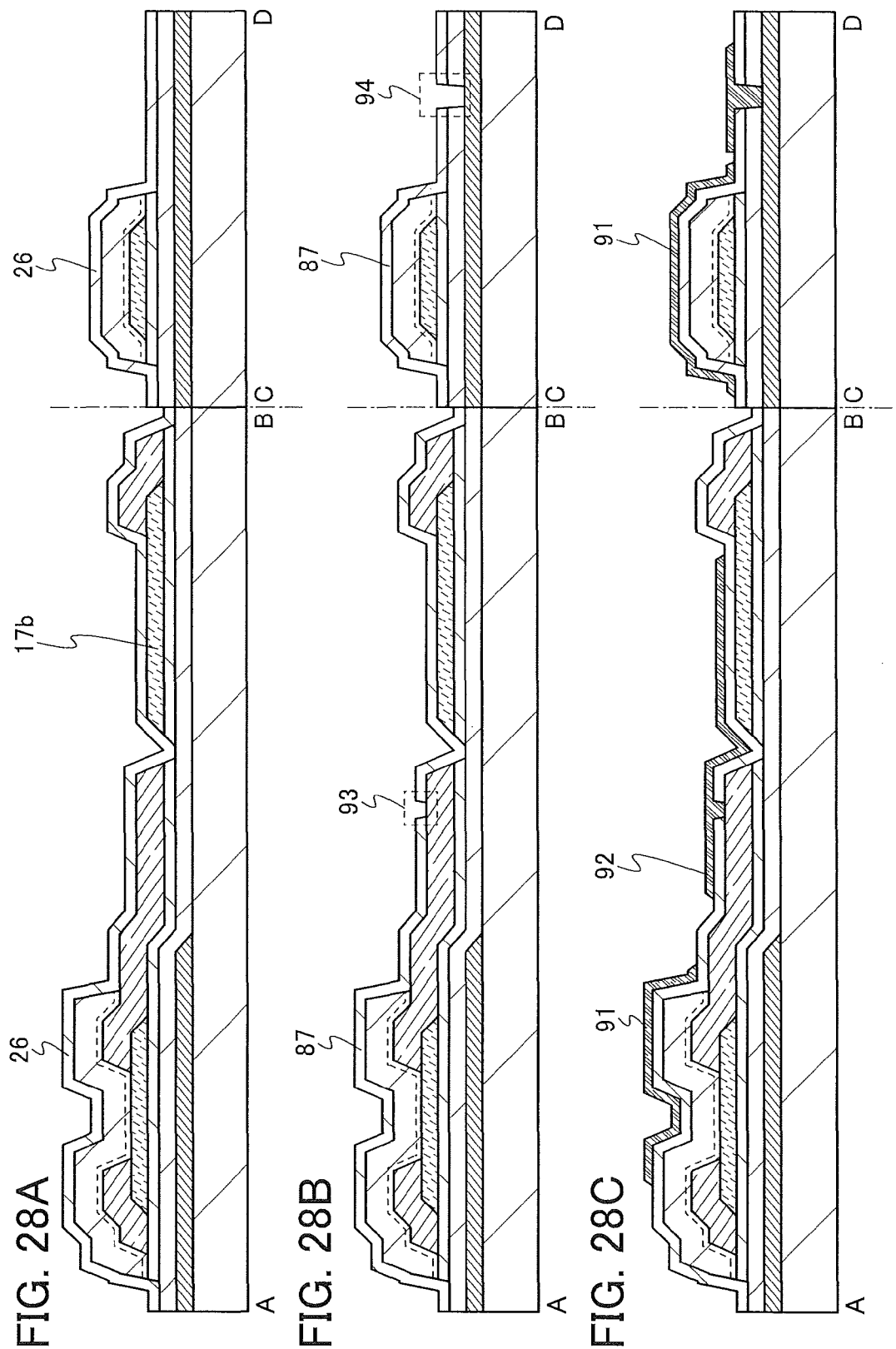

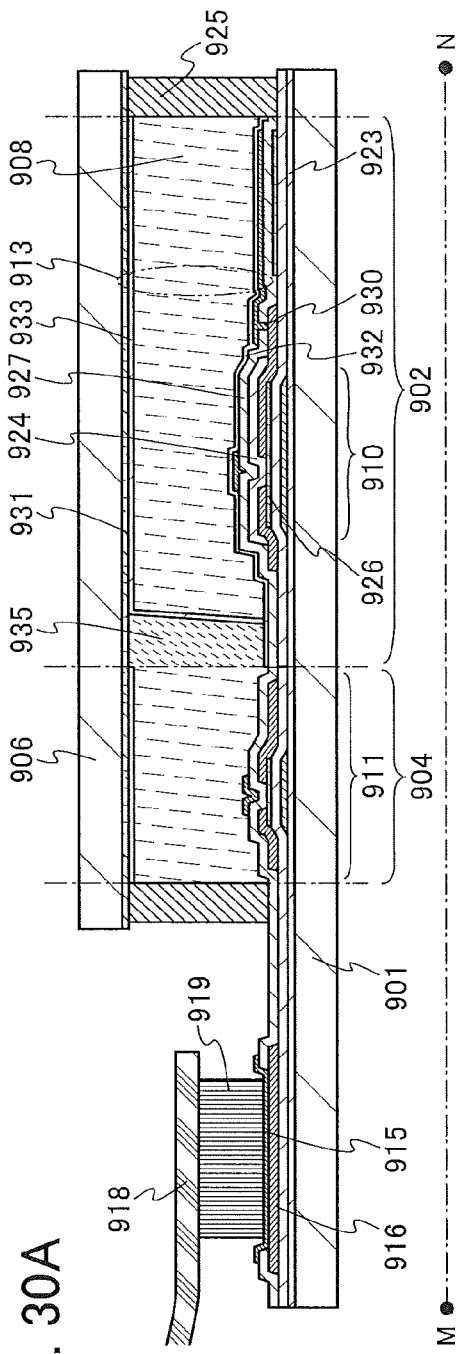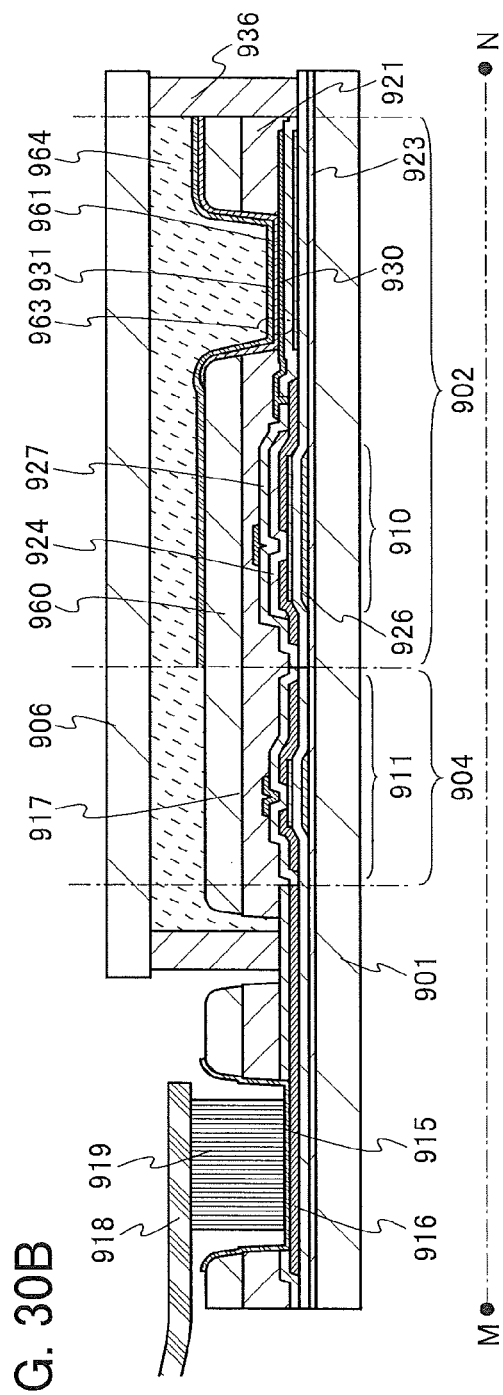

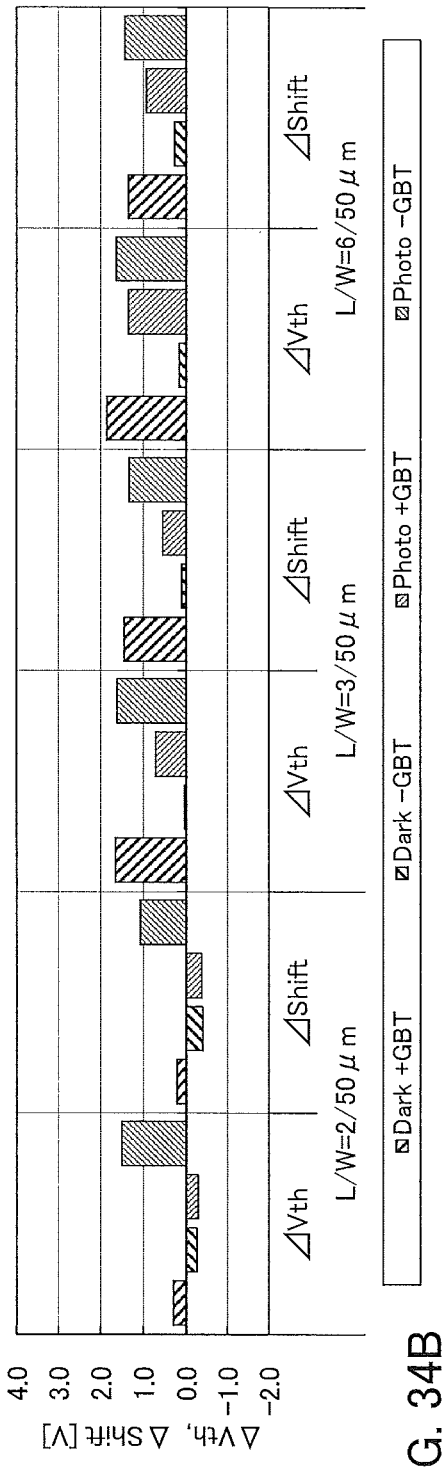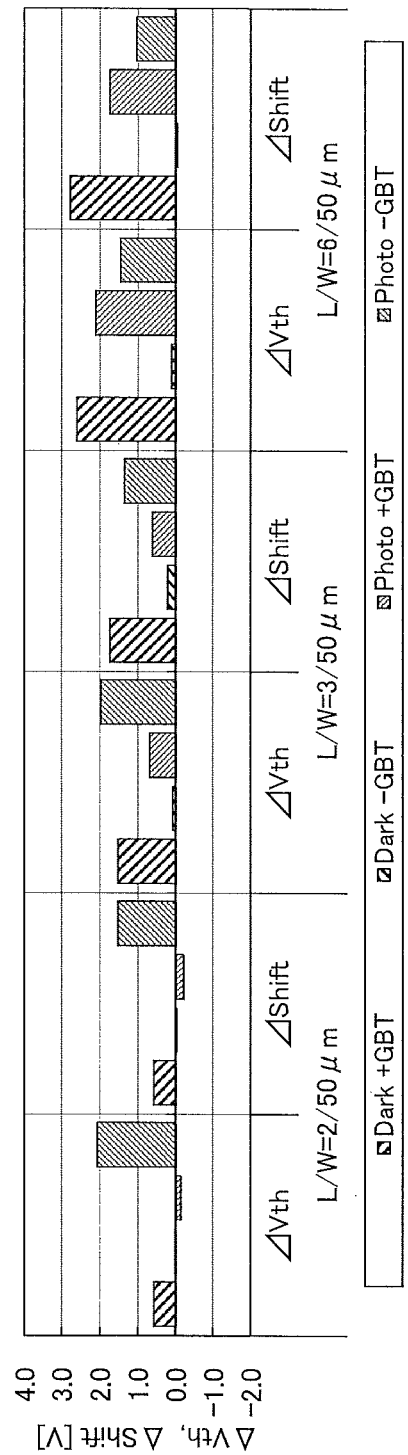
FIG. 34A Sample 1
FIG. 34B Sample 2

Off state

On state

SEMICONDUCTOR DEVICE

BACKGROUND OF THE INVENTION

1. Field of the Invention

The present invention relates to a semiconductor device having a transistor including an oxide semiconductor film and a method for manufacturing the semiconductor device. Note that one embodiment of the present invention is not limited to the above technical field. The technical field of one embodiment of the present invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

Attention has been focused on a technique for forming a transistor using a semiconductor thin film formed over a substrate (also referred to as thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer of the transistor is disclosed (see Patent Document 1).

Further, a technique of improving carrier mobility by forming stacked oxide semiconductor layers has been disclosed (see Patent Documents 2 and 3).

REFERENCE

Patent Documents

[Patent Document 1] Japanese Published Patent Application No. 2006-165528
[Patent Document 2] Japanese Published Patent Application No. 2011-138934
[Patent Document 3] Japanese Published Patent Application No. 2011-124360

SUMMARY OF THE INVENTION

One embodiment of the present invention provides a semiconductor device including a transistor having excellent electrical characteristics (e.g., on-state current, field-effect mobility, or frequency characteristics). Another embodiment of the present invention provides a semiconductor device including a transistor with high reliability. Another embodiment of the present invention provides a novel semiconductor device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a channel-etched transistor in which an oxide semiconductor film is provided between a first gate electrode and a second gate electrode. In the channel width direction of the transistor, the first gate electrode and the second gate electrode are connected to each other through an opening portion provided in a first gate insulating film and a second gate insulating film. In addition, the first gate electrode and the second gate electrode surround the oxide semiconductor film in a cross section perpendicular to the channel length direction, with the first gate insulating film provided between the first gate electrode and the oxide semiconductor film and the second gate insulating film provided between the second gate electrode and the oxide semiconductor film. Furthermore, the channel length of the transistor is longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 pin, yet still further preferably longer than 1 µm and shorter than or equal to 2.5 µm.

Another embodiment of the present invention is a channel-etched transistor in which an oxide semiconductor film is provided between a first gate electrode and a second gate electrode. In the channel width direction of the transistor, the first gate electrode and the second gate electrode are connected to each other through an opening portion provided in a first gate insulating film and a second gate insulating film. In addition, in the channel width direction, side surfaces of the oxide semiconductor film overlap with the first gate electrode and the second gate electrode. Furthermore, the channel length of the transistor is longer than or equal to 0.5 µm and shorter than or equal to 6.5 µm, preferably longer than 1 µm and shorter than 6 µm, further preferably longer than 1 µm and shorter than or equal to 4 still further preferably longer than 1 µm and shorter than or equal to 3.5 µm, yet still further preferably longer than 1 µm and shorter than or equal to 2.5 µm.

Note that in the channel width direction of the transistor, the first gate electrode and the second gate electrode may be connected to each other on outer sides of one side surface and the other side surface of the oxide semiconductor film.

Alternatively, in the channel width direction of the transistor, the first gate electrode and the second gate electrode may be connected to each other on the outer side of one side surface of the oxide semiconductor film, and may face each other on the outer side of the other side surface, with the first gate insulating film and/or the second gate insulating film provided between the first gate electrode and the second gate electrode.

Alternatively, in the channel width direction of the transistor, the second gate electrode and each of one side surface and the other side surface of the oxide semiconductor film may be provided so that the second gate insulating film is positioned therebetween.

Another embodiment of the present invention is a channel-etched transistor including a first gate electrode, an oxide semiconductor film overlapping with the first gate electrode, a first nitride insulating film between the first gate electrode and the oxide semiconductor film, a pair of electrodes in contact with the oxide semiconductor film, an oxide insulating film in contact with the oxide semiconductor film, a second nitride insulating film in contact with the first nitride insulating film and the oxide insulating film, and a second gate electrode which is over the second nitride insulating film and overlaps with the oxide semiconductor film. The oxide semiconductor film and the oxide insulating film are provided between the first nitride insulating film and the second nitride insulating film. In the channel width direction of the transistor, the first gate electrode and the second gate electrode are connected to each other through an opening portion provided in the first nitride insulating film and the second nitride insulating film. In addition, the first gate electrode and the second gate electrode surround the oxide semiconductor film in a cross section perpendicular to the channel length direction, with the first nitride insulating film provided between the first gate electrode and the oxide semiconductor film and the second nitride insulating film provided between the second gate electrode and the oxide semiconductor film.

Furthermore, the channel length of the transistor is longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm.

Another embodiment of the present invention is a channel-etched transistor including a first gate electrode, an oxide semiconductor film overlapping with the first gate electrode, a first nitride insulating film between the first gate electrode and the oxide semiconductor film, a pair of electrodes in contact with the oxide semiconductor film, an oxide insulating film in contact with the oxide semiconductor film, a second nitride insulating film in contact with the first nitride insulating film and the oxide insulating film, and a second gate electrode which is over the second nitride insulating film and overlaps with the oxide semiconductor film. The oxide semiconductor film and the oxide insulating film are provided between the first nitride insulating film and the second nitride insulating film. The first gate electrode and the second gate electrode are connected to each other. In addition, in the channel width direction of the transistor, side surfaces of the oxide semiconductor film overlap with the first gate electrode and the second gate electrode. Furthermore, the channel length of the transistor is longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm.

Note that in the channel width direction of the transistor, the first gate electrode and the second gate electrode may be connected to each other on outer sides of one side surface and the other side surface of the oxide semiconductor film.

Alternatively, in the channel width direction of the transistor, the first gate electrode and the second gate electrode may be connected to each other on the outer side of one side surface of the oxide semiconductor film, and may face each other on the outer side of the other side surface, with the first nitride insulating film and the second nitride insulating film provided between the first gate electrode and the second gate electrode.

Alternatively, in the channel width direction of the transistor, the second gate electrode and each of one side surface and the other side surface of the oxide semiconductor film may be provided so that the second gate insulating film is positioned therebetween.

The transistor may have normally-off characteristics.

The oxide semiconductor film may include a plurality of crystal parts in which c-axis orientation is found and a c-axis is aligned in a direction parallel to a normal vector of a top surface of the oxide semiconductor film.

One embodiment of the present invention can provide a semiconductor device including a transistor having excellent electrical characteristics (e.g., on-state current, field-effect mobility, or frequency characteristics). One embodiment of the present invention can provide a semiconductor device including a transistor with high reliability. One embodiment of the present invention can provide a novel semiconductor device. Note that the descriptions of these effects do not disturb the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

FIGS. 27A to 27D are cross-sectional views illustrating one embodiment of a method for manufacturing a semiconductor device.

FIGS. 28A to 28C are cross-sectional views illustrating one embodiment of a method for manufacturing a semiconductor device.

FIGS. 30A and 30B are cross-sectional views each illustrating one embodiment of a semiconductor device.

FIGS. 34A and 34B each show results of gate BT stress tests performed on a transistor of Example.

DETAILED DESCRIPTION OF THE INVENTION (Embodiment 1)

In this embodiment, a semiconductor device that is one embodiment of the present invention and a manufacturing method thereof will be described with reference to drawings.

Figure 1A:
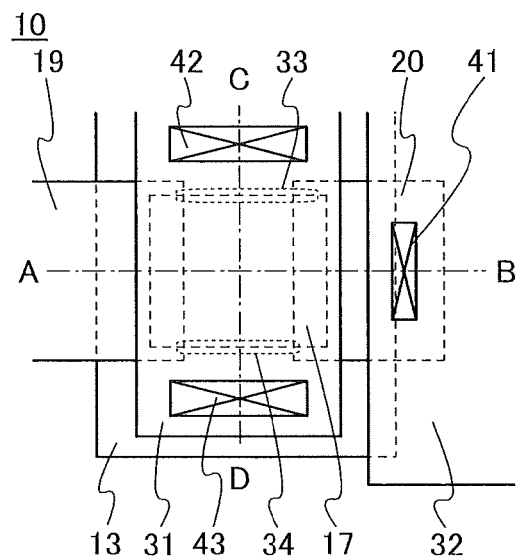
FIGS. 1A to 1D are a top view and cross-sectional views illustrating one embodiment of a transistor.
Figure 1C:
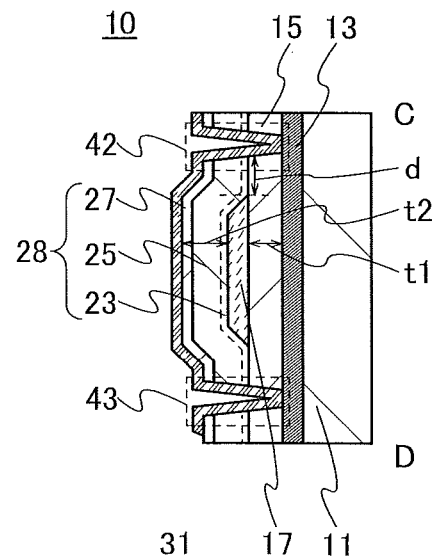
Figure 1B:
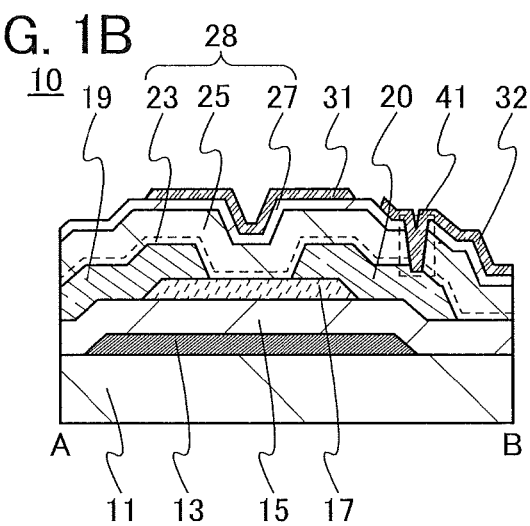

FIGS. 1A to 1C are a top view and cross-sectional views of a transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, insulating films, and the like are omitted for simplicity.

The transistor 10 illustrated in FIGS. 1B and 1C is a channel-etched transistor including a gate electrode 13 over the substrate 11; a gate insulating film 15 formed over the substrate 11 and the gate electrode 13; an oxide semiconductor film 17 overlapping with the gate electrode 13 with the gate insulating film 15 provided therebetween; a pair of electrodes 19 and 20 in contact with the oxide semiconductor film 17; a gate insulating film 28 over the gate insulating film 15, the oxide semiconductor film 17, and the pair of electrodes 19 and 20; and a gate electrode 31 over the gate insulating film 28. The gate insulating film 28 includes an oxide insulating film 23, an oxide insulating film 25, and a nitride insulating film 27. Furthermore, the gate electrode 31 is connected to the gate electrode 13 through opening portions 42 and 43 provided in the gate insulating film 15 and the gate insulating film 28. In addition, an electrode 32 in contact with one of the pair of electrodes 19 and 20 (here, the electrode 20) is formed over the nitride insulating film 27. Note that the electrode 32 serves as a pixel electrode.

The transistor 10 of this embodiment has a channel length longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm. Furthermore, in the channel width direction of the transistor 10, the oxide semiconductor film 17 is provided between the gate electrode 13 and the gate electrode 31 with the gate insulating film 15 provided between the gate electrode 13 and the oxide semiconductor film 17 and with the gate insulating film 28 provided between the gate electrode 31 and the oxide semiconductor film 17. In addition, as illustrated in FIG. 1A, the gate electrode 31 overlaps with end portions of the oxide semiconductor film 17 with the gate insulating film 28 provided therebetween, when seen from the above.

A plurality of opening portions are provided in the gate insulating film 15 and the gate insulating film 28. As a typical example, as illustrated in FIG. 1B, an opening portion 41 that reaches one of the pair of electrodes 19 and 20 is provided. Furthermore, the opening portions 42 and 43 are provided with the oxide semiconductor film 17 provided therebetween in the channel width direction as illustrated in FIG. 1C. In other words, the opening portions 42 and 43 are provided on outer sides of the side surfaces of the oxide semiconductor film 17. In the opening portion 41, one of the pair of electrodes 19 and 20 (here, the electrode 20) is connected to the electrode 32. In addition, in the opening portions 42 and 43, the gate electrode 13 is connected to the gate electrode 31. This means that the gate electrode 13 and the gate electrode 31 surround the oxide semiconductor film 17 in a cross section perpendicular to the channel length direction with the gate insulating film 15 and the gate insulating film 28 provided between the oxide semiconductor film 17 and each of the gate electrode 13 and the gate electrode 31. Furthermore, in the channel width direction, the gate electrode 31 in the opening portions 42 and 43 and each of the side surfaces of the oxide semiconductor film 17 are provided so that the gate insulating film 28 is positioned therebetween.

Figure 1D:
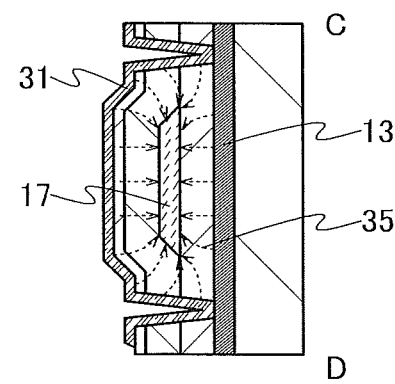

Note that as illustrated in FIG. 1C, a distance d between the side surface of the oxide semiconductor film 17 in the channel width direction and the gate electrode 31 in the opening portion 42 or 43 is 1 to 7.5 times as long as the sum of a thickness t1 of the gate insulating film 15 and a thickness t2 of the gate insulating film 28. In the case where the distance d between the side surface of the oxide semiconductor film 17 and the gate electrode 31 in the opening portion 42 or 43 is equal to or longer than the sum of the thickness t1 of the gate insulating film 15 and the thickness t2 of the gate insulating film 28, an electric field from the gate electrode 31 affects the side surface and its vicinity of the oxide semiconductor film 17 as indicated by lines 35 of electric force in FIG. 1D. Thus, a parasitic channel can be prevented from being generated at the side surface of the oxide semiconductor film 17 or the end portion thereof. In contrast, in the case where the distance d between the side surface of the oxide semiconductor film 17 and the gate electrode 31 in the opening portion 42 or 43 is 7.5 or less times as long as the sum of the thickness t1 of the gate insulating film 15 and the thickness t2 of the gate insulating film 28, the area of the transistor can be smaller.

The oxide semiconductor film 17 is formed using a metal oxide film containing at least In or Zn; as a typical example, an In—Ga oxide film, an In—Zn oxide film, or an In—M—Zn oxide film (M is Al, Ga, Y, Zr, La, Ce, or Nd) can be given.

Note that in the case where the oxide semiconductor film 17 contains an In—M—Zn oxide, the proportion of In and the proportion of M, not taking Zn and O into consideration, are greater than or equal to 25 atomic % and less than 75 atomic %, respectively, preferably greater than or equal to 34 atomic % and less than 66 atomic %, respectively.

The energy gap of the oxide semiconductor film 17 is 2 eV or more, preferably 2.5 eV or more, further preferably 3 eV or more. With the use of an oxide semiconductor having such a wide energy gap, the off-state current of the transistor 10 can be reduced.

The thickness of the oxide semiconductor film 17 is greater than or equal to 3 nm and less than or equal to 200 nm, preferably greater than or equal to 3 nm and less than or equal to 100 nm, further preferably greater than or equal to 3 nm and less than or equal to 50 nm In the case where the oxide semiconductor film 17 contains an In—M—Zn oxide (M represents Al, Ga, Y, Zr, La, Ce, or Nd), it is preferable that the atomic ratio of metal elements of a sputtering target used for forming a film of the In—M—Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 17 vary from the above atomic ratio of metal elements of the sputtering target within a range of ±40% as an error.

An oxide semiconductor film with low carrier density is used for the oxide semiconductor film 17. For example, an oxide semiconductor film whose carrier density is $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower is used for the oxide semiconductor film 17.

Note that, without limitation to that described above, a material with an appropriate composition may be used for the oxide semiconductor film 17 depending on required semiconductor characteristics and electrical characteristics (e.g., field-effect mobility) of the transistors. Furthermore, in order to obtain required semiconductor characteristics of the transistors, it is preferable that the carrier density, the impurity concentration, the defect density, the atomic ratio of a metal element to oxygen, the interatomic distance, the density, and the like of the oxide semiconductor film 17 be set to be appropriate.

Note that it is preferable to use, as the oxide semiconductor film 17, oxide semiconductor films in which the impurity concentration is low and density of defect states is low, in which case the transistors can have more excellent electrical characteristics. Here, the state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor has few carrier generation sources, and thus has a low carrier density, in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Furthermore, a transistor including the highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V. Thus, the transistor whose channel region is formed in the oxide semiconductor film has a small variation in electrical characteristics and high reliability, in some cases. Charges trapped by the trap levels in the oxide semiconductor film take a long time to be released and may behave like fixed charges. Thus, the transistor whose channel region is formed in the oxide semiconductor film having a high density of trap levels has unstable electrical characteristics in some cases. Note that examples of the impurities include hydrogen, nitrogen, an alkali metal, and an alkaline earth metal.

Hydrogen contained in the oxide semiconductor film reacts with oxygen bonded to a metal atom to be water, and in addition, an oxygen vacancy is formed in a lattice (or in a portion) from which oxygen is released. Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 17. Specifically, the hydrogen concentration of the oxide semiconductor film 17, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, even further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, even further more preferably lower than or equal to $1\times10^{16}$ atoms/cm$^3$. As a result, the transistor 10 has positive threshold voltage (normally-off characteristics).

When silicon or carbon that is one of elements belonging to Group 14 is contained in the oxide semiconductor film 17, oxygen vacancies are increased in the oxide semiconductor film 17, and the oxide semiconductor film 17 becomes an n-type film. Thus, the concentration of silicon or carbon (the concentration is measured by SIMS) of the oxide semiconductor film 17 is lower than or equal to $2\times10^{18}$ atoms/cm$^3$, preferably lower than or equal to $2\times10^{17}$ atoms/cm$^3$. As a result, the transistor 10 has positive threshold voltage (normally-off characteristics).

Further, the concentration of alkali metal or alkaline earth metal of the oxide semiconductor film 17, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film 17. As a result, the transistor 10 has positive threshold voltage (normally-off characteristics).

Furthermore, when containing nitrogen, the oxide semiconductor film 17 easily becomes an n-type film by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm$^3$.

In addition, the oxide semiconductor film 17 preferably includes a c-axis aligned crystalline oxide semiconductor (CAAC-OS) described later. The CAAC-OS structure has lower density of defect states than a polycrystalline structure, a microcrystalline structure described later, and an amorphous structure.

It is preferable to form the oxide semiconductor film 17 using a CAAC-OS film because a channel-etched transistor with a short channel length can be manufactured; the channel length is, for example, longer than or equal to 0.5 µm and shorter than or equal to 6.5 µm, preferably longer than 1 µm and shorter than 6 µm, further preferably longer than 1 µM and shorter than or equal to 4 µM, still further preferably longer than 1 µm and shorter than or equal to 3.5 µm, yet still further preferably longer than 1 µm and shorter than or equal to 2.5 µm.

Note that the oxide semiconductor film 17 may be a mixed film including two or more of a region having a microcrystalline structure, a region having a polycrystalline structure, a CAAC-OS region, and a region having a single-crystal structure. The mixed film has a single-layer structure including, for example, two or more of a region having a microcrystalline structure, a region having a polycrystalline structure, a CAAC-OS region, and a region having a single-crystal structure in some cases. Furthermore, the mixed film has a layered structure of two or more of a region having a microcrystalline structure, a region having a polycrystalline structure, a CAAC-OS region, and a region having a single-crystal structure in some cases.

Figure 37A:
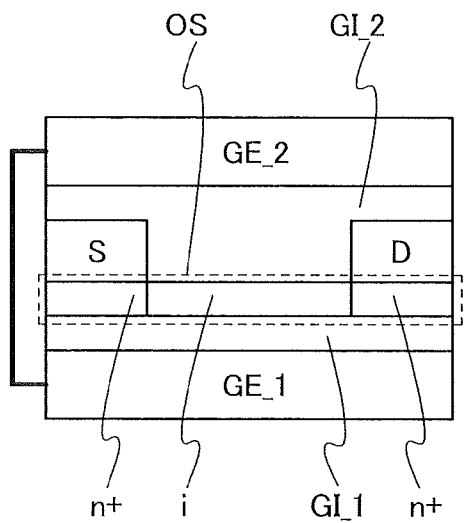
FIGS. 37A to 37C illustrate flow of carriers in a transistor in an off state and an on state.
Figure 37B:
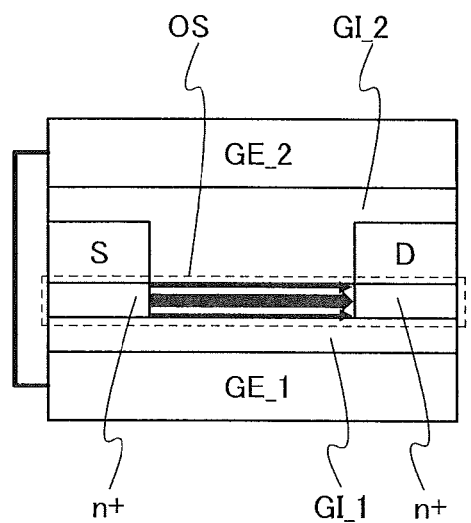

A transistor including an oxide semiconductor film is an accumulation-type transistor. Here, carrier flow in the transistor including an oxide semiconductor film in an off state and in an on state is described with reference to schematic diagrams illustrated in FIGS. 37A to 37C. FIGS. 37A and 37B are cross-sectional views in the channel length direction and FIG. 37C is a cross-sectional view in the channel width direction.

Figure 37C:
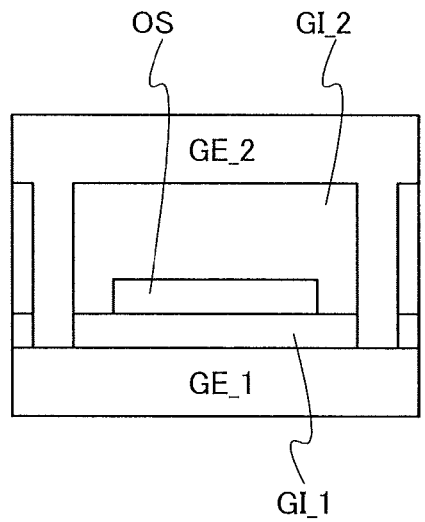

The transistor including an oxide semiconductor film illustrated in FIGS. 37A to 37C includes a gate electrode GE_1, a gate insulating film GI_1 over the gate electrode GE_1, an oxide semiconductor film OS over the gate insulating film GI_1, electrodes S and D over the oxide semiconductor film OS, a gate insulating film GI_2 over the oxide semiconductor film OS and the electrodes S and D, and a gate electrode GE_2 over the gate insulating film GI_2. The oxide semiconductor film OS includes a channel region i, and low-resistance regions n⁺ in contact with the electrodes S and D. The gate electrode GE_1 and the gate electrode GE_2 are connected to each other as illustrated in FIG. 37C.

In the case where the transistor is in an off state, electrons are forced away from the channel region i of the oxide semiconductor film OS when negative voltage is applied to the gate electrodes GE_1 and GE_2, so that the channel region i is completely depleted as illustrated in FIG. 37A. As a result, the off-state current of the transistor becomes extremely low.

In contrast, in the case where the transistor is in an on state, electrons are accumulated from the low-resistance region n⁺ in contact with the electrode S to the low-resistance region n⁺ in contact with the electrode D, and a current path is formed as indicated by arrows in FIG. 37B. As illustrated in FIG. 37C, the gate electrodes GE_1 and GE_2 are set to the same potential, side surfaces of the oxide semiconductor film OS face the gate electrode GE_2, and the gate electrodes GE_1 and GE_2 surround the oxide semiconductor film OS in a cross section perpendicular to the channel length direction with the gate insulating film GI_1 provided between the oxide semiconductor film OS and the gate electrode GE_1 and the gate insulating film GI_2 provided between the oxide semiconductor film OS and the gate electrode GE_2. In that case, carriers flow not only at the interfaces between the oxide semiconductor film OS and the gate insulating films GI_1 and GI_2 but also in a wide region in the oxide semiconductor film OS as illustrated in FIG. 36B, which results in an increase in the amount of transferred carriers in the transistor. As a result, the on-state current of the transistor is increased, and the field-effect mobility is increased to greater than or equal to 10 cm²/V·s or to greater than or equal to 20 cm²/V·s, for example. Note that here, the field-effect mobility is not an approximate value of the mobility as the physical property of the oxide semiconductor film but is the field-effect mobility of a saturation region of the transistor. Note that an increase in field-effect mobility becomes significant when the channel length (also referred to as L length) of the transistor is longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 µm, yet still further preferably longer than 1 µm and shorter than or equal to 2.5 µm. Furthermore, with a short channel length longer than or equal to 0.5 µm and shorter than or equal to 6.5 µm, the channel width can also be short, in which case the area of the transistor can be reduced even when a region which is a connection portion of the gate electrode GE_1 and the gate electrode GE_2 is provided as illustrated in FIG. 37C.

In drain current-gate voltage characteristics (hereinafter, also referred to as $I_d$–$V_d$ characteristics), which are the electrical characteristics of a transistor, drain current is saturated when voltage between a source electrode and a drain electrode is higher than gate voltage, more properly, when drain voltage is higher than the difference between gate voltage and threshold voltage ($V_d > V_g - V_{th}$). A region where drain current is saturated is called a saturation region.

In a transistor in which a gate electrode is provided over or below the oxide semiconductor film OS, such as a single-gate transistor, the charge density of a region in the oxide semiconductor film OS and in the vicinity of a drain electrode is increased because of high drain voltage. In contrast, the transistor described in this embodiment is a dual-gate driving transistor in which two short-circuited gate electrodes are included. One of the gate electrodes is over the oxide semiconductor film OS with a gate insulating film provided therebetween and the other gate electrode is below the oxide semiconductor film OS with a gate insulating film provided therebetween. Thus, high controllability by the gate electrode can be achieved, so that an increase in the charge density of the region in the oxide semiconductor film OS and in the vicinity of the drain electrode can be suppressed. As a result, drain current $I_d$ in a saturation region is saturated more easily in the dual-gate driving transistor than in the single-gate transistor. This means that drain current in the saturation region does not greatly fluctuate even when drain voltage fluctuates.

Defects are formed at the side surfaces and their vicinity of the oxide semiconductor film 17 illustrated in FIGS. 1A to 1D, which is processed by etching or the like, because of damage due to the processing, and the side surfaces and their vicinity are polluted by attachment of impurities or the like. For this reason, in the case where only one of the gate electrode 13 and the gate electrode 31 is formed in the transistor, even when the oxide semiconductor film 17 is intrinsic or substantially intrinsic, the side surfaces and their vicinity of the oxide semiconductor film 17 are easily activated to be n-type regions (low-resistance regions) by application of stress such as an electric field. In the case where the n-type side surfaces and their vicinity overlap with regions between the pair of electrodes 19 and 20, which are surrounded by dashed lines 33 and 34 in FIG. 1A, the n-type regions serve as carrier paths, resulting in formation of a parasitic channel. As a result, electrical characteristics exhibit a hump in drain current around the threshold voltage, so that the threshold voltage shifts in the negative direction. However, the transistor illustrated in FIG. 1C includes the gate electrode 13 and the gate electrode 31 having the same potentials, and in the channel width direction, the gate electrode 31 and each of the side surfaces of the oxide semiconductor film 17 are provided so that the gate insulating film 28 is positioned therebetween, whereby an electric field from the gate electrode 31 also affects the side surfaces of the oxide semiconductor film 17. As a result, a parasitic channel is prevented from being generated at the side surface and their vicinity of the oxide semiconductor film 17. Thus, the transistor has favorable electrical characteristics which exhibit no hump in drain current around the threshold voltage.

Here, a channel-etched transistor and a channel protective transistor are compared. In a channel protective transistor including two gate electrodes with an oxide semiconductor film provided therebetween, a first gate insulating film is provided over a first gate electrode, the oxide semiconductor film is provided over the first gate insulating film, a channel protective film is provided over the oxide semiconductor film, a pair of electrodes in contact with the oxide semiconductor film is provided over the channel protective film, a second gate insulating film is provided over the channel protective film and the pair of electrodes, and a second gate electrode is provided over the second gate insulating film.

The channel protective film is damaged by exposure to plasma in an etching process for forming the pair of electrodes. Thus, defects are easily formed in the channel protective film. As a result, carriers that flow in the oxide semiconductor film are trapped by the defects in the channel protective film and the electrical characteristics of the transistor fluctuate over operation time, resulting in a reduction in the reliability. However, in the transistor 10 described in this embodiment, which is a channel-etched transistor, a region in the gate insulating film 28 where the oxide semiconductor film 17 and the gate electrode 31 face each other is not exposed to an etching atmosphere. Thus, the transistor 10 has few defects in the gate insulating film 28 and thus has high reliability.

Further, in the channel protective transistor, the pair of electrodes blocks an electric field applied from the second gate electrode to regions in the oxide semiconductor film which overlap with the pair of electrodes, so that the electric field from the second gate electrode does not evenly affect the oxide semiconductor film. As a result, the amount of carriers that flow in the oxide semiconductor film when induced by the electric field from the second gate electrode is reduced. In contrast, in the transistor 10 described in this embodiment, which is a channel-etched transistor, the electric field from the gate electrode 31 evenly affects a back channel of the oxide semiconductor film 17. Furthermore, the electric field from the gate electrode 31 also affects the side surface of the oxide semiconductor film 17. As a result, carriers flow in a wide region in the oxide semiconductor film 17, so that the on-state current of the transistor and the field-effect mobility are increased.

Furthermore, in the channel protective transistor, one end portion of each of the pair of electrodes is positioned over the channel protective film to make a connection between the oxide semiconductor film and each of the pair of electrodes. The one end portion of each of the pair of electrodes is positioned on an inner side of a connection region of the oxide semiconductor film and each of the pair of electrodes. For this reason, in consideration of misalignment of a photomask, the distance between the connection regions of the oxide semiconductor film and the pair of electrodes needs to be designed to be long. In contrast, in a channel-etched transistor, an oxide semiconductor film is directly in contact with one end portion of each of a pair of electrodes. Thus, the distance between the pair of electrodes in the channel-etched transistor can make short easily in comparison with the channel protective transistor. For this reason, the transistor 10 can have a channel length longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 µm, yet still further preferably longer than 1 µm and shorter than or equal to 2.5 µm.

Each of the gate electrode 13 and the gate electrode 31 has a function of blocking an external electric field; thus, fixed charges between the substrate 11 and the gate electrode 13 and over the gate electrode 31 do not affect the oxide semiconductor film 17. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in the threshold voltage of the transistor between before and after the BT stress test is an important indicator when examining the reliability of the transistor. As the amount of change in the threshold voltage between before and after the BT stress test is small, the transistor has higher reliability.

Furthermore, the gate insulating film 28 over the oxide semiconductor film 17 preferably includes an oxide insulating film containing oxygen at higher proportion than the stoichiometric composition. Part of oxygen is released by heating from the oxide insulating film containing oxygen at higher proportion than the stoichiometric composition. The oxide insulating film containing oxygen at higher proportion than the stoichiometric composition is an oxide insulating film of which the amount of released oxygen converted into oxygen atoms is greater than or equal to $1.0 \times 10^{18}$ atoms/cm$^3$, or greater than or equal to $3.0 \times 10^{20}$ atoms/cm$^3$ in TDS analysis. Note that the substrate temperature in the TDS analysis is preferably higher than or equal to 100° C. and lower than or equal to 700° C., or higher than or equal to 100° C. and lower than or equal to 500° C.

In the case where the gate insulating film 28 includes the oxide insulating film containing oxygen at higher proportion than the stoichiometric composition, part of oxygen contained in the gate insulating film 28 can be transferred to the oxide semiconductor film 17 to reduce oxygen vacancies in the oxide semiconductor film 17.

In a transistor formed using an oxide semiconductor film including oxygen vacancies, the threshold voltage is likely to shift in the negative direction to have normally-on characteristics. This is because charges are generated because of oxygen vacancies in the oxide semiconductor film and the resistance of the oxide semiconductor film is thus reduced. The transistor having normally-on characteristics causes various problems in that malfunction is likely to be caused when in operation and that power consumption is increased when not in operation. Furthermore, there is a problem in that the amount of change in electrical characteristics, typified by threshold voltage, of the transistor is increased with passage of time or by a stress test.

However, in the transistor 10 described in this embodiment, an oxide insulating film containing oxygen at higher proportion than the stoichiometric composition is included in the gate insulating film 28 provided over the oxide semiconductor film 17; thus, oxygen contained in the gate insulating film 28 can be transferred to the oxide semiconductor film 17 to reduce oxygen vacancies in the oxide semiconductor film 17. In addition, because the gate insulating film 28 is not exposed to an etching atmosphere, the gate insulating film 28 has few defects. As a result, the transistors have normally-off characteristics. Further, the amount of change in electrical characteristics, typified by threshold voltage with respect to operation time, of the transistors with passage of time or due to a stress test can be reduced. Furthermore, a change in the threshold voltage can be reduced even when a stress test is repeatedly performed.

Components of the transistor 10 will be described in detail below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 10 may be provided directly on the flexible substrate. Further alternatively, a separation layer may be provided between the substrate 11 and the transistor 10. The separation layer can be used when part or the whole of a semiconductor device formed over the separation layer is separated from the substrate 11 and transferred onto another substrate. In that case, the transistor 10 can be transferred to a substrate having low heat resistance or a flexible substrate.

The gate electrode 13 can be formed using a metal element selected from aluminum, chromium, copper, tantalum, titanium, molybdenum, and tungsten; an alloy containing any of these metal elements as a component; an alloy containing these metal elements in combination; or the like. Furthermore, one or more metal elements selected from manganese and zirconium may be used. The gate electrode 13 may have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 13 can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

The gate insulating film 15 can be formed to have a single-layer structure or a layered structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The gate insulating film 15 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 15 is greater than or equal to 5 nm and less than or equal to 400 nm, preferably greater than or equal to 10 nm and less than or equal to 300 nm, more preferably greater than or equal to 50 nm and less than or equal to 250 nm.

The pair of electrodes 19 and 20 is formed with a single-layer structure or a layered structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 28 includes the oxide insulating film 23 in contact with the oxide semiconductor film 17, the oxide insulating film 25 in contact with the oxide insulating film 23, and the nitride insulating film 27 in contact with the oxide insulating film 25. The gate insulating film 28 preferably includes at least an oxide insulating film containing oxygen at higher proportion than the stoichiometric composition. Here, as the oxide insulating film 23, an oxide insulating film through which oxygen passes is formed. As the oxide insulating film 25, an oxide insulating film containing oxygen at higher proportion than the stoichiometric composition is formed. As the nitride insulating film 27, a nitride insulating film that blocks hydrogen and oxygen is formed. Although the gate insulating film 28 has a three-layer structure here, the gate insulating film 28 can have a single layer structure, a two-layer structure, or a layered structure including four or more layers as appropriate. Note that in these cases, at least an oxide insulating film containing oxygen at higher proportion than the stoichiometric composition is preferably included.

The oxide insulating film 23 is an oxide insulating film through which oxygen passes. Thus, oxygen released from the oxide insulating film 25 provided over the oxide insulating film 23 can be moved to the oxide semiconductor film 17 through the oxide insulating film 23. Moreover, the oxide insulating film 23 also serves as a film which relieves damage to the oxide semiconductor film 17 at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 23 be small; as a typical example, the spin density of a signal that appears at g=2.001 due to a dangling bond of silicon is preferably lower than or equal to $3 \times 10^{17}$ spins/cm$^3$ by ESR measurement. This is because if the density of defects in the oxide insulating film 23 is high, oxygen is bonded to the defects and the amount of oxygen that passes through the oxide insulating film 23 is reduced.

Further, it is preferable that the amount of defects at the interfaces between the oxide insulating film 23 and the oxide semiconductor film 17 be small; as a typical example, the spin density of a signal that appears at g=1.93 due to an oxygen vacancy in the oxide semiconductor film 17 is preferably lower than or equal to $1 \times 10^{17}$ spins/cm$^3$, more preferably lower than or equal to the lower limit of detection by ESR measurement.

Note that in the oxide insulating film 23, all oxygen that enters the oxide insulating film 23 from the outside is transferred to the outside of the oxide insulating film 23 in some cases. Alternatively, some oxygen that enters the oxide insulating film 23 from the outside remains in the oxide insulating film 23. Furthermore, movement of oxygen occurs in the oxide insulating film 23 in some cases in such a manner that oxygen enters the oxide insulating film 23 from the outside and oxygen contained in the oxide insulating film 23 is transferred to the outside of the oxide insulating film 23.

The oxide insulating film 25 is formed in contact with the oxide insulating film 23. The oxide insulating film 25 is formed using an oxide insulating film that contains oxygen at higher proportion than the stoichiometric composition. Part of oxygen is released by heating from the oxide insulating film that contains oxygen at higher proportion than the stoichiometric composition. The oxide insulating film containing oxygen at higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$, in TDS analysis. Note that the substrate temperature in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film 25.

Further, it is preferable that the amount of defects in the oxide insulating film 25 be small; as a typical example, the spin density of a signal that appears at g=2.001 originating from a dangling bond of silicon is preferably lower than $1.5 \times 10^{18}$ spins/cm$^3$, further preferably lower than or equal to $1 \times 10^{18}$ spins/cm$^3$ by ESR measurement. Note that the oxide insulating film 25 is provided more apart from the oxide semiconductor film 17 than the oxide insulating film 23 is; thus, the oxide insulating film 25 may have higher defect density than the oxide insulating film 23.

The nitride insulating film 27 has an effect of blocking at least hydrogen and oxygen. Preferably, the nitride insulating film 27 has an effect of blocking oxygen, hydrogen, water, an alkali metal, an alkaline earth metal, or the like. It is possible to prevent outward diffusion of oxygen from the oxide semiconductor film 17 and entry of hydrogen, water, or the like into the oxide semiconductor film 17 from the outside by providing the nitride insulating film 27 over the gate insulating film 28.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

A transparent conductive film is used for the gate electrode 31 and the electrode 32. The transparent conductive film is formed using an indium tin oxide, an indium zinc oxide, an indium oxide containing tungsten oxide, an indium zinc oxide containing tungsten oxide, an indium oxide containing titanium oxide, an indium tin oxide containing titanium oxide, an indium tin oxide containing silicon oxide, or the like.

<Improvement in Current Drive Capability due to Dual-Gate Driving>

Description is given of an improvement in the current drive capability of a dual-gate transistor due to a short channel length L. In the transistor, gate electrodes facing each other with an oxide semiconductor film provided therebetween are connected to each other and have the same potential.

<<Saturation Mobility of Ideal Model>>

Figure 2:
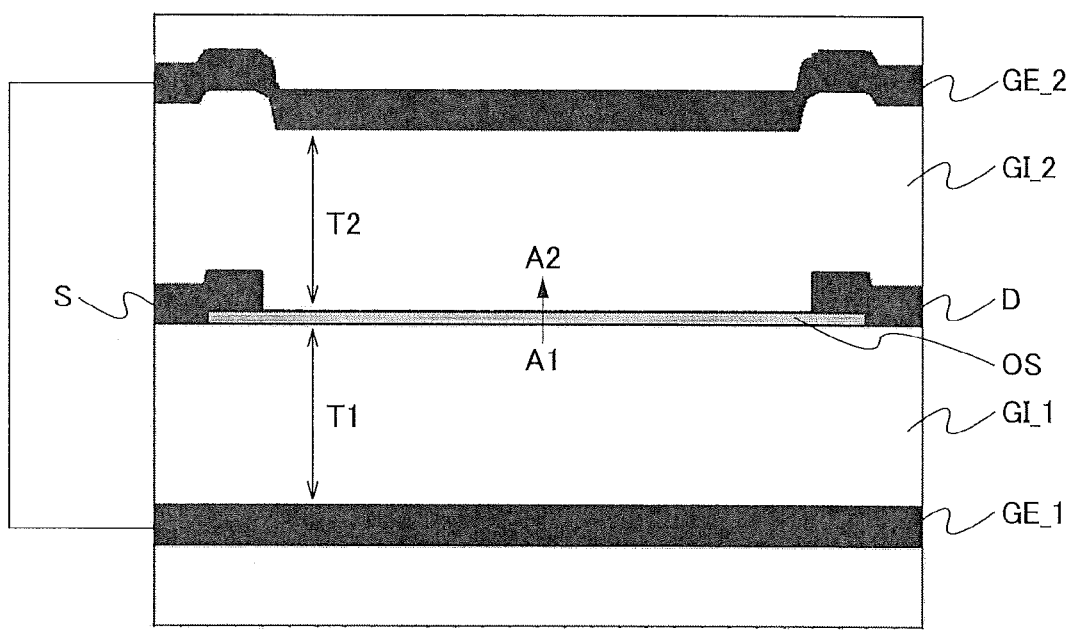
FIG. 2 is illustrates a transistor model used for calculation.

First, calculation was performed on an ideal model regardless of effects of an interface state, interface scattering, and the like. FIG. 2 illustrates a model of a transistor used for the calculation. Note that device simulation software "Atlas" (manufactured by Silvaco Data Systems Inc.) was used for the calculation.

In the transistor illustrated in FIG. 2, a gate insulating film GI_1 is formed over a gate electrode GE_1; an oxide semiconductor film OS is formed over the gate insulating film GI_1; a source electrode S and a drain electrode D are formed over the gate insulating film GI_1 and the oxide semiconductor film OS; a gate insulating film GI_2 is formed over the oxide semiconductor film OS, the source electrode S, and the drain electrode D; and a gate electrode GE_2 is formed over the gate insulating film GI_2. The gate electrode GE_1 is connected to the gate electrode GE_2 through an opening portion (not illustrated) formed in the gate insulating film GU and the gate insulating film GI_2.

Calculation conditions are shown in Table 1.

TABLE 1

| Channel length | 2 µm, 3 µm, 6 µm, or 10 µm |
|---|---|
| Channel width | 50 µm |
| Thickness of GI_1 (T1) | 450 nm |
| Thickness of GI_2 (T2) | 450 nm |
| Dielectric constants of GI_1 and GI_2 (Er) | 3.9 |
| Thickness of OS | 35 nm |
| Mobility of OS | 10 cm$^2$/Vsec |
| Dielectric constant of OS (Er) | 15 |
| Donor density of OS under SD | $1 \times 10^{19}$/cm$^3$ |
| Donor density of OS in channel region | $6.6 \times 10^{-9}$/cm$^3$ |
| Drain voltage | 1 V or 10 V |

The gate electrode GE_1 and the gate electrode GE_2 are connected to each other and therefore have potentials equal to each other at all times. Furthermore, an effect in a channel width direction is not considered because a two-dimensional simulation was performed on the model. Saturation mobility $\mu_{FE}$ was obtained by substituting a value of $I_d$–$V_g$ characteristics at a drain voltage $V_d$ of 10 V into Formula 1. Note that here, field-effect mobility in a saturation region is described as the saturation mobility. The maximum value of the saturation mobility obtained by calculation is an index of current drive capability in the saturation region (gate voltage $V_g$<drain voltage $V_d$+threshold voltage $V_{th}$), and is not an approximate value of the mobility as the physical property of the oxide semiconductor film $$\mu_{FE} \left( \frac{\partial \sqrt{I_d}}{\partial V_g} \right)^2 \frac{2L}{C_{Bottom}W} \qquad \text{[Formula 1]}$$

In Formula 1, W represents the channel width of a transistor and $C_{Bottom}$ represents capacitance per unit area between the gate electrode GE_1 and the oxide semiconductor film OS.

Figure 3A:
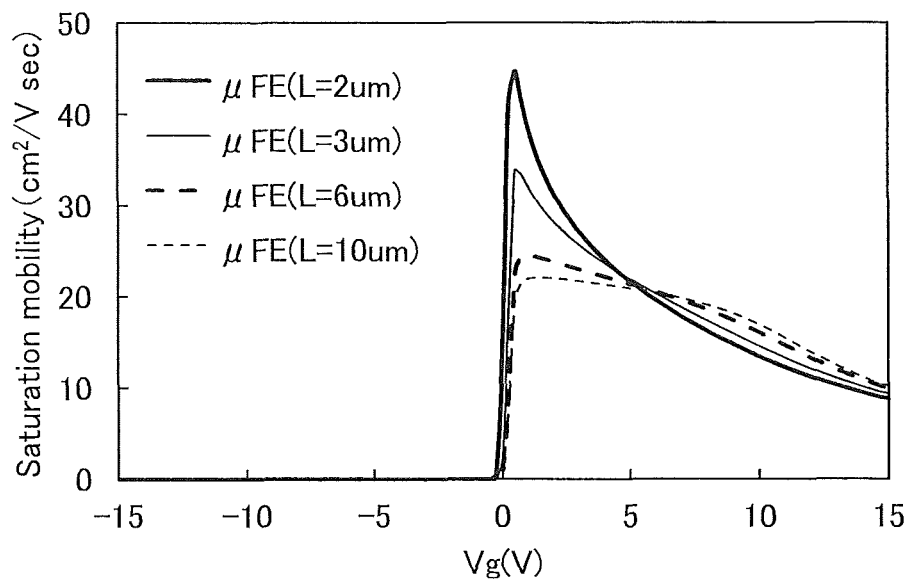
FIGS. 3A and 3B each show channel length dependence of saturation mobility obtained by calculation.
Figure 3B:
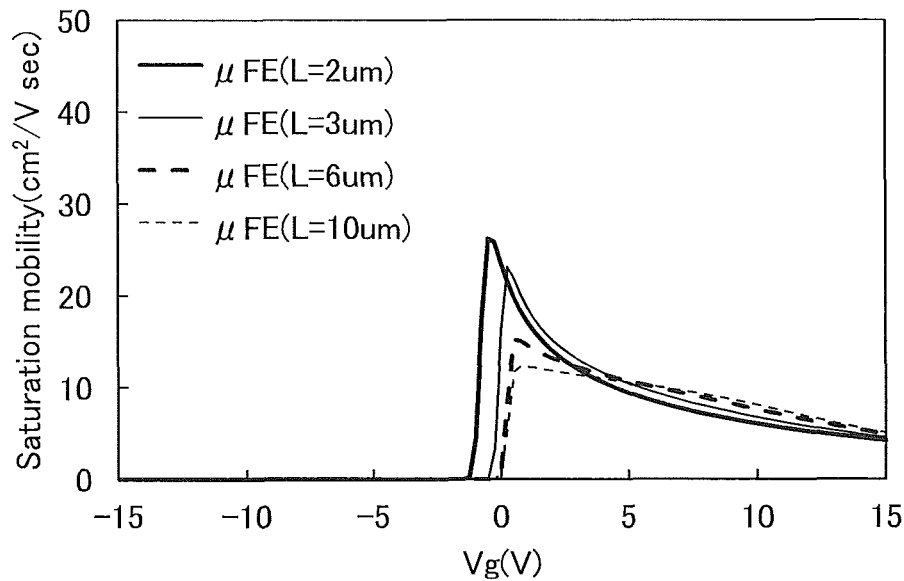

FIG. 3A shows calculation result of the dual-gate transistor, and FIG. 3B shows calculation result of the single-gate transistor that does not include a gate electrode GE_2.

FIGS. 3A and 3B show that the saturation mobility has a sharp peak in both of the dual-gate transistor and the single-gate transistor. The peak value of the saturation mobility is increased as the channel length L becomes shorter.

Description is given below of whether an increase in the saturation mobility with decreasing the channel length L corresponds to the improvement in the current drive capability of the transistor.

Figure 4:
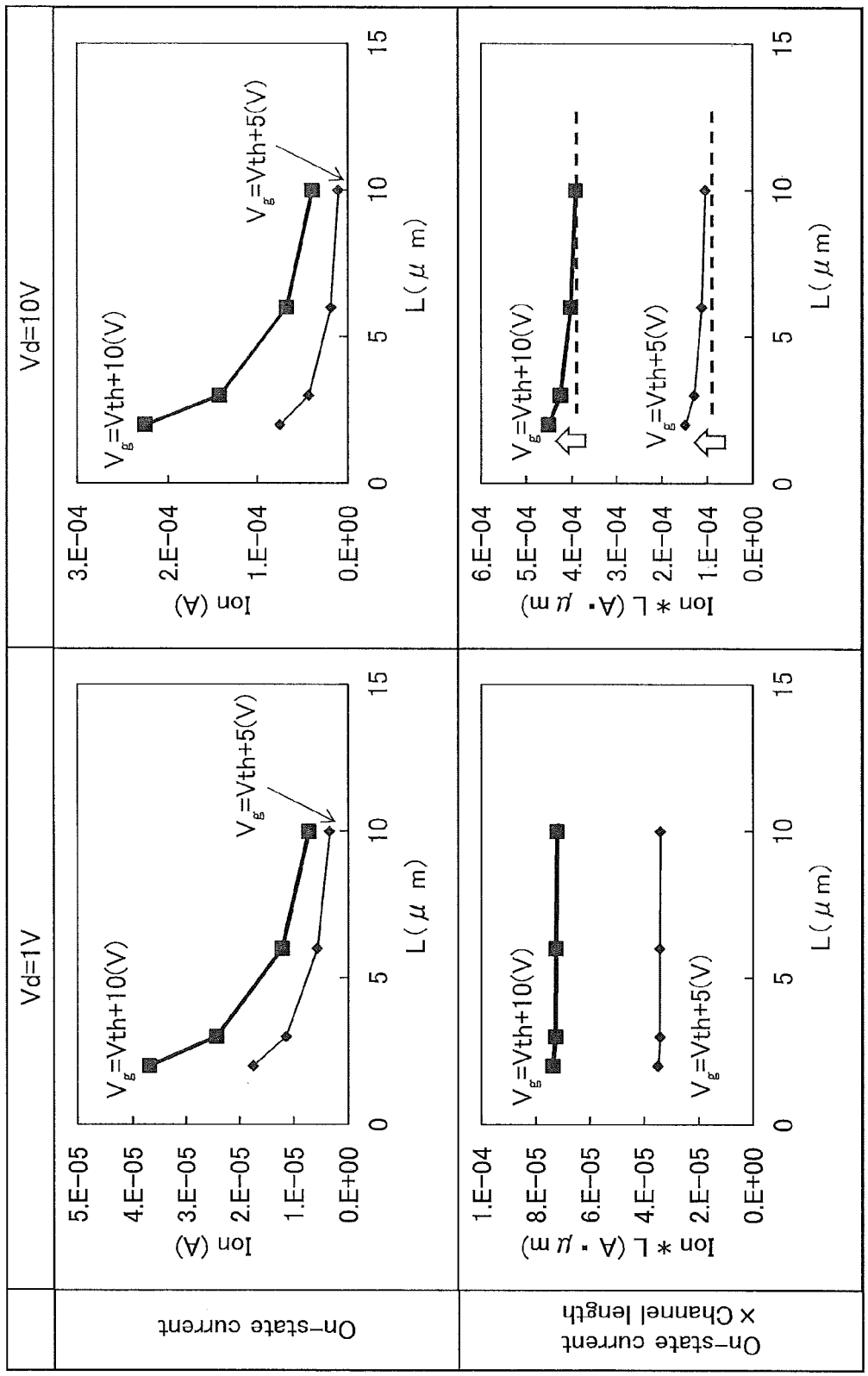
FIG. 4 shows channel length dependence of on-state current obtained by calculation.

FIG. 4 shows on-state current versus channel length plots at gate voltages $V_g$ of ($V_{th}$+5) V and ($V_{th}$+10) V, which are obtained from the calculation result of the ideal model. In FIG. 4, the top plots each show on-state current and the bottom plots each show a value obtained by multiplying the on-state current by the channel length. Note that in FIG. 4, the left plots show the calculation results at a drain voltage $V_d$ of 1 V and the right plots show the calculation results at a drain voltage $V_d$ of 10 V.

In FIG. 4, the on-state current is inversely proportional to the channel length L. This is because the on-state current is inversely proportional to the channel length L.

When the on-state current is completely inversely proportional to the channel length, a value obtained by multiplying the on-state current by the channel length is constant regardless of the channel length. In FIG. 4, a value obtained by multiplying the on-state current by the channel length at a drain voltage $V_d$ of 1 V is constant to the channel length L. In contrast, a value obtained by multiplying the on-state current by the channel length at a drain voltage $V_d$ of 10 V is increased as the channel length L becomes shorter. This suggests that in the case of a drain voltage $V_d$ of 10 V, an effective channel length which is described later is shorter than the channel length (a distance between the source electrode S and the drain electrode D) determined in FIG. 2.

<<Theory of Bulk Current>>

The reason why a peak of the saturation mobility is caused at low gate voltage in the transistor with the ideal model is described below.

It is assumed that in the transistor illustrated in FIG. 2, the density of electrons in the oxide semiconductor film OS is constant in the thickness direction of the oxide semiconductor film OS and represented by a value $n_0(y)$; y represents a given position in the oxide semiconductor film OS in the channel length direction. Potential φ in the thickness direction of the oxide semiconductor film OS is represented by Formula 2, which is constant. Note that it is assumed that a gate voltage $V_g\_1$ of the gate electrode GE_1 and a gate voltage $V_g\_2$ of the gate electrode GE_2 are equal to each other, and a flat band voltage on the gate electrode GE_1 side and a flat band voltage on the gate electrode GE_2 side are collectively referred to as a flat band voltage $V_{FB}$.

$$\phi - V(y) = V_g - V_{FB} - V(y) \qquad \text{[Formula 2]}$$

In this case, in an accumulation-type transistor including an oxide semiconductor film, a drain current $I_d$ can be approximately represented by only a bulk current $I_{bulk}$ as shown in Formula 3.

$$I_d \cong I_{bulk} = \frac{Wt}{L_{eff}} \mu k_B T [n_0(0) - n_0(L_{eff})] \qquad \text{[Formula 3]}$$

Note that in Formula 3, t represents the thickness of the oxide semiconductor film, µ represents the electron mobility of the oxide semiconductor film, $k_B$ represents the Boltzmann's constant, T represents the absolute temperature, and $L_{eff}$ represents an effective channel length. The effective channel length refers to the distance between an n region which extends under the source electrode and an n region which extends under the drain electrode in the oxide semiconductor film. The effective channel length becomes shorter than the channel length particularly in the case where the channel length is short or the drain voltage is high.

Note that $n_0(0)$ represents the electron density of a source-electrode-side end portion of a region determined by the effective channel length, which can be represented by Formula 4. Further, $n_0(L_{eff})$ represents the electron density of a drain-electrode-side end portion of the region determined by the effective channel length, which can be represented by Formula 5. In Formulae 4 and 5, $N_D$ represents the donor density of the channel region in the oxide semiconductor film and q represents elementary charge.

$$n_0(0) = N_D e^{q\phi/k_BT} = N_D e^{q(V_g - V_{FB})/k_BT} \qquad \text{[Formula 4]}$$

$$n_0(L_{eff}) = N_D e^{q(\phi - V_d)/k_BT} = N_D e^{q(V_g - V_{FB} - V_d)/k_BT} \qquad \text{[Formula 5]}$$

In the case of a saturation region satisfying $V_d > V_g - V_{th}$ and $V_g > V_{th}$, the drain voltage $V_d$ can be replaced with $V_g - V_{th}$, so that Formula 3 is changed into Formula 6.

$$I_d = \frac{Wt}{L_{eff}} \mu k_B T N_D e^{-qV_{FB}/k_B T} \left( e^{qV_g/k_B T} - e^{qV_{th}/k_B T} \right) \quad \text{[Formula 6]}$$

Saturation mobility $\mu_{FE}^{sat}$ to the drain current $I_d$ obtained by Formula 6 is represented by Formula 7.

$$\mu_{FE}^{sat} \equiv \left( \frac{d\sqrt{I_d}}{dV_g} \right)^2 \frac{2L}{C_{GI}W} = \quad \text{[Formula 7]}$$

$$\frac{L t \mu q^2 N_D e^{-qV_{FB}/k_B T}}{2 L_{eff} C_{GI} k_B T} \frac{e^{qV_g/k_B T}}{1 - e^{q(V_g - V_{th})/k_B T}}$$

In Formula 7, a denominator is 0 when $V_g$ is $V_{th}$, in which case the saturation mobility $\mu_{FE}^{sat}$ diverges to infinity. This is the cause of the peak of the saturation mobility at low gate voltage $V_g$, which is shown in FIGS. 3A and 3B. That is, the more the drain current is affected by the bulk current which flows inside the oxide semiconductor film OS, the clearer the peak is as shown in the saturation mobility observed in the case of a channel length of 2 μm in FIGS. 3A and 3B.

In addition, the saturation mobility is probably increased when the effective channel length $L_{eff}$ is shorter than the channel length L. In the oxide semiconductor film OS, when the n regions are formed in vicinities of regions of the oxide semiconductor film OS each of which is in contact with the source electrode S or the drain electrode D, the effective channel length $L_{eff}$ becomes shorter than the channel length L, for example. This effect is apparent from the saturation mobility $\mu_{FE}^{sat}$ shown in Formula 7 that is proportional to $L/L_{eff}$.

<<Current Density in Oxide Semiconductor Film>>

The effect of the bulk current on saturation mobility is a phenomenon peculiar to a transistor including an oxide semiconductor film, which is an accumulation-type device. The effect of the bulk current is small in a transistor including a silicon film as a semiconductor film, which is an inversion-type device.

Figure 5A:
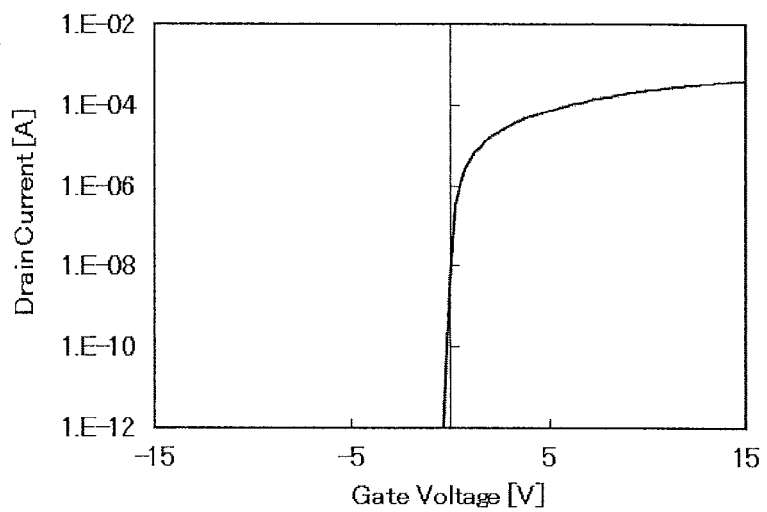
FIG. 5A shows the $I_d$–$V_g$ characteristics of a transistor obtained by calculation and FIGS. 5B and 5C each show current distribution in an oxide semiconductor film obtained by calculation.
Figure 5B:
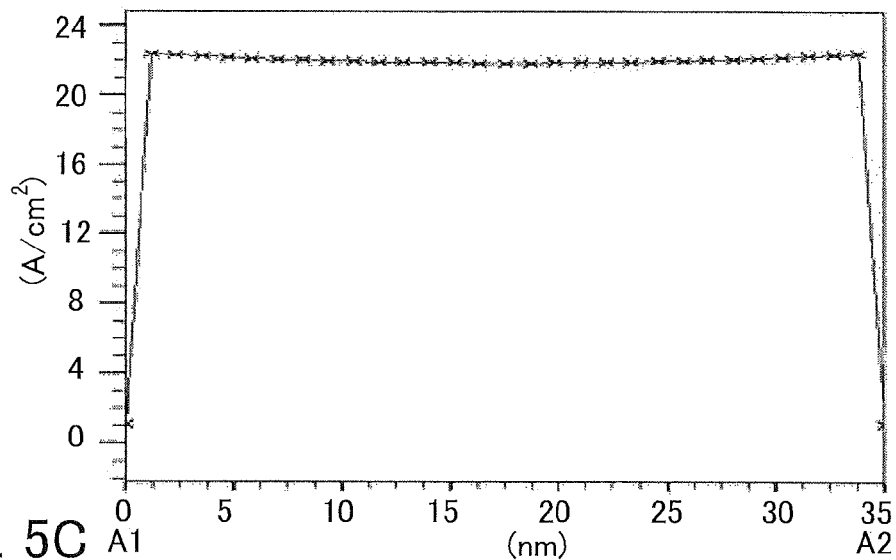
Figure 5C:
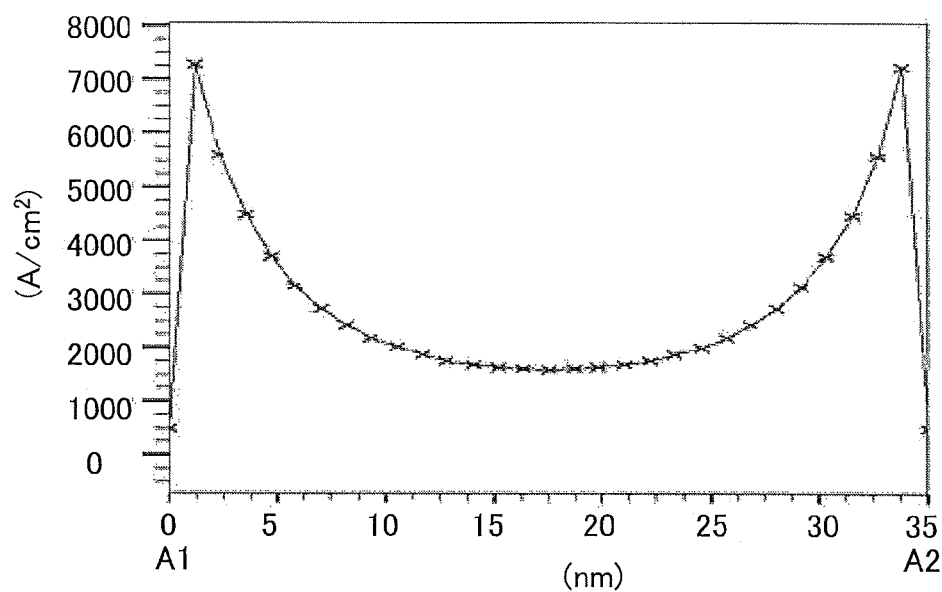

FIGS. 5B and 5C are plots of current density distributions obtained by device simulation. FIG. 5A illustrates $I_d$-$V_g$ characteristics obtained by calculation with a drain voltage of 10 V. FIGS. 5B and 5C each show a current density distribution in the oxide semiconductor film in a cross-sectional direction along A1-A2 in FIG. 2. FIG. 5B shows the current density distribution in a saturation region ($V_g$=0.5 V), and FIG. 5C shows the current density distribution in a linear region ($V_g$=15 V). Note that in the calculation, a transistor had a channel length L of 2 μm and a channel width W of 50 μm, and the drain voltage $V_d$ was 10 V.

FIG. 5B shows that the current density distribution in the oxide semiconductor film OS is almost uniform in the saturation region (at low gate voltage $V_g$). In contrast, FIG. 5C shows that current flowing in the vicinity of a surface of the oxide semiconductor film OS is dominant in the linear region (at high gate voltage $V_g$). Since the current density distribution is almost uniform in the oxide semiconductor film OS in the saturation region as shown in FIG. 5B, a cause of the peak in the saturation mobility is the bulk current.

Figure 6A:
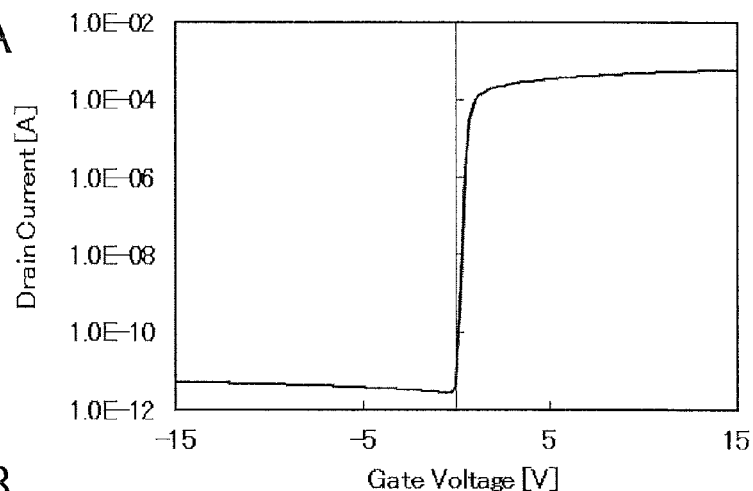
FIG. 6A shows the $I_d$–$V_g$ characteristics of a transistor obtained by calculation and FIGS. 6B and 6C each show current distribution in a silicon film obtained by calculation.
Figure 6B:
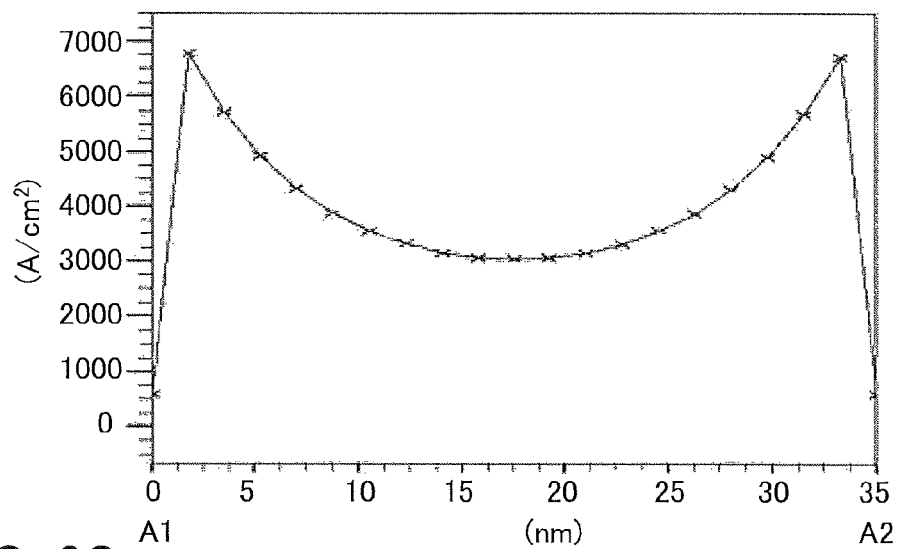
Figure 6C:
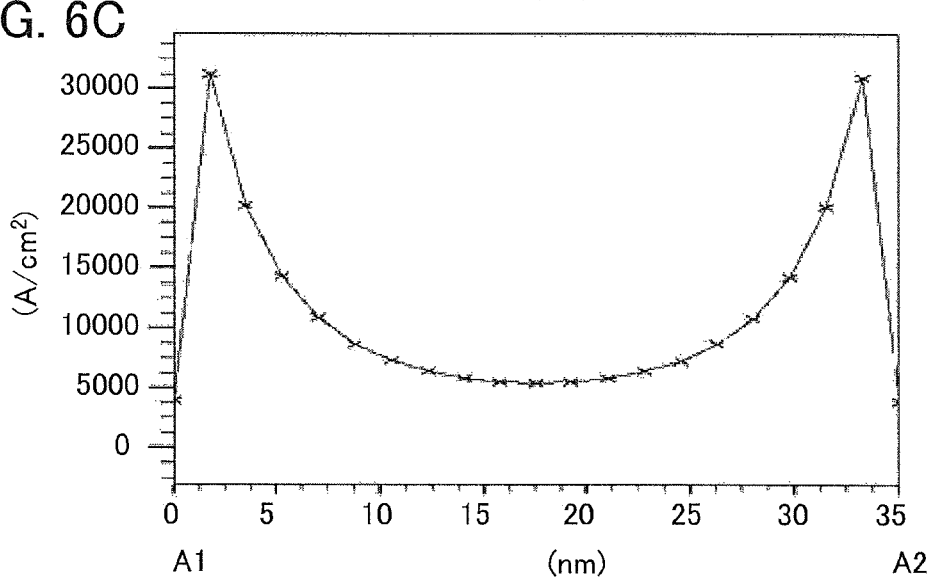

FIGS. 6B and 6C each show a current density distribution in a semiconductor film of an inversion-type device, which is obtained by device simulation. FIGS. 6A to 6C show the calculation results of a transistor obtained by replacing the oxide semiconductor film OS with a semiconductor (silicon) film including an n-p-n junction in the transistor illustrated in FIG. 2. A channel region of the semiconductor film is assumed to have acceptor impurities with a density of 1×17/cm³.

FIG. 6A illustrates $I_d$-$V_g$ characteristics obtained by calculation with a drain voltage of 10 V. FIGS. 6B and 6C each show a current density distribution in the semiconductor film in a cross-sectional direction along A1-A2 in FIG. 2. FIG. 6B shows the current density distribution in a saturation region ($V_g$=0.5 V), and FIG. 6C shows the current density distribution in a linear region ($V_g$=15 V). Note that in the calculation, a transistor had a channel length L of 2 μm and a channel width W of 50 μm, and the drain voltage $V_d$ was 10 V.

Unlike in the transistor including the oxide semiconductor film that is an accumulation-type device, in the transistor including the semiconductor film that is an inversion-type device, current flowing in a surface of the semiconductor film is increased even at around the threshold voltage as shown in FIG. 6B. The effect of the bulk current in the inversion-type device is smaller than that in the accumulation-type device.

The above results show that in a transistor including an oxide semiconductor film that is an accumulation-type device with the ideal model, the saturation mobility has a sharp peak due to the bulk current.

As the channel length L becomes shorter, the peak value of the saturation mobility due to the bulk current is increased. This is probably because the effective channel length $L_{eff}$ becomes shorter than the channel length L due to formation of the n regions in the vicinities of the regions of the oxide semiconductor film OS each of which is in contact with the source electrode S or the drain electrode D. Furthermore, it is probable that when the channel length L is short, the effective channel length $L_{eff}$ becomes shorter than the channel length L by a phenomenon (conduction band lowering effect: CBL effect) in which the energy of the conduction band minimum ($E_c$) of the oxide semiconductor film OS is reduced and the energy of the conduction band minimum gets closer to the Fermi energy because of the effect of the source electrode S and the drain electrode D. As shown in Formula 7, as the effective channel length $L_{eff}$ becomes short, the saturation mobility is increased in proportion to $L/L_{eff}$. This effect becomes significant as the channel length L becomes short; therefore, it is probable that the saturation mobility is increased as the channel length L becomes short.

<<Model Assuming Shallow Electron Trap Level>>

Next, to approximate the saturation mobility of the transistor with the ideal model to that of an actual transistor, calculation was performed on the assumption that there is an acceptor level that is negatively charged when trapping an electron, i.e., a shallow electron trap level, at the interface between the gate insulating film GI_1 and the oxide semiconductor film OS in the transistor with the ideal model. Calculation results are shown in FIGS. 7A to 7C.

Figure 7A:
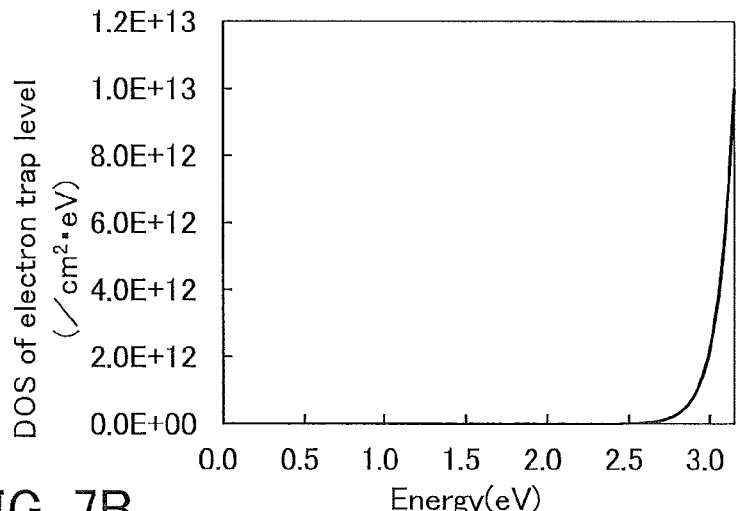
FIG. 7A shows an electron trap used for calculation and FIGS. 7B and 7C each show channel length dependence of saturation mobility obtained by calculation.

FIG. 7A shows density of states (DOS) of the electron trap level which is assumed to be at the interface between the gate insulating film GI_1 and the oxide semiconductor film OS.

Next, the saturation mobilities of a dual-gate transistor and a single-gate transistor were calculated. FIG. 7B shows the calculation result of the dual-gate transistor, and FIG. 7C shows the calculation result of the single-gate transistor.

Figure 7B:
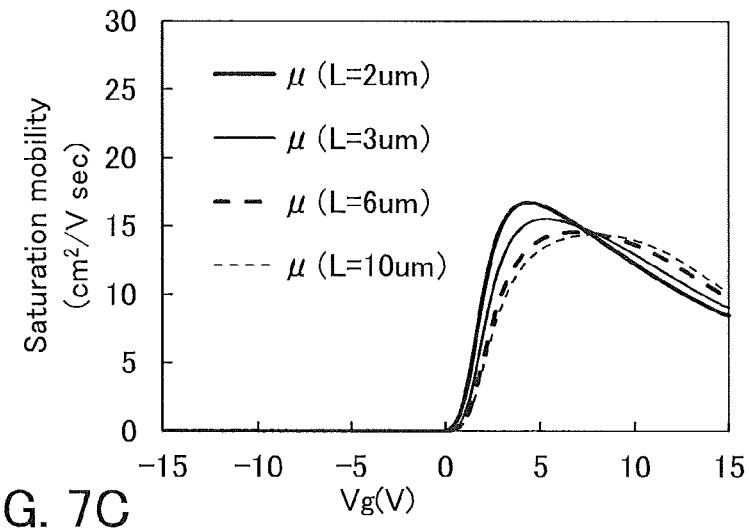
Figure 7C:
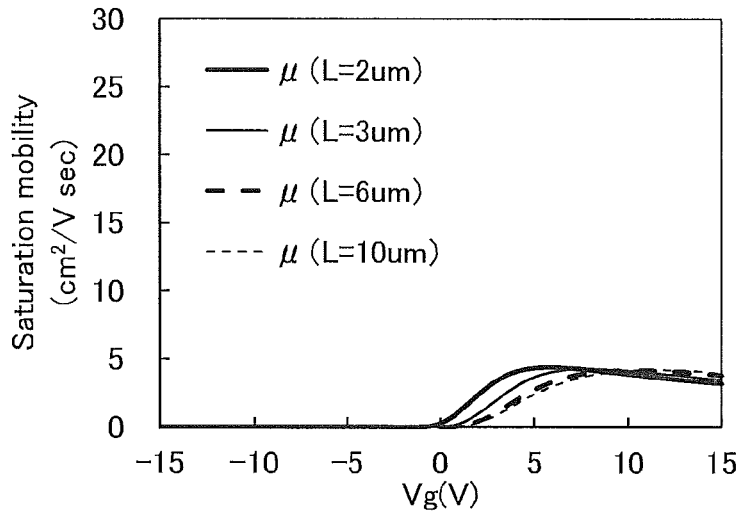

As shown in FIGS. 7B and 7C, unlike in the saturation mobility of the transistor with the ideal model, a sharp peak is not observed in the saturation mobilities of the dual-gate transistor and the single-gate transistor. In FIG. 7C, the peak values of the saturation mobilities are each around 5 cm²/V·sec, which shows that the saturation mobility of the transistor in the single-gate driving does not depend too much on the channel length L. In contrast, the peak values of the saturation mobilities of the dual-gate transistor are each greater than or equal to 15 cm²V·sec and a little less than 20 cm²V·sec, and are increased as the channel length L becomes short. These results are similar to those in Example described later.

Consequently, it is found that the saturation mobility is increased as the channel length L becomes short in a dual-gate transistor.

<Comparison between Channel-etched Transistor and Channel-protective Transistor by Dual-gate Driving>

The field-effect mobility $\mu_{FE}$ and the on-state current $I_{on}$ of a channel-etched transistor are compared with those of a channel protective transistor. Note that the transistors are dual-gate driving transistors. In each of the transistors, gate electrodes facing each other with an oxide semiconductor film provided therebetween are connected to each other and have the same potential.

Figure 8A:
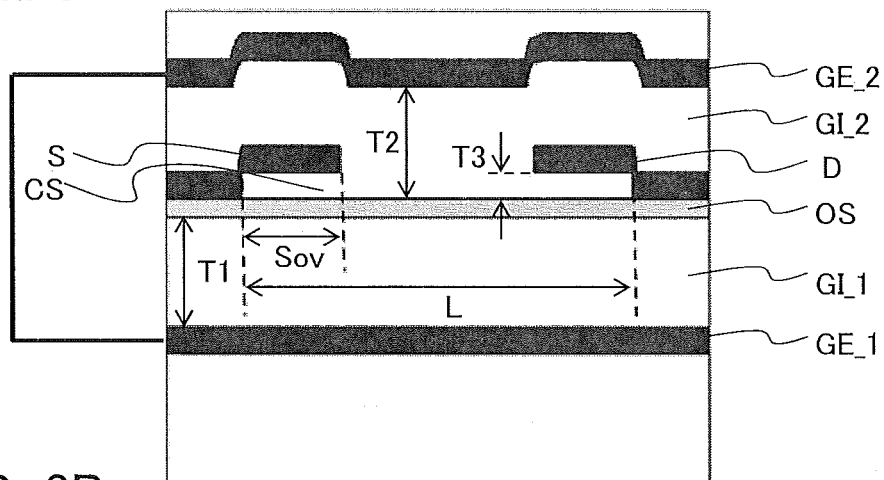
FIG. 8A illustrates the structure of a transistor used for calculation and FIGS. 8B and 8C show field-effect mobility and on-state current, respectively, obtained by calculation.

The electrical characteristics of the channel-etched transistor and the channel-protective transistor were calculated. FIG. 8A illustrates a structure of the channel-protective transistor used for the calculation. Note that device simulation software "Atlas" (manufactured by Silvaco Data Systems Inc.) was used for the calculation.

In the channel-protective transistor, a gate insulating film GI_1 is formed over a gate electrode GE_1, an oxide semiconductor film OS is formed over the gate insulating film GI_1, and a source electrode S and a drain electrode D are formed over the gate insulating film GI_1 and the oxide semiconductor film OS. Note that a channel protective film CS is formed between the oxide semiconductor film OS and end portions of the source electrode S and the drain electrode D. In addition, a gate insulating film GI_2 is formed over the oxide semiconductor film OS, the source electrode S, the drain electrode D, and the channel protective film CS; and a gate electrode GE_2 is formed over the gate insulating film GI_2. The gate electrode GE_1 is connected to the gate electrode GE_2 in an opening portion (not illustrated) formed in the gate insulating film GI_1 and the gate insulating film GI_2.

In the channel-etched transistor, a channel protective film CS is not provided, and end portions of a source electrode S and a drain electrode D are in contact with an oxide semiconductor film OS.

Calculation conditions are shown in Table 2.

TABLE 2

| Channel length (L) | 10 μm |
|---|---|
| Channel width (W) | 50 μm |
| Thickness of GI_1 (T1) | 450 nm |
| Thickness of GI_2 (T2) | 450 nm |
| Thickness of channel protective film CS (T3) | 100 nm |
| Dielectric constants of GI_1, GI_2, and CS (Er) | 3.9 |
| Thickness of OS | 35 nm |
| Mobility of OS | 10 cm²/Vsec |
| Dielectric constant of OS (Er) | 15 |
| Donor density of OS under SD | $1 \times 10^{19}$/cm³ |
| Donor density of OS in channel region | $6.6 \times 10^{-9}$/cm³ |

As a comparison example of the dual-gate transistor which is illustrated in FIG. 8A, a transistor by a single-gate driving that does not include a gate electrode GE_2 was used and subjected to calculation in the manner similar to that of the dual-gate transistor.

Figure 8B:
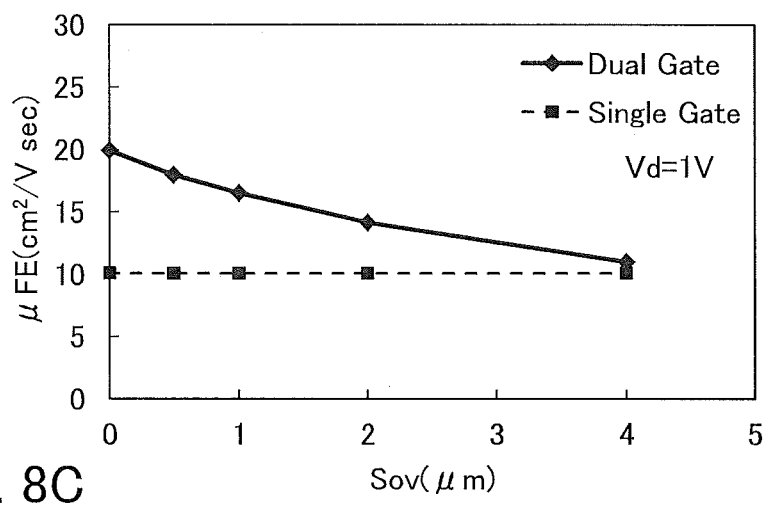
Figure 8C:
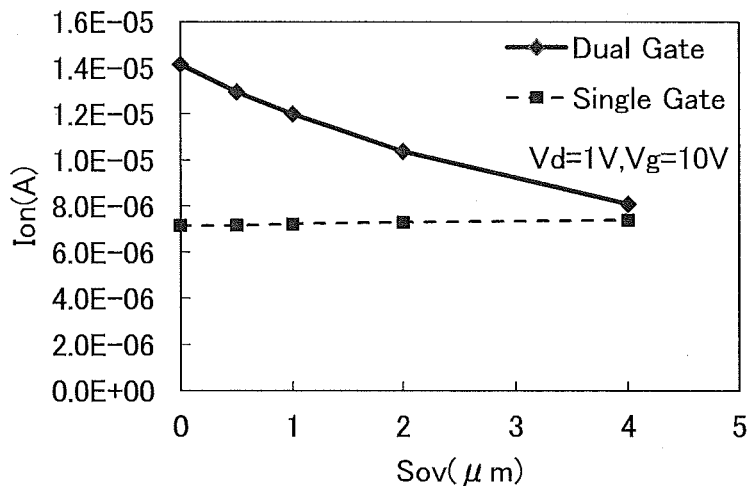

In the channel-protective transistor, Sov denotes the length of a region where the source electrode S or the drain electrode D overlaps with the oxide semiconductor film OS with the channel protective film CS provided therebetween. A region which is in the source electrode S or the drain electrode D and overlaps with the oxide semiconductor film OS with the channel protective film CS provided therebetween is referred to as an Sov region. FIG. 8B shows the calculation result of the relationship between Sov and field-effect mobility. FIG. 8C shows the calculation result of the relationship between Sov and on-state current.

Furthermore, the field-effect mobility and the on-state current of the channel-etched transistor were calculated on the assumption that Sov was 0 μm. The calculation result of the field-effect mobility and that of the on-state current are shown in FIGS. 8B and 8C, respectively.

Note that FIG. 8B shows the calculation result of the field-effect mobility at a drain voltage $V_d$ of 1 V. FIG. 8C shows the calculation result of on-state current at drain voltage $V_d$ of 1 V and gate voltage $V_g$ of 10 V.

As shown in FIG. 8B, the field-effect mobility of the channel-etched transistor (Sov=0 μm) by the dual-gate driving is approximately twice that of the channel-etched transistor by the single-gate driving. In contrast, the field-effect mobility of the channel-protective transistor by the dual-gate driving is decreased as the Sov becomes larger.

As shown in FIG. 8C, the on-state current of the channel-etched transistor (Sov=0 μm) by the dual-gate driving is approximately twice that of the transistor by the single-gate driving. In contrast, the on-state current of the channel-protective transistor by the dual-gate driving is reduced as the Sov becomes larger.

In the channel-protective transistor, the Sov regions of the source electrode S and the drain electrode D block an electric field of the gate electrode GE_2. Accordingly, a region whose carrier density cannot be controlled by the voltage of the gate electrode GE_2 is increased in the oxide semiconductor film OS. It is probable that the field-effect mobility and the on-state current are thus decreased as the Sov becomes larger. In view of the above, the channel-etched dual-gate transistor is much more effective in increasing the field-effect mobility and the on-state current than the channel-protective dual-gate transistor is.

<Model of Single-gate Driving Transistor>

Figure 38A:
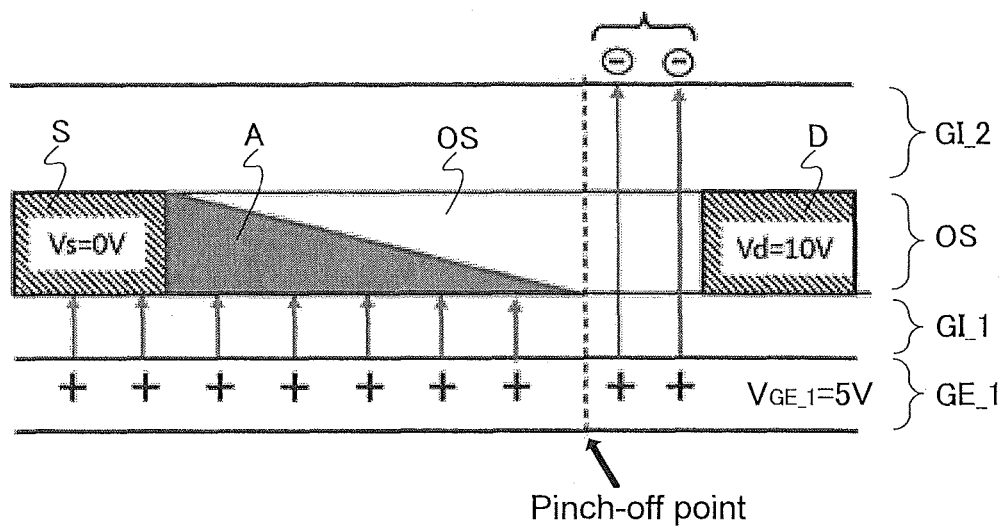
FIGS. 38A and 38B each illustrate a diagram of a transistor including an oxide semiconductor film in a saturation region when $V_d=10$ V and $V_{bg}=5$ V.

First, an actual measurement model of a single-gate driving transistor is described. FIG. 38A illustrates the diagram of the transistor including the oxide semiconductor film OS in the saturation region when the voltage $V_d$ of the drain electrode D is 10 V and the voltage $V_{GE\_1}$ of the gate electrode GE_1 is 5 V.

FIG. 38A illustrates the transistor in the saturation region where a pinch-off point appears in a channel. Here, in a channel A, i.e., a region, where electrons are induced by the voltage of the gate electrode GE_1, positive charges of the gate electrode GE_1 are capacitively coupled to the electrons in the channel A. In a region between the pinch-off point and the drain electrode D (hereinafter referred to as a depletion region), electric force probably passes through the oxide semiconductor film OS and reaches a surface of the gate insulating film GI_2. As a result, negative charges in the air are probably adsorbed on the surface of the gate insulating film GI_2 and are capacitively coupled to the positive charges of the gate electrode GE_1.

Figure 39:
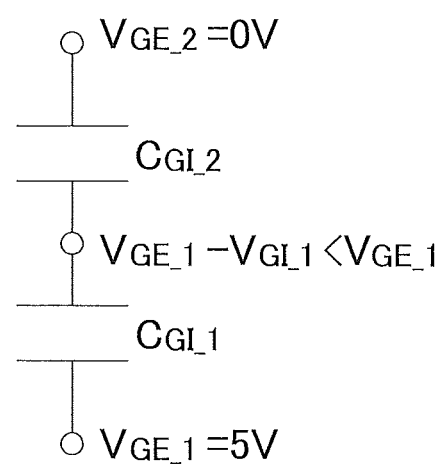
FIG. 39 is a circuit diagram illustrating capacitive coupling in a transistor.

These suggest that, in the depletion region in the vicinity of the drain, the voltage of the gate electrode GE_1 is distributed to the gate insulating film GI_1 and the gate insulating film GI_2 (see FIG. 39), which results in a reduction in controllability of the channel by the gate electrode GE_1.

Figure 38B:
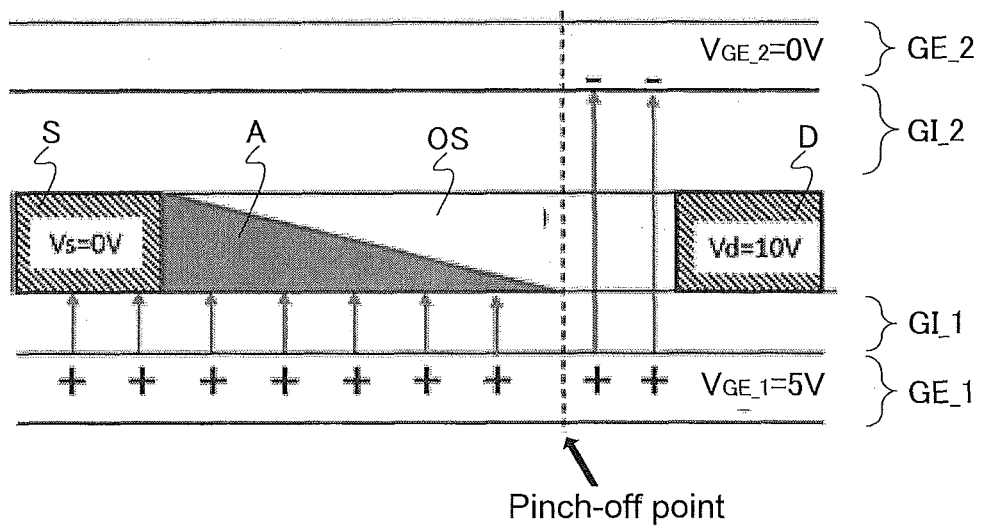

FIG. 38B illustrates a model including the gate electrode GE_2. The existence of adsorption charge in the model illustrated in FIG. 38B is approximately assumed by calculation on the assumption that the voltage $V_{GE\_2}$ of the gate electrode GE_2 is 0 V.

In the channel A, i.e., a region, where electrons are induced in the model in which the voltage of the gate electrode GE_2 is fixed to 0 V, the electric field from the gate electrode GE_1 is blocked by the electrons in the channel A. In a depletion region, negative charges are induced in the gate electrode GE_2 by the electric field from the gate electrode GE_1. When the gate electrode GE_2 is not provided and the adsorption charge is adsorbed on the surface of the gate insulating film GI_2, the electric field from the gate electrode GE_1 is blocked by the electrons in the channel A. This suggests that negative charges are adsorbed not on the surface of the gate insulating film GI_2 but only on the depletion region. Thus, this model in which the voltage of the gate electrode GE_2 is 0 V probably can duplicate the effect of the adsorption charge to some extent.

<Simulation Using the Above Model>

Figure 40:
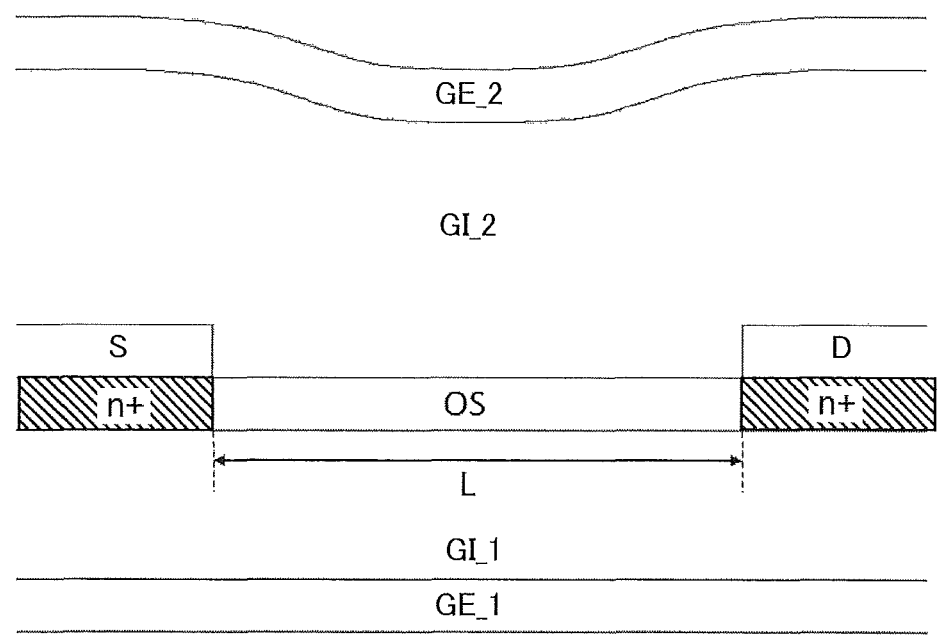
FIG. 40 is a schematic cross-sectional view of a transistor used for calculation in the channel length direction.

Next, two-dimensional calculation was performed using Sentaurus Device manufactured by Synopsys, Inc. FIG. 40 is a schematic cross-sectional view of a transistor used for the calculation in the channel length direction. The transistor was a single-gate driving transistor and the electron mobility of the oxide semiconductor film OS was set to 10 cm$^2$/Vs. Table 3 shows main parameters used for the calculation. Here, the calculation of the ideal oxide semiconductor film without trap level was performed.

TABLE 3

| | |
|---|---|
| Channel length | 6 μm |
| Thickness of OS | 35 nm |
| Thickness of GI_1 | 280 nm |
| Thickness of GI_2 | 480 nm |
| Electron mobility of OS | 10 cm$^2$/Vsec |
| Voltage of D | 10 V |
| Voltage of GE_2 | 0 V or $V_{GE\_1}$ V |

Figure 41A:
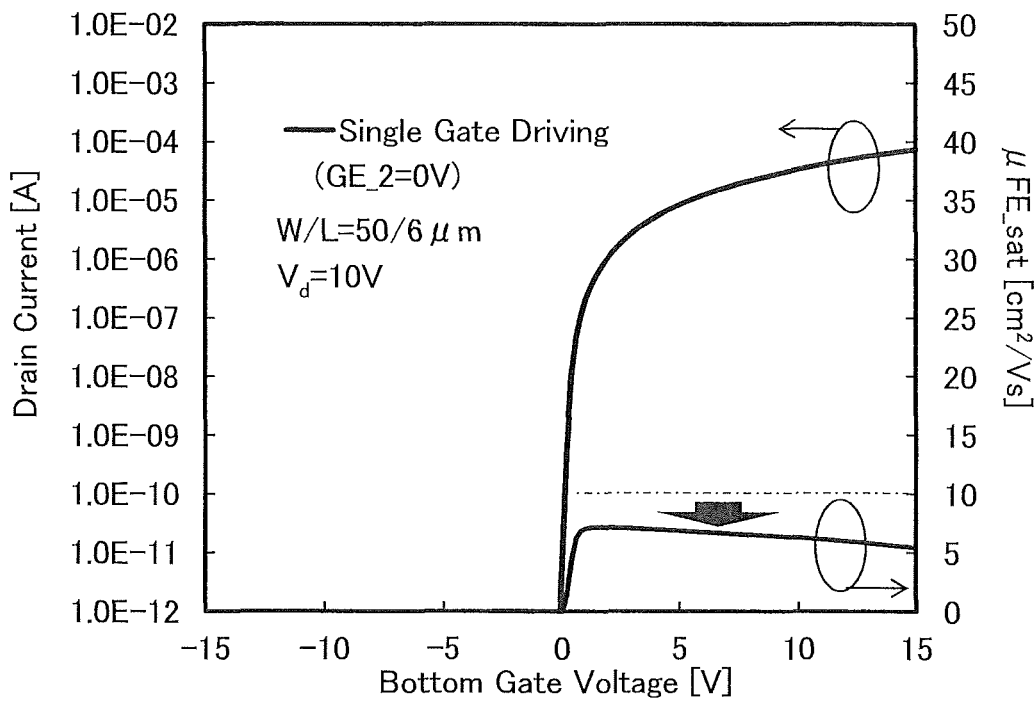
FIGS. 41A and 41B each show the $I_d$-$V_g$ characteristics and the saturation mobility of a transistor.
Figure 41B:
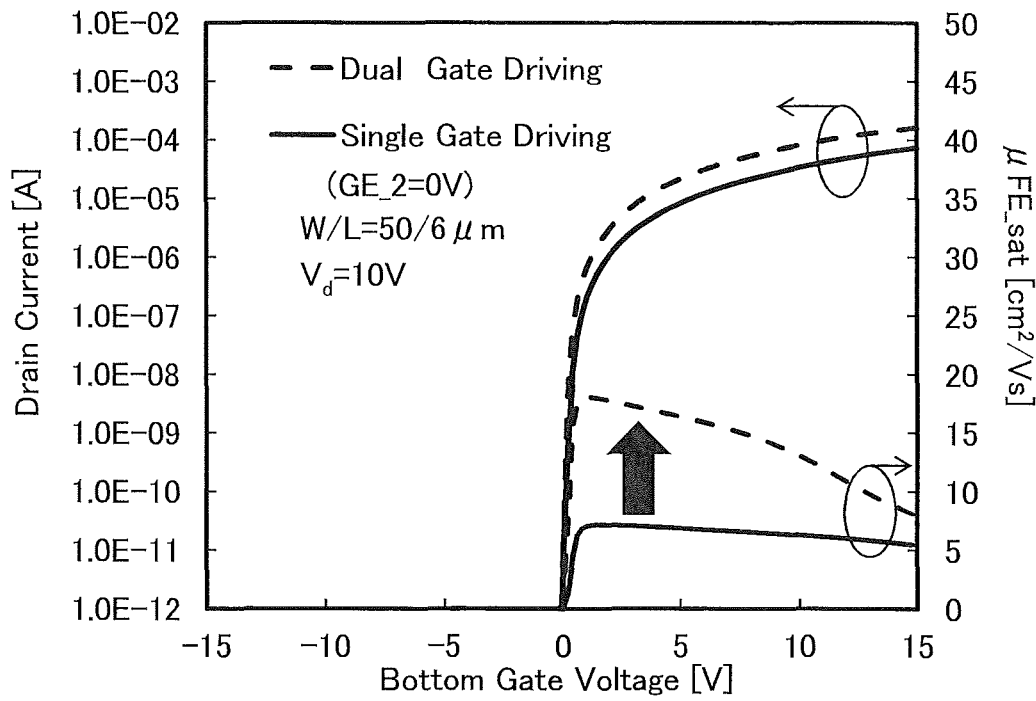

FIG. 41A shows the $I_d$-$V_g$ characteristics and the saturation mobility of the model of the single-gate driving transistor with a voltage of the gate electrode GE_2 of 0 V. FIG. 41B shows the $I_d$-$V_g$ characteristics and the saturation mobility of each of the models of the dual-gate driving transistor and the single-gate driving transistor. In each of FIGS. 41A and 41B, the horizontal axis, the left vertical axis, and the right vertical axis represent the gate voltage, the drain current, and the saturation mobility, respectively.

In FIG. 41A, although it is the ideal model, the model with a voltage of the gate electrode GE_2 of 0 V has a saturation mobility lower than 10 cm$^2$/Vs, which is the set value indicated by a dashed-dotted line. This is probably due to the effect of the capacitive coupling in the depletion region as described above. For this reason, as shown in FIG. 41B, the saturation mobility of the dual-gate driving transistor which is indicated by a dashed line is twice or more than twice as high as the saturation mobility of the single-gate driving transistor which is indicated by a solid line.

Thus, it is shown that the above model in which the effect of the adsorption charge is considered can duplicate the tendency of the mobility of single-gate driving transistors.

Accordingly, there is a possibility that, in the depletion region of the single-gate driving transistor, the gate electrode GE_1 is capacitively coupled to the adsorption charge on the surface of the gate insulating film GI_2. This suggests that the saturation mobility of the dual-gate driving transistor is twice or more than twice as high as the saturation mobility of the single-gate driving transistor.

Next, a method for manufacturing the transistor 10 illustrated in FIGS. 1A to 1D is described with reference to FIGS. 9A to 9D, FIGS. 10A and 10B, FIGS. 11A and 11B, and FIGS. 12A and 12B. In each of FIGS. 9A to 9D, FIGS. 10A and 10B, FIGS. 11A and 11B, and FIGS. 12A and 12B, a cross-sectional view in the channel length direction along line A-B and a cross-sectional view in the channel width direction along line C-D are used for describing a method for manufacturing the transistor 10.

Figure 9A:
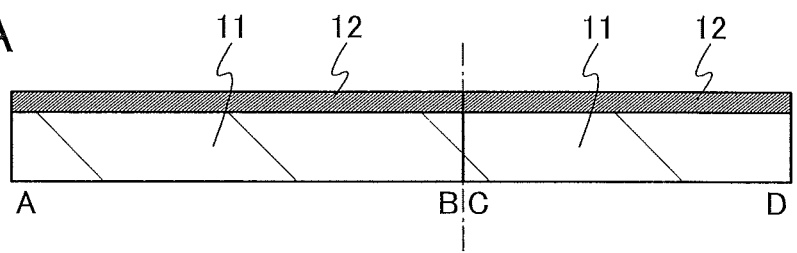
FIGS. 9A to 9D are cross-sectional views illustrating one embodiment of a method for manufacturing a transistor.
Figure 9B:
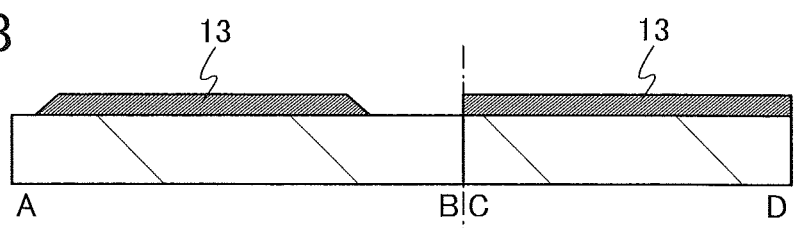

As illustrated in FIG. 9A, a conductive film 12 to be the gate electrode 13 is Ruined over the substrate 11.

In this case, a glass substrate is used as the substrate 11.

The conductive film 12 is formed by a sputtering method, a CVD method, an evaporation method, or the like.

As the conductive film 12, a 100-nm-thick tungsten film is formed by a sputtering method.

Then, a mask is formed over the conductive film 12 by a photolithography process using a first photomask. Next, the conductive film 12 is partly etched using the mask to form the gate electrode 13. After that, the mask is removed (see FIG. 9B).

The conductive film 12 can be partly etched by one or both of wet etching and dry etching.

Here, a mask is formed by a photolithography process and the conductive film 12 is dry-etched using the mask to form the gate electrode 13.

Note that the gate electrode 13 may be formed by an electrolytic plating method, a printing method, an inkjet method, or the like instead of the above formation method.

Figure 9C:
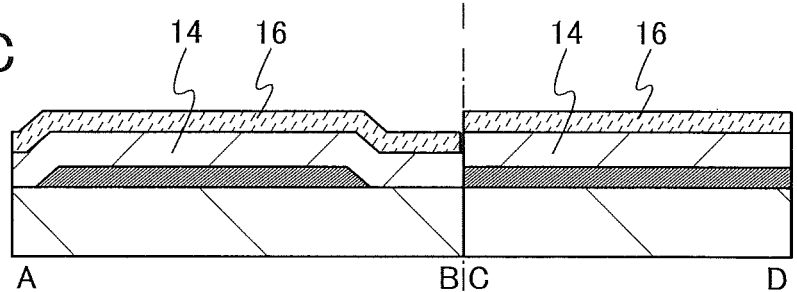
Figure 9D:
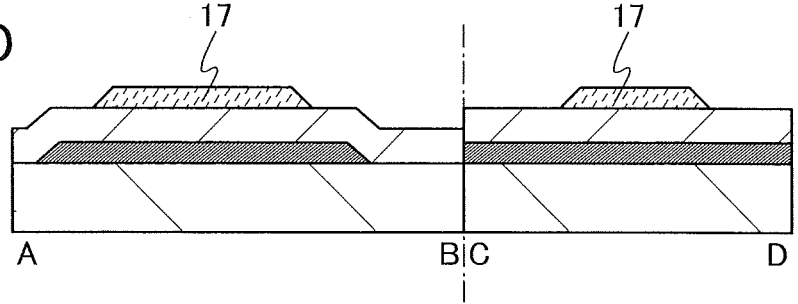

Next, as illustrated in FIG. 9C, an insulating film 14 to be the gate insulating film 15 is formed over the substrate 11 and the gate electrode 13, and an oxide semiconductor film 16 to be the oxide semiconductor film 17 is formed over the insulating film 14.

The insulating film 14 is formed by a sputtering method, a CVD method, an evaporation method, or the like.

In the case where a silicon oxide film, a silicon oxynitride film, or a silicon nitride oxide film is formed as the insulating film 14, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the insulating film 14, a metal organic chemical vapor deposition (MOCVD) method can be employed.

The oxide semiconductor film 16 can be formed by a sputtering method, a coating method, a pulsed laser deposition method, a laser ablation method, or the like.

In the case where the oxide semiconductor film 16 is formed by a sputtering method, a power supply device for generating plasma can be an RF power supply device, an AC power supply device, a DC power supply device, or the like as appropriate.

As a sputtering gas, a rare gas (argon as a typical example), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film 16 to be formed.

To make the oxide semiconductor film 16 intrinsic or substantially intrinsic, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 16 can be prevented as much as possible.

Here, a 35-nm-thick In—Ga—Zn oxide film is formed as the oxide semiconductor film 16 by a sputtering method using an In—Ga—Zn oxide target (In:Ga:Zn=3:1:2).

Then, after a mask is formed over the oxide semiconductor film 16 by a photolithography process using a second photomask, the oxide semiconductor film 16 is partly etched using the mask. Thus, the oxide semiconductor film 17 subjected to element isolation is formed. After that, the mask is removed (see FIG. 9D).

The oxide semiconductor film 16 can be partly etched by one or both of wet etching and dry etching.

Here, a mask is formed by a photolithography process and the oxide semiconductor film 16 is wet-etched using the mask to form the oxide semiconductor film 17.

After that, heat treatment may be performed at higher than or equal to 150° C. and lower than the strain point of the substrate, preferably higher than or equal to 200° C. and lower than or equal to 450° C., further preferably higher than or equal to 300° C. and lower than or equal to 450° C. This heat treatment can reduce the amount of hydrogen, water, and the like contained in the oxide semiconductor film 17, which results in a reduction in impurities contained in the oxide semiconductor film 17.

Figure 10A:
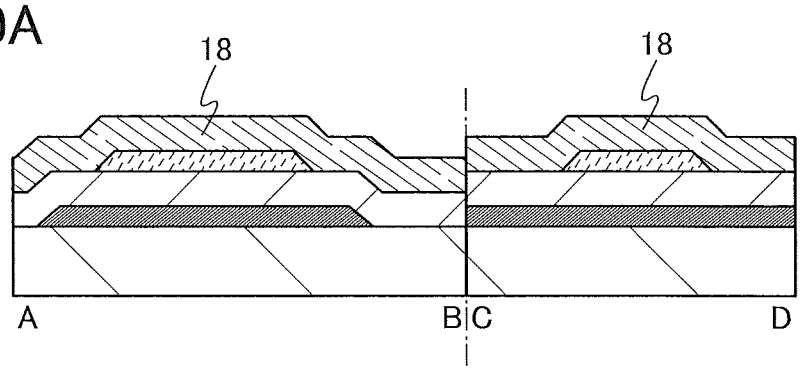
FIGS. 10A and 10B are cross-sectional views illustrating one embodiment of a method for manufacturing a transistor.

Next, as illustrated in FIG. 10A, a conductive film 18 to be the pair of electrodes 19 and 20 is formed.

The conductive film 18 is formed by a sputtering method, a CVD method, an evaporation method, or the like.

Here, a 50-nm-thick tungsten film and a 300-nm-thick copper film are sequentially stacked by a sputtering method to form the conductive film 18.

Next, a mask is formed over the conductive film 18 by a photolithography process using a third photomask. Then, the conductive film 18 is etched using the mask, so that the pair of electrodes 19 and 20 is formed. After that, the mask is removed (see FIG. 10B).

Here, the tungsten film and the copper film are etched using the mask to form the pair of electrodes 19 and 20. Note that in the case where the copper film is etched by a wet etching method first and then the tungsten film is etched by a dry etching method using $SF_6$, fluoride is formed on the surface of the copper film. By the fluoride, diffusion of copper elements from the copper film is reduced and thus the copper concentration in the oxide semiconductor film 17 can be reduced.

Figure 11A:
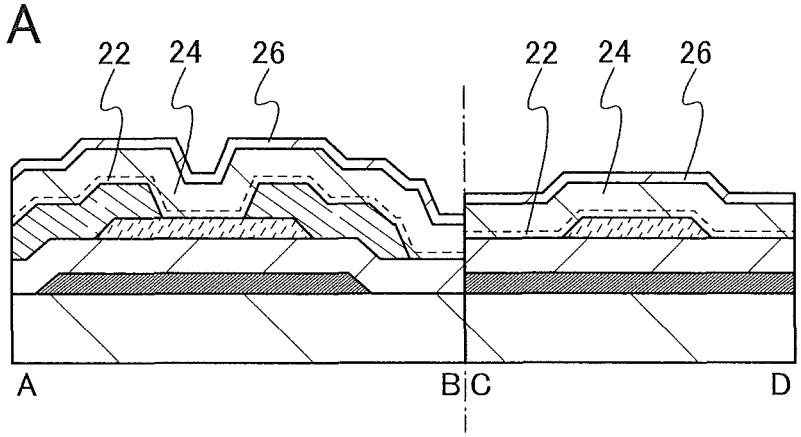
FIGS. 11A and 11B are cross-sectional views illustrating one embodiment of a method for manufacturing a transistor.

Next, as illustrated in FIG. 11A, an oxide insulating film 22 to be the oxide insulating film 23 and an oxide insulating film 24 to be the oxide insulating film 25 are formed over the oxide semiconductor film 17 and the pair of electrodes 19 and 20.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor film 17; accordingly, oxygen vacancies in the oxide semiconductor film 17 can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which permeates oxygen can be formed as the oxide insulating film 22. Further, by providing the oxide insulating film 22, damage to the oxide semiconductor film 17 can be reduced in a step of forming the oxide insulating film 25 which is formed later.

Under the above film formation conditions, the bonding strength of silicon and oxygen becomes strong in the above substrate temperature range. Thus, as the oxide insulating film 22, a dense and hard oxide insulating film which permeates oxygen, as a typical example, a silicon oxide film or a silicon oxynitride film having an etching rate lower than or equal to 10 mm/min, preferably lower than or equal to 8 nm/min when etching is performed at 25° C. with 0.5 weight % using hydrofluoric acid can be formed.

In the case where hydrogen, water, and the like are contained in the oxide semiconductor film 17, the hydrogen, water, and the like can be removed in this step because the oxide insulating film 22 is formed while heating is performed. Hydrogen contained in the oxide semiconductor film 17 is bonded to an oxygen radical formed in plasma to form water. Since the substrate is heated in the step of forming the oxide insulating film 22, water formed by bonding of oxygen and hydrogen is released from the oxide semiconductor film 17. That is, when the oxide insulating film 22 is formed by a plasma CVD method, the amount of water and hydrogen contained in the oxide semiconductor film 17 can be reduced.

Further, time for heating in a state where the oxide semiconductor film 17 is exposed can be shortened because heating is performed in a step of forming the oxide insulating film 22. Thus, the amount of oxygen released from the oxide semiconductor film by heat treatment can be reduced. That is, oxygen vacancies in the oxide semiconductor film 17 can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 10 can be reduced and change in threshold voltage can be inhibited.

Furthermore, by setting the pressure in the treatment chamber to be greater than or equal to 100 Pa and less than or equal to 250 Pa, damage to the oxide semiconductor film 17 can be reduced when the oxide insulating film 22 is formed, so that oxygen vacancies contained in the oxide semiconductor film 17 can be reduced. In particular, when the film formation temperature of the oxide insulating film 22 or the oxide insulating film 24 which is formed later is set to be high, typified by a temperature higher than 220° C., part of oxygen contained in the oxide semiconductor film 17 is released and oxygen vacancies are easily formed. In addition, when the film formation conditions for reducing the amount of defects in the oxide insulating film 24 which is formed later are used to increase reliability of the transistor, the amount of released oxygen is easily reduced. Thus, it is difficult to reduce oxygen vacancies in the oxide semiconductor film 17 in some cases. However, by setting the pressure in the treatment chamber to be greater than or equal to 100 Pa and less than or equal to 250 Pa to reduce damage to the oxide semiconductor film 17 at the time of forming the oxide insulating film 22, oxygen vacancies in the oxide semiconductor film 17 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor film 17 can be reduced; thus, the negative shift in the threshold voltage of the transistor can be inhibited.

Here, as the oxide insulating film 22, a 50-nm-thick silicon oxynitride film is formed by a plasma CVD method in which silane at a flow rate of 30 sccm and dinitrogen monoxide at a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which permeates oxygen can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power greater than or equal to 0.17 $W/cm^2$ and less than or equal to 0.5 $W/cm^2$, preferably greater than or equal to 0.25 $W/cm^2$ and less than or equal to 0.35 $W/cm^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the oxide insulating film 25 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 22 is provided over the oxide semiconductor film 17. Accordingly, in the step of forming the oxide insulating film 24, the oxide insulating film 22 serves as a protective film of the oxide semiconductor film 17. Consequently, the oxide, insulating film 24 can be formed using the high-frequency power having a high power density while damage to the oxide semiconductor film 17 is reduced.

Here, as the oxide insulating film 24, a 400-nm-thick silicon oxynitride film is formed by a plasma CVD method in which silane at a flow rate of 200 sccm and dinitrogen monoxide at a flow rate of 4000 sccm are used as the source gas, the pressure in the reaction chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 $cm^2$, and the power per unit area (power density) into which the supplied power is converted is 0.25 $W/cm^2$.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be moved to the oxide semiconductor film 17, so that oxygen vacancies contained in the oxide semiconductor film 17 can be further reduced.

In the case where the oxide insulating film 22 and the oxide insulating film 24 contain water, hydrogen, or the like, water, hydrogen, or the like contained in the oxide insulating film 22 and the oxide insulating film 24 is moved to the oxide semiconductor film 17 by heat treatment performed after a nitride insulating film 26 that blocks water, hydrogen, and the like is formed, so that defects are generated in the oxide semiconductor film 17. However, when the heat treatment is performed prior to formation of the nitride insulating film 26, water, hydrogen, or the like contained in the oxide insulating film 22 and the oxide insulating film 24 can be released; thus, variation in electrical characteristics of the transistor 10 can be reduced, and change in threshold voltage can be inhibited.

Note that when the oxide insulating film 24 is formed over the oxide insulating film 22 while being heated, oxygen can be moved to the oxide semiconductor film 17 to reduce the oxygen vacancies in the oxide semiconductor film 17; thus, the heat treatment needs not to be performed.

Here, heat treatment is performed at 350° C. for one hour in an atmosphere of nitrogen and oxygen.

Furthermore, when the pair of electrodes 19 and 20 is formed, the oxide semiconductor film 17 is damaged by the etching of the conductive film, so that oxygen vacancies are generated on the back channel side (the side of the oxide semiconductor film 17 which is opposite to the side facing to the gate electrode 13) of the oxide semiconductor film 17. However, with the use of the oxide insulating film containing oxygen at a higher proportion than the stoichiometric composition as the oxide insulating film 24, the oxygen vacancies generated on the back channel side can be reduced by heat treatment. As a result, the reliability of the transistor 10 can be improved.

Next, the nitride insulating film 26 to be the nitride insulating film 27 is formed by a sputtering method, a CVD method, or the like.

Note that in the case where the nitride insulating film 26 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 26, a deposition gas containing silicon, nitrogen, and ammonia are preferably used as a source gas. As the source gas, ammonia whose amount is smaller than the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Thus, in a source gas, the flow ratio of the nitrogen to the ammonia is set to be preferably greater than or equal to 5 and less than or equal to 50, more preferably greater than or equal to 10 and less than or equal to 50.

Here, in the reaction chamber of a plasma CVD apparatus, a 50-nm-thick silicon nitride film is formed as the nitride insulating film 26 by a plasma CVD method in which silane at a flow rate of 50 sccm, nitrogen at a flow rate of 5000 sccm, and ammonia at a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Through the above-described steps, the oxide insulating film 22, the oxide insulating film 24, and the nitride insulating film 26 can be formed.

Next, heat treatment may be performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

Next, a mask is formed over the nitride insulating film 26 by a photolithography process using a fourth photomask, and then each of the insulating film 14, the oxide insulating film 22, the oxide insulating film 24, and the nitride insulating film 26 is partly etched using the mask, so that the gate insulating film 15 and the gate insulating film 28 including the oxide insulating film 23, the oxide insulating film 25, and the nitride insulating film 27 are formed. As illustrated in the cross-sectional view along line A-B in FIG. 11B, the opening portion 41 is provided in the gate insulating film 28. Furthermore, as illustrated in the cross-sectional view along line C-D in FIG. 11B, the opening portions 42 and 43 are provided in the gate insulating film 15 and the gate insulating film 28.

Figure 12A:
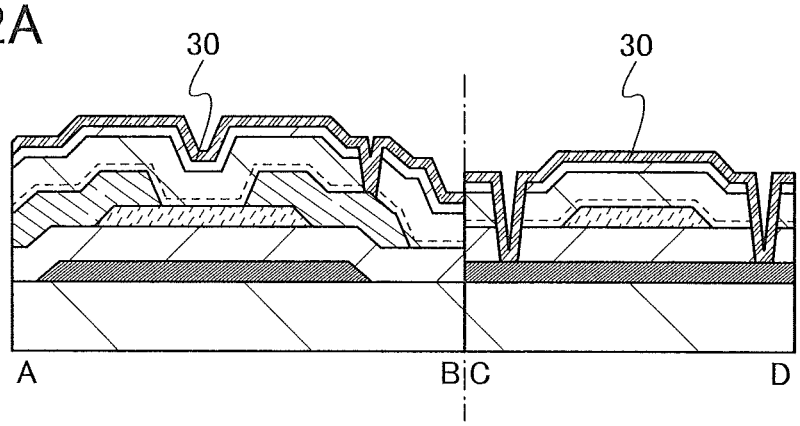
FIGS. 12A and 12B are cross-sectional views illustrating one embodiment of a method for manufacturing a transistor.

Then, as illustrated in FIG. 12A, a conductive film 30 to be the gate electrode 31 and the electrode 32 is formed.

The conductive film 30 is formed by a sputtering method, a CVD method, an evaporation method, or the like.

Here, an ITO film with a thickness of 100 nm is formed as the conductive film 30 by a sputtering method.

Then, a mask is formed over the conductive film 30 by a photolithography process using a fifth photomask. Next, the conductive film 30 is partly etched using the mask to form the gate electrode 31 and the electrode 32. After that, the mask is removed.

Figure 12B:
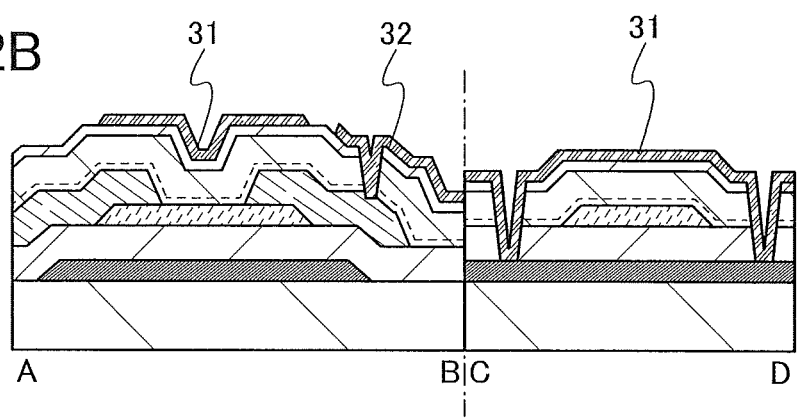

Note that as illustrated in FIG. 12B, in the channel width direction, the gate electrode 31 is formed so that the gate electrode 31 in the opening portions, which is provided in the gate insulating film 15 and the gate insulating film 28, and each of the side surfaces of the oxide semiconductor film 17 are provided so that the gate insulating film 28 is positioned therebetween.

Through the above process, the transistor 10 can be manufactured.

In the channel width direction of the transistor described in this embodiment, the gate electrode 31 in the opening portions 42 and 43, each of which is provided in the gate insulating film 15 and the gate insulating film 28, and each of the side surfaces of the oxide semiconductor film 17 are provided so that the gate insulating film 28 is positioned therebetween, whereby the effect of the electric field from the gate electrode 31 prevents a parasitic channel from being generated at the side surface and their vicinity of the oxide semiconductor film 17. As a result, the transistor can have good electric characteristics which exhibit no hump in drain current around the threshold voltage. The electric field from the gate electrode 31 also affects the side surfaces of the oxide semiconductor film 17 and carriers flow in a wide region in the oxide semiconductor film 17, so that the field-effect mobility and the on-state current of the transistor are increased.

The oxide insulating film containing oxygen at higher proportion than the stoichiometric composition is formed to overlap with the oxide semiconductor film that serves as a channel region, and thus, oxygen in the oxide insulating film can be transferred to the oxide semiconductor film. Consequently, oxygen vacancies contained in the oxide semiconductor film can be reduced, so that the transistor can have high reliability.

Through the above steps, a semiconductor device which includes a transistor having an oxide semiconductor film and has favorable electrical characteristics can be obtained. Furthermore, the semiconductor device including the transistor having the oxide semiconductor film can have high reliability.

Note that the structures, methods, and the like described in this embodiment can be used as appropriate in combination with any of the structures, methods, and the like described in the other embodiments.

Modification Example 1

A transistor having a structure different from that in FIGS. 1A to 1D is described with reference to FIGS. 13A to 13C. Unlike other transistors described in Embodiment 1, a transistor 50 illustrated in FIGS. 13A to 13C has a structure in which, in the channel width direction, the gate electrode 13 and a gate electrode 51 are connected to each other on an outer side of one side surface of the oxide semiconductor film 17, and the gate electrode 13 and the gate electrode 51 face each other on an outer side of the other side surface of the oxide semiconductor film 17, with the gate insulating film 15 and the gate insulating film 28 provided therebetween.

Figure 13A:
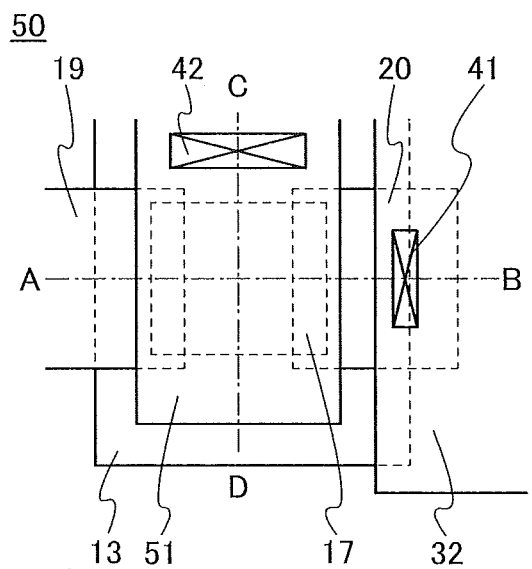
FIGS. 13A to 13C are a top view and cross-sectional views illustrating one embodiment of a transistor.
Figure 13C:
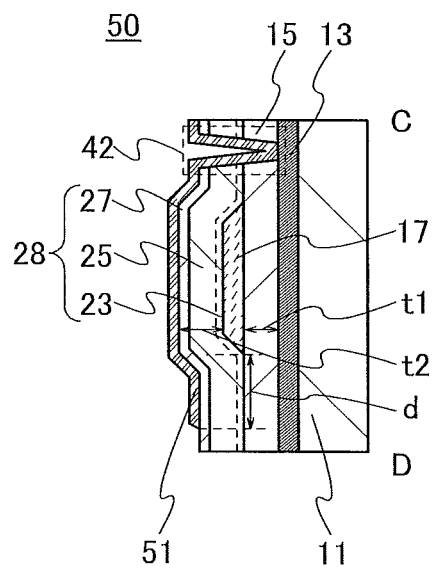
Figure 13B:
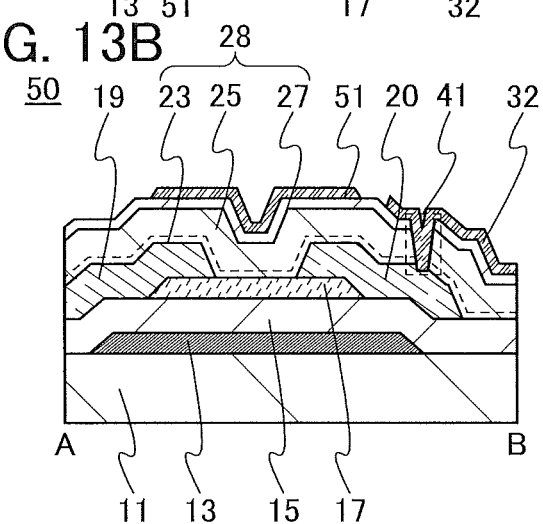

FIGS. 13A to 13C are a top view and cross-sectional views of the transistor 50 included in a semiconductor device. FIG. 13A is a top view of the transistor 50, FIG. 13B is a cross-sectional view taken along dashed-dotted line A-B in FIG. 13A, and FIG. 13C is a cross-sectional view taken along dashed-dotted line C-D in FIG. 13A. Note that in FIG. 13A, a substrate 11, insulating films, and the like are omitted for simplicity.

The transistor 50 illustrated in FIGS. 13B and 13C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 provided therebetween; the pair of electrodes 19 and 20 in contact with the oxide semiconductor film 17; the gate insulating film 28 over the gate insulating film 15, the oxide semiconductor film 17, and the pair of electrodes 19 and 20; and the gate electrode 51 over the gate insulating film 28. The gate insulating film 28 includes an oxide insulating film 23, the oxide insulating film 25, and the nitride insulating film 27. Furthermore, the gate electrode 51 is connected to the gate electrode 13 through the opening portion 42 provided in the gate insulating film 15 and the gate insulating film 28. In addition, the electrode 32 in contact with one of the pair of electrodes 19 and 20 (here, the electrode 20) is formed over the gate insulating film 28. Note that the electrode 32 serves as a pixel electrode.

The gate electrode 51 can be formed using a material and a formation method similar to those of the gate electrode 31 described in Embodiment 1, as appropriate. The gate electrode 51 and the electrode 32 can be formed at the same time.

The transistor 50 described in this embodiment has a channel length longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 µm, yet still further preferably longer than 1 µm and shorter than or equal to 2.5 µm. Furthermore, in the transistor 50, the oxide semiconductor film 17 is provided between the gate electrode 13 and the gate electrode 51. In addition, as illustrated in FIG. 13A, the gate electrode 51 overlaps with the end portions of the oxide semiconductor film 17 with the gate insulating film 28 provided therebetween, when seen from the above.

Furthermore, a plurality of opening portions are provided in the gate insulating film 15 and the gate insulating film 28. As a typical example, as illustrated in FIG. 13B, the opening portion 41 that reaches one of the pair of electrodes 19 and 20 is provided. In addition, as illustrated in FIG. 13C, the opening portion 42 is provided in the gate insulating film 15 and the gate insulating film 28 on an outer side of one side surface of the oxide semiconductor film 17. The gate electrode 51 and the gate electrode 13 are connected to each other through the opening portion 42. The gate electrode 51 in the opening portion 42 and the side surface of the oxide semiconductor film 17 are provided so that the gate insulating film 28 is positioned therebetween. The gate electrode 51 and the gate electrode 13 are not connected to each other on an outer side of the other side surface of the oxide semiconductor film 17. End portions of the gate electrode 51 are positioned on the outer sides of the side surfaces of the oxide semiconductor film 17.

Note that as illustrated in FIG. 13C, a distance d between the side surface of the oxide semiconductor film 17 in the channel width direction and a projected end portion of the gate electrode 51 on the interface between the gate insulating film 15 and the gate insulating film 28 is preferably 1 to 7.5 times as long as the sum of the thickness t1 of the gate insulating film 15 and the thickness t2 of the gate insulating film 28. In the case where the distance d is equal to or longer than the sum of the thickness t1 of the gate insulating film 15 and the thickness t2 of the gate insulating film 28, an electric field from the gate electrode 51 affects the side surface and its vicinity of the oxide semiconductor film 17. Thus, a parasitic channel can be prevented from being generated at the side surface and its vicinity of the oxide semiconductor film 17. In addition, in the case where the distance d is 7.5 or less times as long as the sum of the thickness t1 of the gate insulating film 15 and the thickness t2 of the gate insulating film 28, the area of the transistor can be smaller.

Next, a manufacturing process of the transistor 50 will be described.

Through steps of FIGS. 9A to 9D, FIGS. 10A and 10B, and FIG. 11A, the gate electrode 13, the insulating film 14, the oxide semiconductor film 17, the pair of electrodes 19 and 20, the oxide insulating film 22, the oxide insulating film 24, and the nitride insulating film 26 are formed over the substrate 11. In the steps, a photolithography process is performed using the first to third photomasks.

Next, after a mask is formed over the nitride insulating film 26 by a photolithography process using a fourth photomask, the insulating film 14, the oxide insulating film 22, the oxide insulating film 24, and the nitride insulating film 26 are partly etched to form the opening portions 41 and 42 illustrated in FIGS. 13A to 13C.

Subsequently, the conductive film 30 is formed as in the step of FIG. 12A. Then, after a mask is formed over the conductive film 30 by a photolithography process using a fifth photomask, the conductive film 30 is partly etched to form the gate electrode 51 and the electrode 32 illustrated in FIGS. 13A to 13C.

Through the above process, the transistor 50 can be manufactured.

Modification Example 2

A transistor having a structure different from the structure in FIGS. 1A to 1D and the structure in FIGS. 13A to 13C is described with reference to FIGS. 14A to 14C. Unlike other transistors described in Embodiment 1, a transistor 60 illustrated in FIGS. 14A to 14C has a structure in which the gate electrode 13 and a gate electrode 64 are connected to each other through a conductive film 62.

Figure 14A:
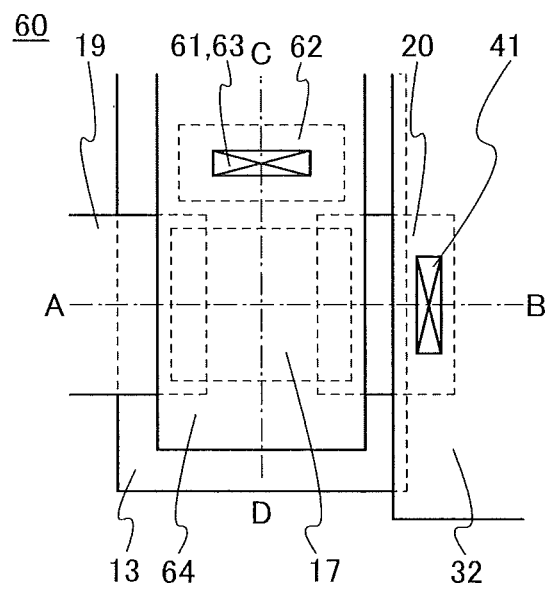
FIGS. 14A to 14C are a top view and cross-sectional views illustrating one embodiment of a transistor.
Figure 14C:
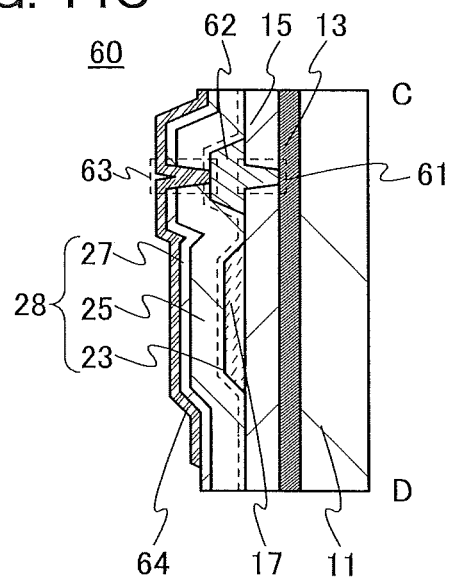
Figure 14B:
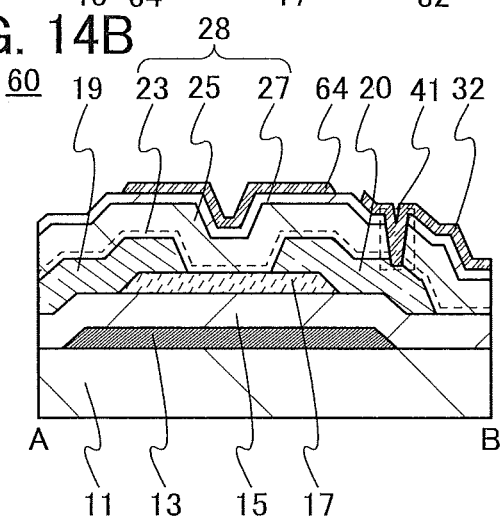

FIGS. 14A to 14C are a top view and cross-sectional views of the transistor 60 included in a semiconductor device. FIG. 14A is a top view of the transistor 60, FIG. 14B is a cross-sectional view taken along dashed-dotted line A-B in FIG. 14A, and FIG. 14C is a cross-sectional view taken along dashed-dotted line C-D in FIG. 14A. Note that in FIG. 14A, a substrate 11, insulating films, and the like are omitted for simplicity.

The transistor 60 illustrated in FIGS. 14B and 14C is a channel-etched transistor. The transistor 60 includes the gate electrode 13 provided over the substrate 11; the gate insulating film 15 formed over the substrate 11 and the gate electrode 13; the oxide semiconductor film 17 overlapping with the gate electrode 13 with the gate insulating film 15 provided therebetween; the pair of electrodes 19 and 20 in contact with the oxide semiconductor film 17; the gate insulating film 28 over the gate insulating film 15, the oxide semiconductor film 17, and the pair of electrodes 19 and 20; and the gate electrode 64 formed over the gate insulating film 28. The gate insulating film 28 includes an oxide insulating film 23, the oxide insulating film 25, and the nitride insulating film 27. Furthermore, the gate electrode 64 is connected to the gate electrode 13 through the conductive film 62. In addition, the electrode 32 in contact with one of the pair of electrodes 19 and 20 (here, the electrode 20) is formed over the gate insulating film 28. Note that the electrode 32 serves as a pixel electrode.

The conductive film 62 can be formed using a material and a formation method similar to those of the pair of electrodes 19 and 20 described in Embodiment 1, as appropriate. The conductive film 62 and the pair of electrodes 19 and 20 are formed at the same time. The gate electrode 64 can be formed using a material and a formation method similar to those of the gate electrode 31 described in Embodiment 1, as appropriate. The gate electrode 64 and the electrode 32 can be formed at the same time.

The transistor 60 described in this embodiment has a channel length longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 µm, yet still further preferably longer than 1 µm and shorter than or equal to 2.5 µm. Furthermore, in the transistor 60, the oxide semiconductor film 17 is provided between the gate electrode 13 and the gate electrode 64. In addition, as illustrated in FIG. 14A, the gate electrode 64 overlaps with the end portions of the oxide semiconductor film 17 with the gate insulating film 28 provided therebetween, when seen from the above.

Furthermore, a plurality of opening portions are provided in the gate insulating film 15 and the gate insulating film 28. As a typical example, as illustrated in FIG. 14B, the opening portion 41 that reaches one of the pair of electrodes 19 and 20 is provided. In addition, as illustrated in FIG. 14C, an opening portion 61 is provided in the gate insulating film 15 and an opening portion 63 is provided in the gate insulating film 28. The conductive film 62 is connected to the gate electrode 13 through the opening portion 61, and the gate electrode 64 is connected to the conductive film 62 through the opening portion 63. Thus, the gate electrode 13 and the gate electrode 64 are electrically connected to each other through the conductive film 62. In addition, the conductive film 62, which has the same potential as the gate electrode 13 and the gate electrode 64, and the side surface of the oxide semiconductor film 17 are provided so that the gate insulating film 28 is positioned therebetween.

Note that although the transistor 60 has a structure in which the gate electrode 13 and the gate electrode 64 are connected to each other through the conductive film 62 on an outer side of only one side surface of the oxide semiconductor film 17 in the channel width direction as illustrated in FIG. 14C, the gate electrode 13 and the gate electrode 64 may be connected to each other through the conductive film 62 on the outer sides of both side surfaces of the oxide semiconductor film 17.

Next, a manufacturing process of the transistor 60 will be described.

Through steps of FIGS. 9A to 9D, the gate electrode 13, the insulating film 14, and the oxide semiconductor film 17 are formed over the substrate 11. In the steps, a photolithography process is performed using the first and second photomasks.

Then, after a mask is formed over the insulating film 14 by a photolithography process using a third photomask, the insulating film 14 is partly etched to form the opening portion 61 illustrated in FIGS. 14A and 14B.

Figure 10B:
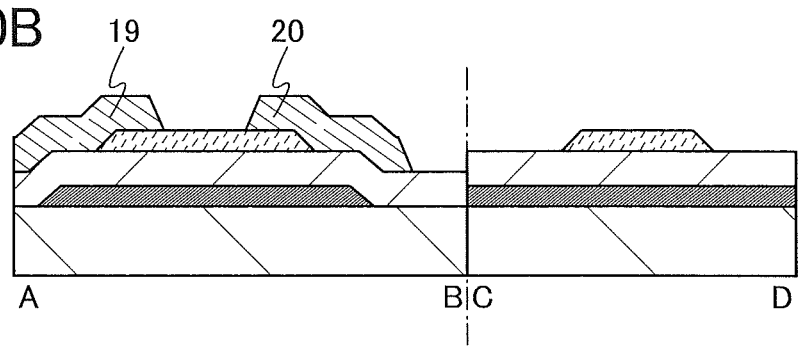

Next, as in the steps of FIGS. 10A and 10B, a mask is formed over the conductive film 18 by a photolithography process using a fourth photomask and then, the conductive film 18 is partly etched to form the pair of electrodes 19 and 20 and the conductive film 62.

Subsequently, the oxide insulating film 22, the oxide insulating film 24, and the nitride insulating film 26 are formed as in the step of FIG. 11A. Next, after a mask is formed over the nitride insulating film 26 by a photolithography process using a fifth photomask, the nitride insulating film 26 is partly etched to form the opening portions 41 and 63 illustrated in FIGS. 14A and 14B.

After that, the conductive film 30 is formed as in the step of FIG. 12A. Then, after a mask is formed over the conductive film 30 by a photolithography process using a sixth photomask, the conductive film 30 is partly etched to form the gate electrode 64 and the electrode 32 illustrated in FIGS. 14A to 14C.

Through the above process, the transistor 60 can be manufactured.

Modification Example 3

A transistor having a structure that is different from the structures illustrated in FIGS. 1A to 1D, FIGS. 13A to 13C, and FIGS. 14A to 14C is described with reference to FIGS. 15A to 15C. In a transistor 70 illustrated in FIGS. 15A to 15C, the electrode 32 connected to one of the pair of electrodes 19 and 20 is provided over the gate insulating film 15. Unlike the other transistors described in Embodiment 1, the transistor 70 includes a gate insulating film 74, which is isolated from other transistors, over the oxide semiconductor film 17 and the pair of electrodes 19 and 20.

Figure 15A:
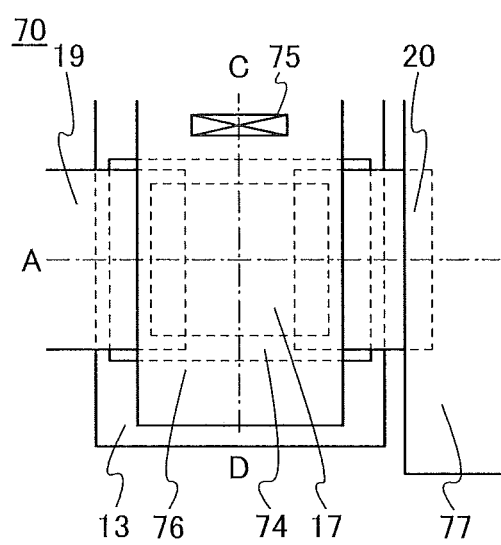
FIGS. 15A to 15C are a top view and cross-sectional views illustrating one embodiment of a transistor.
Figure 15C:
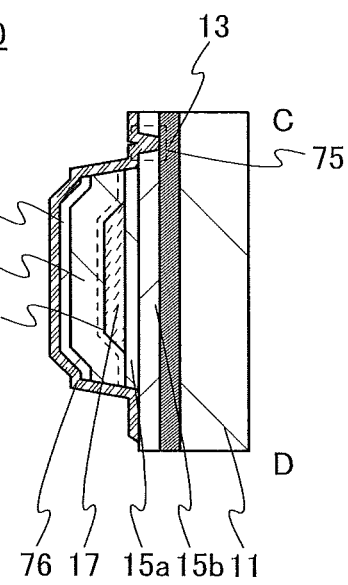
Figure 15B:
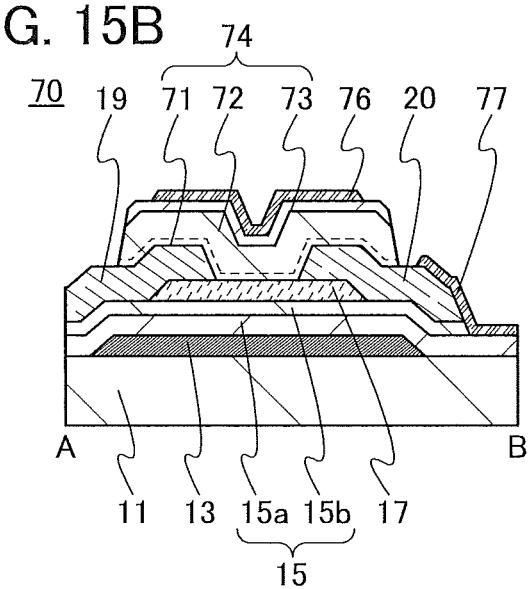

FIGS. 15A to 15C are a top view and cross-sectional views of the transistor 70 included in a semiconductor device. FIG. 15A is a top view of the transistor 70, FIG. 15B is a cross-sectional view taken along dashed-dotted line A-B in FIG. 15A, and FIG. 15C is a cross-sectional view taken along dashed-dotted line C-D in FIG. 15A. Note that in FIG. 15A, a substrate 11, insulating films, and the like are omitted for simplicity.

The transistor 70 illustrated in FIGS. 15B and 15C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 provided therebetween; the pair of electrodes 19 and 20 in contact with the oxide semiconductor film 17; the gate insulating film 74 over the gate insulating film 15, the oxide semiconductor film 17, and the pair of electrodes 19 and 20; and a gate electrode 76 over the gate insulating film 74 and the gate insulating film 15. The gate insulating film 74 includes an oxide insulating film 71, an oxide insulating film 72, and a nitride insulating film 73. Furthermore, the gate electrode 76 is connected to the gate electrode 13 through an opening portion 75 provided in a nitride insulating film 15a. In addition, the electrode 77 in contact with one of the pair of electrodes 19 and 20 (here, the electrode 20) is formed over the gate insulating film 15. Note that an electrode 77 serves as a pixel electrode.

The gate insulating film 15 includes the nitride insulating film 15a and an oxide insulating film 15b. The oxide insulating film 15b is formed in a region overlapping with any of the oxide semiconductor film 17, the pair of electrodes 19 and 20, and the oxide insulating film 71. The oxide insulating film 71 can be formed using a material and a formation method similar to those of the oxide insulating film 23 described in Embodiment 1, as appropriate. The oxide insulating film 72 can be formed using a material and a formation method similar to those of the oxide insulating film 25 described in Embodiment 1, as appropriate. The nitride insulating film 73 can be formed using a material and a formation method similar to those of the nitride insulating film 27 described in Embodiment 1, as appropriate. The gate electrode 76 and the electrode 77 can be formed using a material and a formation method similar to those of the gate electrode 31 and the electrode 32 described in Embodiment 1, as appropriate.

The gate insulating film 74 composed of the oxide insulating film 71, the oxide insulating film 72, and the nitride insulating film 73 is isolated from other transistors and overlaps with the oxide semiconductor film 17. Specifically, in the channel length direction in FIG. 15B, end portions of the gate insulating film 74 are positioned over the pair of electrodes 19 and 20, whereas in the channel width direction in FIG. 15C, end portions of the gate insulating film 74 are positioned on the outer sides of the oxide semiconductor film 17. Furthermore, in the channel width direction in FIG. 15C, the gate electrode 76 and each of the side surfaces of the oxide semiconductor film 17 are positioned so that the gate insulating film 74 is positioned therebetween. Note that in the channel length direction, the end portions of the gate insulating film 74 may be positioned over the gate insulating film 15 instead of over the pair of electrodes 19 and 20. In such a case, the electrode 77 is formed over the gate insulating film 74 and is connected to one of the pair of electrodes 19 and 20 through an opening portion in the gate insulating film 74.

The transistor 70 described in this embodiment has a channel length longer than or equal to 0.5 µm and shorter than or equal to 6.5 µm, preferably longer than 1 µm and shorter than 6 µm, further preferably longer than 1 µm and shorter than or equal to 4 µm, still further preferably longer than 1 µm and shorter than or equal to 3.5 µm, yet still further preferably longer than 1 µm and shorter than or equal to 2.5 µm. Furthermore, in the channel width direction of the transistor 70, the oxide semiconductor film 17 is provided between the gate electrode 13 and the gate electrode 76 with the gate insulating film 15 provided between the gate electrode 13 and the oxide semiconductor film 17 and with the gate insulating film 74 provided between the gate electrode 76 and the oxide semiconductor film 17. In addition, as illustrated in FIG. 15A, the gate electrode 76 overlaps with the end portions of the oxide semiconductor film 17 with the gate insulating film 74 provided therebetween, when seen from the above.

Note that although the gate electrode 13 and the gate electrode 76 are connected to each other on an outer side of only one side surface of the oxide semiconductor film 17 in the channel width direction as illustrated in FIG. 15C, the gate electrode 13 and the gate electrode 76 may be connected to each other on the outer sides of both side surfaces of the oxide semiconductor film 17.

Next, a manufacturing process of the transistor 70 will be described.

In the manufacturing process of the transistor 70, through steps of FIGS. 9A to 9D, FIGS. 10A and 10B, and FIG. 11A, the gate electrode 13, the insulating film 14, the oxide semiconductor film 17, the pair of electrodes 19 and 20, the oxide insulating film 22, the oxide insulating film 24, and the nitride insulating film 26 are formed over the substrate 11. In the steps, a photolithography process is performed using the first to third photomasks.

Figure 11B:
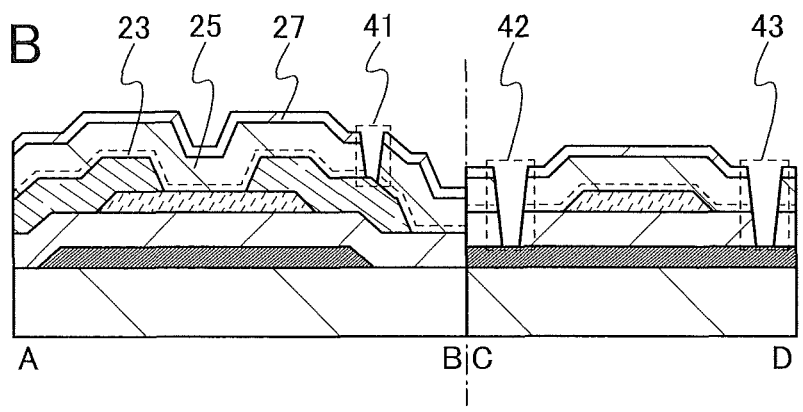

Next, after a mask is formed over the nitride insulating film 26 by a photolithography process using a fourth photomask as in the step of FIG. 11B, the oxide insulating film 22, the oxide insulating film 24, and the nitride insulating film 26 are partly etched to form the gate insulating film 74 isolated from other transistors. Note that in the case where the insulating film 14 is a stack including a nitride insulating film and an oxide insulating film, the insulating film 14 is partly etched in the etching of the oxide insulating film 23. As a result, the gate insulating film 15 including the nitride insulating film 15a and the oxide insulating film 15b, that is, the gate insulating film 15 including a step, is formed as illustrated in FIG. 15B.

After that, the gate electrode 76 and the electrode 77 are formed through the process illustrated in FIGS. 12A and 12B.

Through the above process, the transistor 70 can be manufactured.

(Embodiment 2)

A semiconductor device and a manufacturing method thereof, which are different from those in Embodiment 1, will be described with reference to drawings. In this embodiment, a transistor in which oxygen vacancies contained in an oxide semiconductor film are further reduced will be described with reference to FIGS. 16A to 16C.

Figure 16A:
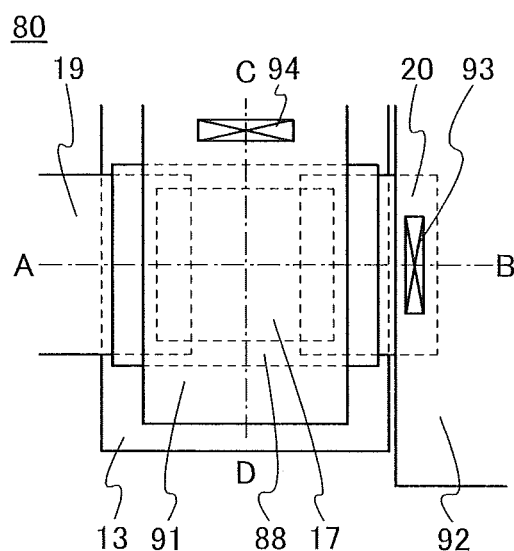
FIGS. 16A to 16C are a top view and cross-sectional views illustrating one embodiment of a transistor.
Figure 16C:
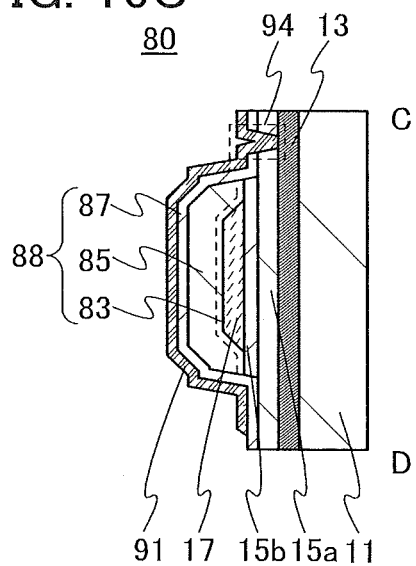
Figure 16B:
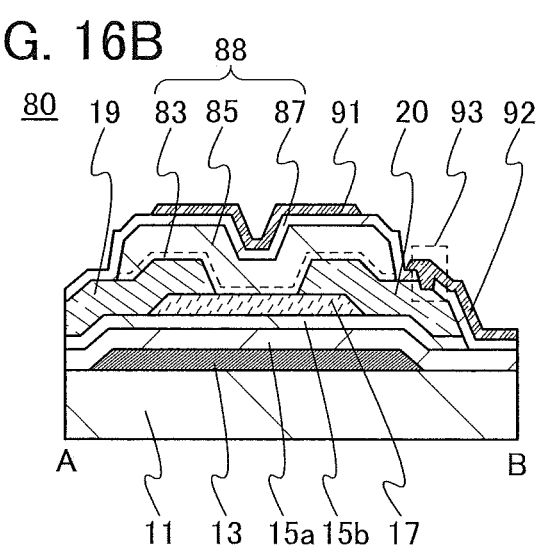

FIGS. 16A to 16C are a top view and cross-sectional views of a transistor 80 included in a semiconductor device. FIG. 16A is a top view of the transistor 80, FIG. 16B is a cross-sectional view taken along dashed-dotted line A-B in FIG. 16A, and FIG. 16C is a cross-sectional view taken along dashed-dotted line C-D in FIG. 16A. Note that in FIG. 16A, a substrate 11, insulating films, and the like are omitted for simplicity.

The transistor 80 illustrated in FIGS. 16B and 16C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 provided therebetween; the pair of electrodes 19 and 20 in contact with the oxide semiconductor film 17; a gate insulating film 88 over the gate insulating film 15, the oxide semiconductor film 17, and the pair of electrodes 19 and 20; and a gate electrode 91 over the gate insulating film 88. The gate insulating film 88 includes an oxide insulating film 83, the oxide insulating film 85, and the nitride insulating film 87. Furthermore, the gate electrode 91 is connected to the gate electrode 13 through an opening portion 94 provided in the gate insulating film 15 and the nitride insulating film 87. In addition, the electrode 92 in contact with one of the pair of electrodes 19 and 20 (here, the electrode 20) is formed over the nitride insulating film 27. The electrode 92 is connected to the electrode 20 through an opening portion 93 provided in the nitride insulating film 87. Note that the electrode 92 serves as a pixel electrode.

The gate insulating film 15 includes the nitride insulating film 15a and the oxide insulating film 15b. The oxide insulating film 15b is formed in a region overlapping with the oxide semiconductor film 17, the pair of electrodes 19 and 20, or the oxide insulating film 83.

The nitride insulating film 15a is formed using a silicon nitride film. For the oxide insulating film 15b, any of the oxides listed for the gate insulating film 15 in Embodiment 1 can be used as appropriate. The nitride insulating film 15a and the oxide insulating film 15b each can be formed by any of the listed methods for forming the insulating film 14 as appropriate. The oxide insulating film 83 can be formed using a material and a formation method similar to those of the oxide insulating film 23 described in Embodiment 1, as appropriate. The oxide insulating film 85 can be formed using a material and a formation method similar to those of the oxide insulating film 25 described in Embodiment 1, as appropriate. The nitride insulating film 87 can be formed using a material and a formation method similar to those of the nitride insulating film 27 described in Embodiment 1, as appropriate. The gate electrodes 91 and 92 can be formed using a material and a formation method similar to those of the gate electrodes 31 and 32 described in Embodiment 1, as appropriate.

The oxide insulating film 83 is isolated from the oxide insulating film 85. In addition, the oxide insulating film 83 and the oxide insulating film 85 each overlap with the oxide semiconductor film 17. Specifically, in the channel length direction in FIG. 16B, end portions of the oxide insulating films 83 and 85 are positioned over the pair of electrodes 19 and 20, whereas in the channel width direction in FIG. 16C, end portions of the oxide insulating films 83 and 85 are positioned on the outer sides of the side surfaces of the oxide semiconductor film 17. The nitride insulating film 87 is formed so as to cover the top surfaces and side surfaces of the oxide insulating films 83 and 85, and is in contact with the nitride insulating film 15a. Note that in the channel length direction, the end portions of the oxide insulating films 83 and 85 may be positioned over the nitride insulating film 15a instead of over the pair of electrodes 19 and 20.

In the channel width direction in FIG. 16C, the gate electrode 91 and each of the side surfaces of the oxide semiconductor film 17 are provided so that side surfaces of the oxide insulating films 83 and 85 are positioned therebetween.

The transistor 80 of this embodiment has a channel length longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm. Furthermore, in the channel width direction of the transistor 80, the oxide semiconductor film 17 is provided between the gate electrode 13 and the gate electrode 91 with the gate insulating film 15 provided between the gate electrode 13 and the oxide semiconductor film 17 and with the gate insulating film 88 provided between the gate electrode 91 and the oxide semiconductor film 17. In addition, as illustrated in FIG. 15A, the gate electrode 91 overlaps with end portions of the oxide semiconductor film 17 with the gate insulating film 88 provided therebetween, when seen from the above.

As illustrated in FIG. 16C, the gate electrode 91 is connected to the gate electrode 13 through the opening portion 94 provided in the gate insulating film 15 and the nitride insulating film 87 on an outer side of one side surface of the oxide semiconductor film 17. The gate electrode 91 and the side surface of the oxide semiconductor film 17 are provided so that the side surfaces of the oxide insulating films 83 and 85 are positioned therebetween. The gate electrode 91 and the gate electrode 13 are not connected to each other on an outer side of the other side surface of the oxide semiconductor film 17. End portions of the gate electrode 91 are positioned on outer sides of the side surfaces of the oxide semiconductor film 17.

Note that although the transistor 80 has a structure in which the gate electrode 13 and the gate electrode 91 are connected to each other on an outer side of only one side surface of the oxide semiconductor film 17 in the channel width direction as illustrated in FIG. 16C, the gate electrode 13 and the gate electrode 91 may be connected to each other on the outer sides of both side surfaces of the oxide semiconductor film 17 in the channel width direction.

In the transistor 80 described in this embodiment, the oxide semiconductor film 17 and the oxide insulating film 85 are surrounded by the nitride insulating film 15a and the nitride insulating film 87. The nitride insulating film 15a and the nitride insulating film 87 each have a small oxygen diffusion coefficient and have a barrier property against oxygen. Thus, part of oxygen contained in the oxide insulating film 85 can be moved to the oxide semiconductor film 17, so that oxygen vacancies in the oxide semiconductor film 17 can be reduced. In addition, the nitride insulating film 15a and the nitride insulating film 87 each have a small diffusion coefficient of water, hydrogen, and the like and have a barrier property against water, hydrogen, and the like, which can prevent diffusion of water, hydrogen, and the like from the outside into the oxide semiconductor film 17. For these reason, the transistor 80 has high reliability.

Next, a manufacturing process of the transistor 80 will be described.

In the manufacturing process of the transistor 80, the gate electrode 13, the nitride insulating film 14a, the oxide insulating film 14b, the oxide semiconductor film 17, and the pair of electrodes 19 and 20 are formed over the substrate 11 through steps similar to those in FIGS. 9A to 9D and FIGS. 10A and 10B. In the steps, a photolithography process is performed using the first to third photomasks.

Figure 17A:
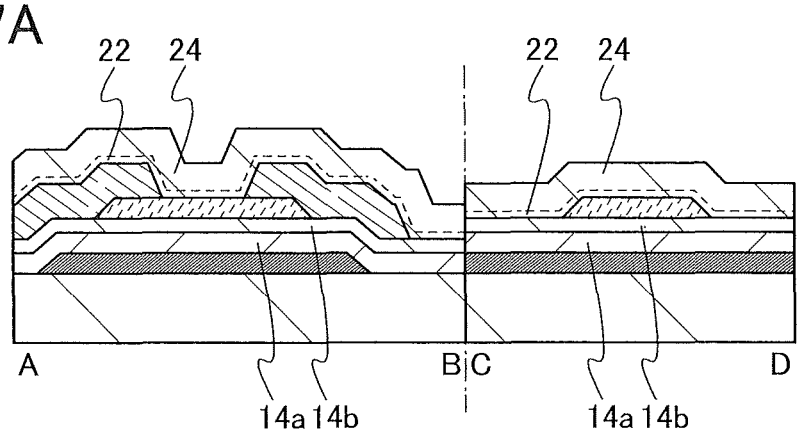
FIGS. 17A and 17B are cross-sectional views illustrating one embodiment of a method for manufacturing a transistor.

Then, the oxide insulating film 22 and the oxide insulating film 24 are formed as illustrated in FIG. 17A. Subsequently, oxygen contained in the oxide insulating film 24 is partly transferred to the oxide semiconductor film 17 by heat treatment; thus, oxygen vacancies contained in the oxide semiconductor film 17 can be reduced.

Figure 17B:
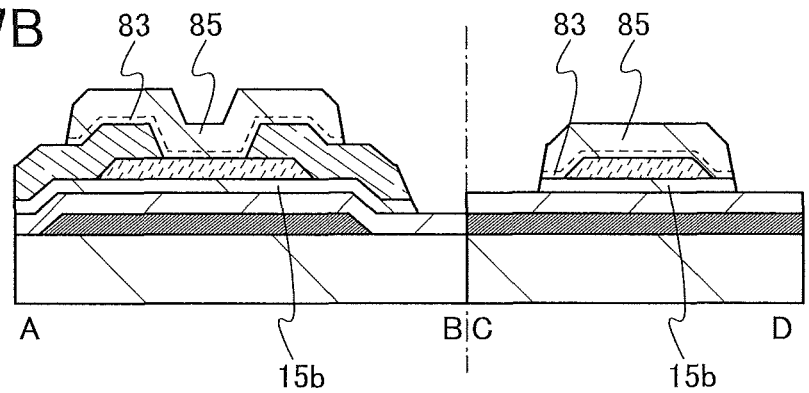

Next, a mask is formed over the oxide insulating film 24 by a photolithography process using a fourth photomask and then, the oxide insulating film 22 and the oxide insulating film 24 are partly etched to form the oxide insulating films 83 and 85 which are isolated from each other. Note that the oxide insulating film 14b is partly etched in the etching of the oxide insulating film 23. As a result, the nitride insulating film 14a is exposed as illustrated in FIG. 17B. In other words, the gate insulating film 15 including a step is formed.

Figure 18A:
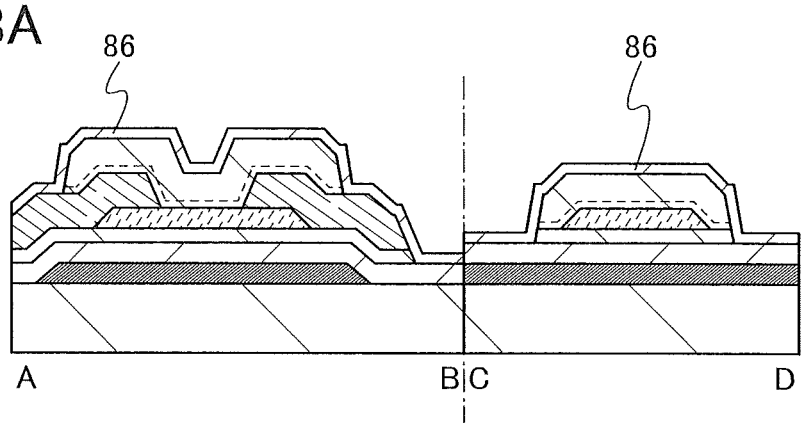
FIGS. 18A and 18B are cross-sectional views illustrating one embodiment of a method for manufacturing a transistor.

After that, a nitride insulating film 86 illustrated in FIG. 18A is formed. In this step, in the cross-sectional view along line C-D in the channel width direction, the nitride insulating film 14a and the nitride insulating film 86 are in contact with each other. That is, the oxide semiconductor film 17 and the oxide insulating film 85 are surrounded by the nitride insulating film 15a and the nitride insulating film 86.

Figure 18B:
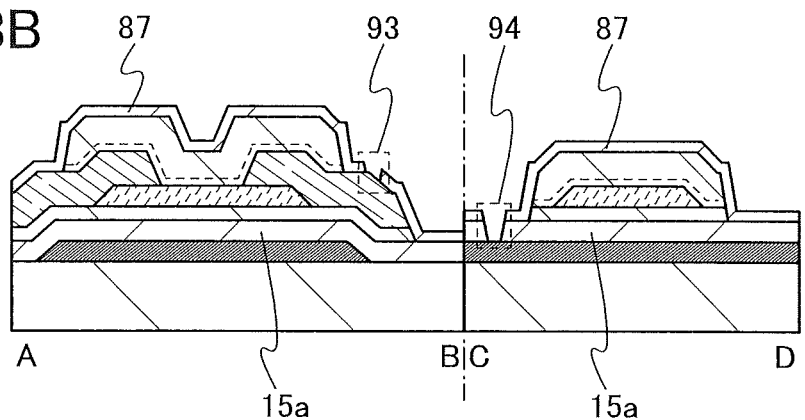

Next, after a mask is formed over the nitride insulating film 86 by a photolithography process using a fifth photomask, the nitride insulating film 86 is partly etched to form the opening portion 93. In addition, the nitride insulating film 14a and the nitride insulating film 86 are partly etched to form the nitride insulating film 15a and the nitride insulating film 87 in addition to the opening portion 94 (see FIG. 18B).

Figure 19A:
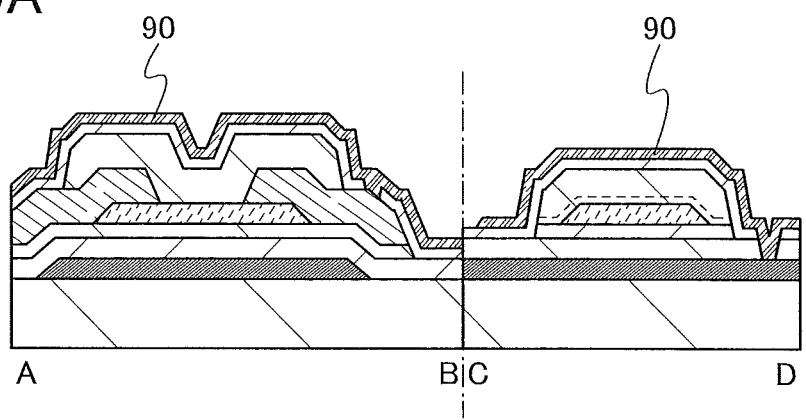
FIGS. 19A and 19B are cross-sectional views illustrating one embodiment of a method for manufacturing a transistor.

After that, a conductive film 90 to be the gate electrode 91 and the electrode 92 is formed as illustrated in FIG. 19A. The conductive film 90 can be formed in a manner similar to that of the conductive film 30 described in Embodiment 1.

Then, a mask is formed over the conductive film 90 by a photolithography process using a sixth photomask. Next, the conductive film 90 is partly etched using the mask to form the gate electrode 91 and the electrode 92. After that, the mask is removed (see FIG. 19B).

Figure 19B:
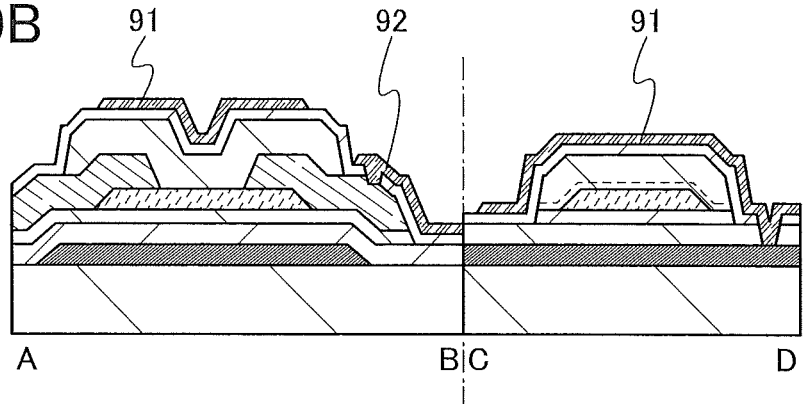

Note that as illustrated in FIG. 19B, in the channel width direction, the gate electrode 91 is formed so that the gate electrode 91 and each of the side surfaces of the oxide semiconductor film 17 are provided so that the side surfaces of the oxide insulating films 83 and 85 are positioned therebetween.

After that, heat treatment may be performed. The oxide insulating film 85 is formed using an oxide insulating film containing oxygen at higher proportion than the stoichiometric composition. Further, the nitride insulating film 15a and the nitride insulating film 87 each have a high barrier property against oxygen. Accordingly, the heat treatment can reduce diffusion of oxygen contained in the oxide insulating film 85 to the outside. In addition, diffusion of oxygen contained in the oxide semiconductor film 17 to the outside can be also reduced. As a result, oxygen vacancies in the oxide semiconductor film 17 can be reduced. Further, the nitride insulating film 15a and the nitride insulating film 87 each have a high barrier property against hydrogen, water, and the like, which can prevent diffusion of hydrogen, water, and the like from the outside into the oxide semiconductor film 17. Thus, hydrogen, water, and the like in the oxide semiconductor film 17 can be reduced. As a result, a highly reliable transistor can be manufactured.

Through the above process, the transistor 80 can be manufactured.

(Embodiment 3)

In each of the transistors described in Embodiments 1 and 2, a base insulating film can be provided between the substrate 11 and the gate electrode 13 as necessary. Examples of a material for the base insulating film include silicon oxide, silicon oxynitride, silicon nitride, silicon nitride oxide, gallium oxide, hafnium oxide, yttrium oxide, aluminum oxide, aluminum oxynitride, and the like. Note that when silicon nitride, gallium oxide, hafnium oxide, yttrium oxide, aluminum oxide, or the like is used for the base insulating film, it is possible to suppress diffusion of impurities such as alkali metal, water, and hydrogen from the substrate 11 into the oxide semiconductor film 17.

The base insulating film can be formed by a sputtering method, a CVD method, or the like.

Note that the structures, methods, and the like described in this embodiment can be used as appropriate in combination with any of the structures, methods, and the like described in the other embodiments.

(Embodiment 4)

Figure 20:
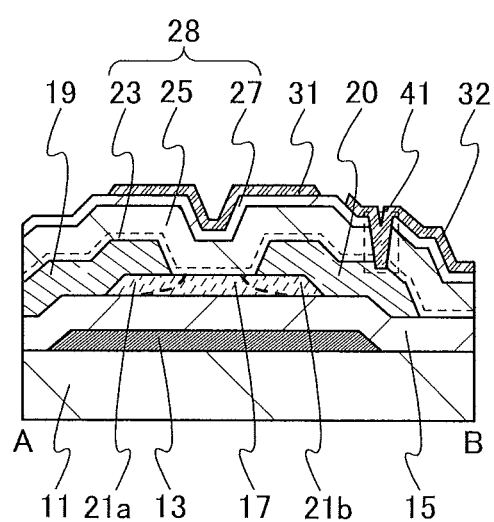
FIG. 20 is a cross-sectional view illustrating one embodiment of a transistor.

In this embodiment, an embodiment of a transistor in which the oxide semiconductor film 17, and the pair of electrodes 19 and 20 are different from those in the transistor 10 in Embodiment 1 will be described with reference to FIG. 20. Note that this embodiment can be applied to other transistors as appropriate.

As for the pair of electrodes 19 and 20 provided in the transistor, it is possible to use a conductive material which is easily bonded to oxygen, such as tungsten, titanium, aluminum, copper, molybdenum, chromium, or tantalum, or an alloy thereof. Thus, oxygen contained in the oxide semiconductor film 17 and the conductive material contained in the pair of electrodes 19 and 20 are bonded to each other, so that an oxygen deficient region is formed in the oxide semiconductor film 17. Furthermore, in some cases, part of constituent elements of the conductive material that forms the pair of electrodes 19 and 20 is mixed into the oxide semiconductor film 17. Consequently, as shown in FIG. 20, low-resistance regions 21a and 21b are formed in the vicinity of regions of the oxide semiconductor film 17 which are in contact with the pair of electrodes 19 and 20. The low-resistance region 21a is in contact with the electrode 19 and is formed between the gate insulating film 15 and the electrode 19, whereas the low-resistance region 21b is in contact with the electrode 20 and is formed between the gate insulating film 15 and the electrode 20. Since the low-resistance regions 21a and 21b have high conductivity, contact resistance between the oxide semiconductor film 17 and the pair of electrodes 19 and 20 can be reduced, and thus, the on-state current of the transistor can be increased.

Note that end portions of the low-resistance regions 21a and 21b may be substantially aligned with the end portions of the pair of electrodes 19 and 20. Alternatively, as illustrated in FIG. 20, the end portions of the low-resistance regions 21a and 21b may overlap with a region between the end portions of the pair of electrodes 19 and 20. In the case where the low-resistance regions 21a and 21b are formed in the oxide semiconductor film 17, a channel length is the distance between the low-resistance regions 21a and 21b at the interface between the gate insulating film 28 and the oxide semiconductor film 17.

Furthermore, the pair of electrodes 19 and 20 may have a stacked-layer structure including the conductive material which is easily bonded to oxygen and a conductive material which is not easily bonded to oxygen, such as titanium nitride, tantalum nitride, or ruthenium. With such a stacked-layer structure, oxidization of the pair of electrodes 19 and 20 can be prevented at the interface between the oxide insulating film 23 and the pair of electrodes 19 and 20, so that an increase in the resistance of the pair of electrodes 19 and 20 can be inhibited.

Note that the structures, methods, and the like described in this embodiment can be used as appropriate in combination with any of the structures, methods, and the like described in the other embodiments.

(Embodiment 5)

In this embodiment, a semiconductor device including a transistor in which the number of defects in an oxide semiconductor film can be further reduced as compared to Embodiments 1 to 4 is described with reference to drawings. The transistor described in this embodiment is different from any of the transistors in Embodiments 1 to 4 in that a multilayer film including a plurality of oxide semiconductor films is provided.

Figure 21A:
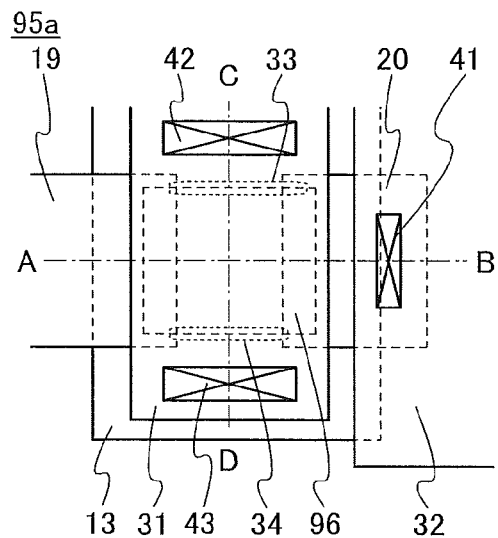
FIG. 21A is a top view illustrating one embodiment of a transistor and FIGS. 21B to 21D are cross-sectional views each illustrating one embodiment of a transistor.
Figure 21C:
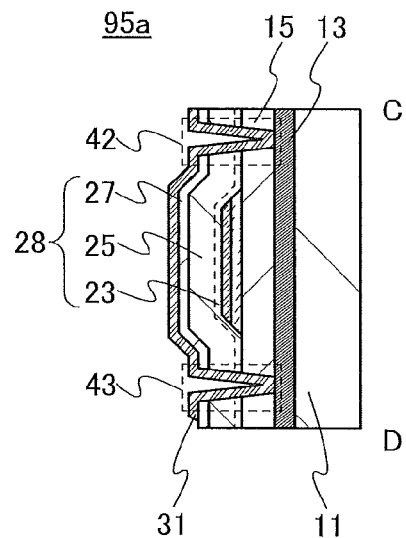
Figure 21B:
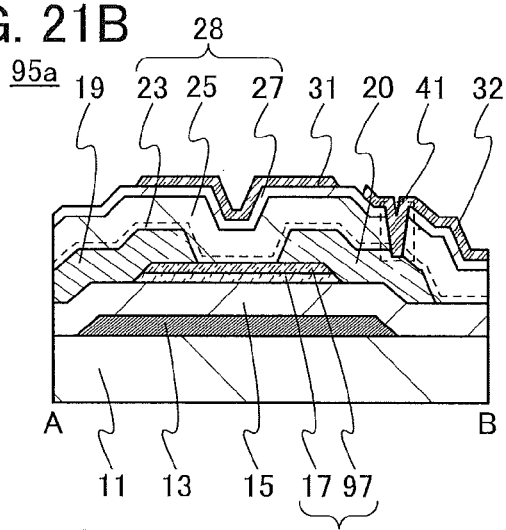

FIGS. 21A to 21C are a top view and cross-sectional views of a transistor 95a included in a semiconductor device. FIG. 21A is a top view of the transistor 95a, FIG. 21B is a cross-sectional view taken along dashed-dotted line A-B in FIG. 21A, and FIG. 21C is a cross-sectional view taken along dashed-dotted line C-D in FIG. 21A. Note that in FIG. 21A, a substrate 11, insulating films, and the like are omitted for simplicity.

The transistor 95a illustrated in FIG. 21A includes a multilayer film 96 overlapping with the gate electrode 13 with the gate insulating film 15 provided therebetween, and the pair of electrodes 19 and 20 in contact with the multilayer film 96. The oxide insulating film 23, the oxide insulating film 25, and the nitride insulating film 27 are stacked over the gate insulating film 15, the multilayer film 96, and the pair of electrodes 19 and 20.

In the transistor 95a described in this embodiment, the multilayer film 96 includes the oxide semiconductor film 17 and an oxide semiconductor film 97. That is, the multilayer film 96 has a two-layer structure. Furthermore, part of the oxide semiconductor film 17 serves as a channel region. In addition, the oxide insulating film 23 is formed in contact with the multilayer film 96. The oxide semiconductor film 97 is provided between the oxide semiconductor film 17 and the oxide insulating film 23. The oxide insulating film 25 is formed in contact with the oxide insulating film 23.

The oxide semiconductor film 97 contains one or more elements that form the oxide semiconductor film 17. Thus, interface scattering is unlikely to occur at the interface between the oxide semiconductor film 17 and the oxide semiconductor film 97. Thus, the transistor can have high field-effect mobility because the movement of carriers is not hindered at the interfaces.

The oxide semiconductor film 97 is formed using a metal oxide film containing at least In or Zn. Typical examples of the metal oxide film include an In—Ga oxide film, an In—Zn oxide film, and an In—M—Zn oxide film (M represents Al, Ga, Y, Zr, La, Ce, or Nd). The conduction band minimum of the oxide semiconductor film 97 is closer to a vacuum level than that of an oxide semiconductor film 17 is; as a typical example, the energy difference between the conduction band minimum of the oxide semiconductor film 97 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 97 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 97 preferably contains In because carrier mobility (electron mobility) can be increased.

When the oxide semiconductor film 97 contains a larger amount of Al, Ga, Y, Zr, La, Ce, or Nd than the amount of In in an atomic ratio, any of the following effects may be obtained: (1) the energy gap of the oxide semiconductor film 97 is widened; (2) the electron affinity of the oxide semiconductor film 97 decreases; (3) impurity diffusion from the outside is suppressed; (4) an insulating property of the oxide semiconductor film 97 increases as compared to that of the oxide semiconductor film 17; and (5) an oxygen vacancy is less likely to be generated because Al, Ga, Y, Zr, La, Ce, or Nd is a metal element that is strongly bonded to oxygen.

In the case where the oxide semiconductor film 97 is an In—M—Zn oxide film, the proportion of In and the proportion of M, not taking Zn and O into consideration, are less than 50 atomic % and greater than or equal to 50 atomic %, respectively, and preferably less than 25 atomic % and greater than or equal to 75 atomic %, respectively.

Furthermore, in the case where each of the oxide semiconductor films 17 and 97 contains an In—M—Zn oxide (M represents Al, Ga, Y, Zr, La, Ce, or Nd), the proportion of M atoms (M represents Al, Ga, Y, Zr, La, Ce, or Nd) in the oxide semiconductor film 97 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 97 contains an In—M—Zn oxide (M represents Al, Ga, Y, Zr, La, Ce, or Nd), when In:M:Zn= [atomic ratio] is satisfied in the oxide semiconductor film 97 and In:M:Zn=$x_2$:$y_2$:$z_2$ [atomic ratio] is satisfied in the oxide semiconductor film 17, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 17 is an In—M—Zn oxide film (M is Al, Ga, Y, Zr, La, Ce, or Nd) and a target having the atomic ratio of metal elements of In:M: Zn=$x_1$ is used for forming the oxide semiconductor film 17, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M: Zn=1:1:1, In:M:Zn=1:1:1.2, and In:M:Zn=3:1:2.

In the case where the oxide semiconductor film 97 is an In—M—Zn oxide film (M is Al, Ga, Y, Zr, La, Ce, or Nd) and a target having the atomic ratio of metal elements of In:M: Zn=$x_2$:$y_2$:$z_2$ is used for forming the oxide semiconductor film 97, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 97 is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor films 17 and 97 varies within a range of ±40% of that in the above atomic ratio as an error.

The oxide semiconductor film 97 can relieve damage to the oxide semiconductor film 17 at the time of forming the oxide insulating film 25 later. Thus, the oxide insulating film 25 may be formed over the oxide semiconductor film 97 without the oxide insulating film 23.

The thickness of the oxide semiconductor film 97 is greater than or equal to 3 nm and less than or equal to 100 nm, preferably greater than or equal to 3 nm and less than or equal to 50 nm.

The oxide semiconductor film 97 may have a non-single-crystal structure, for example, like the oxide semiconductor film 17. The non-single crystal structure includes a c-axis aligned crystalline oxide semiconductor (CAAC-OS) that is described later, a polycrystalline structure, a microcrystalline structure described later, or an amorphous structure, for example.

The oxide semiconductor film 97 may have an amorphous structure, for example. An amorphous oxide semiconductor film, for example, has disordered atomic arrangement and no crystalline component.

Note that the oxide semiconductor films 17 and 97 may each be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

In this case, the oxide semiconductor film 97 is provided between the oxide semiconductor film 17 and the oxide insulating film 23. Thus, if carrier traps are formed between the oxide insulating film 23 and the oxide semiconductor film 97 by impurities and defects, electrons flowing in the oxide semiconductor film 17 are less likely to be captured by the carrier traps because there is a distance between the region where the carrier traps are formed and the oxide semiconductor film 17. Accordingly, the amount of on-state current of the transistor can be increased, and the field-effect mobility can be increased. When the electrons are captured by the carrier traps, the electrons become negative fixed charges. As a result, the threshold voltage of the transistor varies. However, by the distance between the region where the carrier traps are formed and the oxide semiconductor film 17, capture of the electrons by the carrier traps can be reduced, and accordingly fluctuations of the threshold voltage can be reduced.

The oxide semiconductor film 97 can block impurities from the outside, and accordingly, the amount of impurities that are transferred from the outside to the oxide semiconductor film 17 can be reduced. Furthermore, an oxygen vacancy is less likely to be formed in the oxide semiconductor film 97. Consequently, the impurity concentration and oxygen vacancies in the oxide semiconductor film 17 can be reduced.

Note that the oxide semiconductor films 17 and 97 are not formed by simply stacking each film, but are formed to form a continuous junction (here, in particular, a structure in which the energy of the conduction band minimum is changed continuously between each film). In other words, a stacked-layer structure in which there exists no impurity that forms a defect level such as a trap center or a recombination center at each interface is provided. If an impurity exists between the oxide semiconductor films 17 and 97 that are stacked, a continuity of the energy band is damaged, and the carrier is captured or recombined at the interface and then disappears.

To form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 21D:
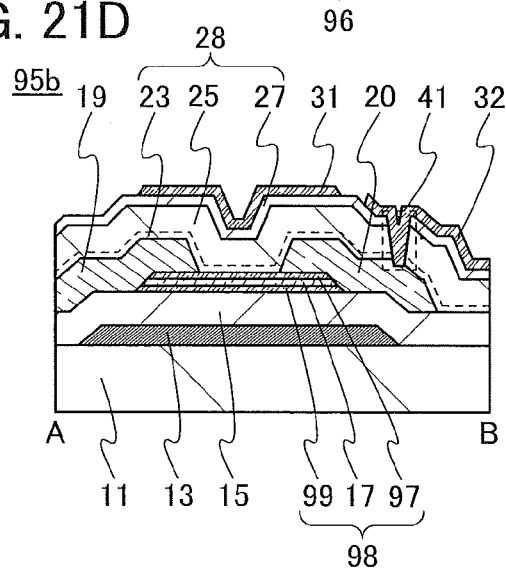

Note that as in a transistor 95b illustrated in FIG. 21D, a multilayer film 98 may be included instead of the multilayer film 96.

An oxide semiconductor film 99, the oxide semiconductor film 17, and the oxide semiconductor film 97 are stacked in this order in the multilayer film 98. That is, the multilayer film 98 has a three-layer structure. Furthermore, the oxide semiconductor film 17 serves as a channel region.

The gate insulating film 15 is in contact with the oxide semiconductor film 99. In other words, the oxide semiconductor film 99 is provided between the gate insulating film 15 and the oxide semiconductor film 17.

Furthermore, the oxide semiconductor film 97 is in contact with the oxide insulating film 23. That is, the oxide semiconductor film 97 is provided between the oxide semiconductor film 17 and the oxide insulating film 23.

The oxide semiconductor film 99 can be formed using a material and a formation method similar to those of the oxide semiconductor film 97.

It is preferable that the thickness of the oxide semiconductor film 99 be smaller than those of the oxide semiconductor film 17. When the thickness of the oxide semiconductor film 99 is greater than or equal to 1 nm and less than or equal to 5 nm, preferably greater than or equal to 1 nm and less than or equal to 3 nm, the amount of change in the threshold voltage of the transistor can be reduced.

Note that as in the transistor 95a, the oxide semiconductor film 97 included in the transistor 95b also serve as a film that relieves damage to the oxide semiconductor film 17 at the time of forming the oxide insulating film 25 later. Thus, the oxide insulating film 25 may be formed over the oxide semiconductor film 97 without the oxide insulating film 23.

In the transistors described in this embodiment, the oxide semiconductor film 97 is provided between the oxide insulating film 23 and the oxide semiconductor film 17. Thus, if carrier traps are formed between the oxide insulating film 23 and the oxide semiconductor film 97 by impurities and defects, electrons flowing in the oxide semiconductor film 17 are less likely to be captured by the carrier traps because there is a distance between the region where the carrier traps are formed and the oxide semiconductor film 17. Accordingly, the amount of on-state current of the transistor can be increased, and the field-effect mobility can be increased. When the electrons are captured by the carrier traps, the electrons behave as negative fixed charges. As a result, the threshold voltage of the transistor varies. However, by the distance between the region where the carrier traps are formed and the oxide semiconductor film 17, capture of electrons by the carrier traps can be reduced, and accordingly, fluctuations of the threshold voltage can be reduced.

The oxide semiconductor film 97 can block entry of impurities from the outside, and accordingly, the amount of impurities transferred to the oxide semiconductor film 17 from the outside can be reduced. Furthermore, an oxygen vacancy is less likely to be formed in the oxide semiconductor film 97. Consequently, the impurity concentration and the number of oxygen vacancies in the oxide semiconductor film 17 can be reduced.

The oxide semiconductor film 99 is provided between the gate insulating film 15 and the oxide semiconductor film 17, and the oxide semiconductor film 97 is provided between the insulating film 17 and the oxide semiconductor film 23. Thus, it is possible to reduce the concentration of silicon or carbon in the vicinity of the interface between the oxide semiconductor film 99 and the oxide semiconductor film 17, in the oxide semiconductor film 17, or in the vicinity of the interface between the oxide semiconductor film 97 and the oxide semiconductor film 17.

The transistor 95b having such a structure includes very few defects in the multilayer film 98 including the oxide semiconductor film 17; thus, the electrical characteristics, typified by the on-state current and the field-effect mobility, of these transistors can be improved. Further, in a BT stress test and a BT photostress test that are examples of a stress test, the amount of change in threshold voltage is small, and thus, reliability is high.

<Band Structure of Transistor>

Next, band structures of the multilayer film 96 included in the transistor 95a illustrated in FIG. 21A, and the multilayer film 98 included in the transistor 95b illustrated in FIG. 21B are described with reference to FIGS. 22A to 22C.

Here, for example, an In—Ga—Zn oxide having an energy gap of 3.15 eV is used for the oxide semiconductor film 17, and an In—Ga—Zn oxide having an energy gap of 3.5 eV is used for the oxide semiconductor film 97. The energy gaps can be measured using a spectroscopic ellipsometer (UT-300 manufactured by HORIBA JOBIN YVON SAS.).

The energy difference between the vacuum level and the valence band maximum (also called ionization potential) of the oxide semiconductor film 17 and the energy difference between the vacuum level and the valence band maximum of the oxide semiconductor film 97 were 8 eV and 8.2 eV, respectively. Note that the energy difference between the vacuum level and the valence band maximum can be measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17 and the energy gap therebetween of the oxide semiconductor film 97 are 4.85 eV and 4.7 eV, respectively.

Figure 22A:
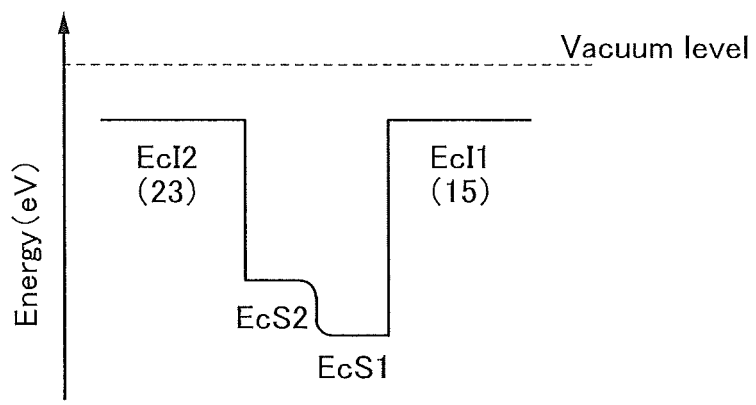
FIGS. 22A to 22C illustrate band structures of transistors.

FIG. 22A schematically illustrates a part of the band structure of the multilayer film 96. Here, the case where silicon oxide films are used for the gate insulating film 15 and the oxide insulating film 23 and the silicon oxide films are provided in contact with the multilayer film 96 is described. In FIG. 22A, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 97; and EcI2 denotes the energy of the conduction band minimum of the silicon oxide film. Furthermore, EcI1 and EcI2 correspond to the gate insulating film 15 and the oxide insulating film 23 in FIG. 21B, respectively.

As illustrated in FIG. 22A, there is no energy barrier between the oxide semiconductor films 17 and 97, and the energy of the conduction band minimum gradually changes therebetween. In other words, the energy of the conduction band minimum is continuously changed. This is because the multilayer film 96 contains an element contained in the oxide semiconductor film 17 and oxygen is transferred between the oxide semiconductor films 17 and 97, so that a mixed layer is formed.

As shown in FIG. 22A, the oxide semiconductor film 17 in the multilayer film 96 serves as a well and a channel region of the transistor including the multilayer film 96 is formed in the oxide semiconductor film 17. Note that since the energy of the conduction band minimum of the multilayer film 96 is continuously changed, it can be said that the oxide semiconductor films 17 and 97 are continuous.

Although trap levels due to impurities or defects might be generated in the vicinity of the interface between the oxide semiconductor film 97 and the oxide insulating film 23 as shown in FIG. 22A, the oxide semiconductor film 17 can be distanced from the region where the trap levels are generated owing to the existence of the oxide semiconductor film 97. However, when the energy difference between EcS1 and EcS2 is small, an electron in the oxide semiconductor film 17 might reach the trap level across the energy difference. When the electron is captured by the trap level, a negative fixed charge is generated at the interface with the oxide insulating film, whereby the threshold voltage of the transistor shifts in the positive direction. Thus, it is preferable that the energy difference between EcS1 and EcS2 be 0.1 eV or more, further preferably 0.15 eV or more, because change in the threshold voltage of the transistor is reduced and stable electrical characteristics are obtained.

Figure 22B:
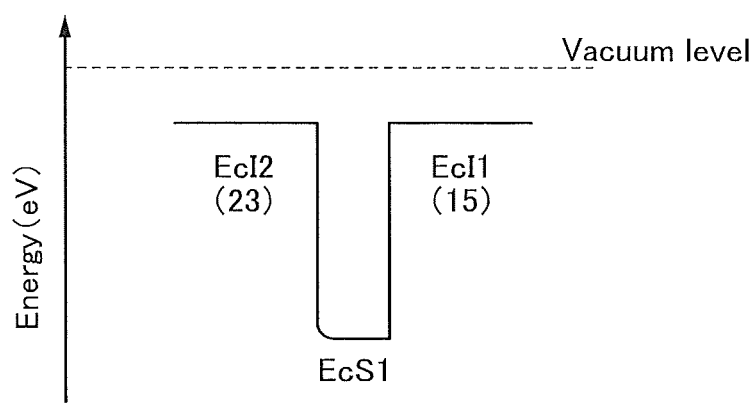

FIG. 22B schematically illustrates a part of the band structure of the multilayer film 96, which is a variation of the band structure shown in FIG. 22A. Here, a structure where silicon oxide films are used for the gate insulating film 15 and the oxide insulating film 23 and the silicon oxide films are in contact with the multilayer film 96 is described. In FIG. 22B, EcI1 denotes the energy of the conduction band minimum of the silicon oxide film; EcS1 denotes the energy of the conduction band minimum of the oxide semiconductor film 17; and EcI2 denotes the energy of the conduction band minimum of the silicon oxide film. Further, EcI1 and EcI2 correspond to the gate insulating film 15 and the oxide insulating film 23 in FIG. 21B, respectively.

In the transistor illustrated in FIG. 21B, an upper portion of the multilayer film 96, that is, the oxide semiconductor film 97 might be etched in formation of the pair of electrodes 19 and 20. Furthermore, a mixed layer of the oxide semiconductor films 17 and 97 is likely to be formed on the top surface of the oxide semiconductor film 17 in formation of the oxide semiconductor film 97.

For example, when the oxide semiconductor film 17 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 97 is an oxide film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6, the Ga content in the oxide semiconductor film 97 is higher than that in the oxide semiconductor film 17. Thus, a $GaO_x$ layer or a mixed layer whose Ga content is higher than that in the oxide semiconductor film 17 can be farmed on the top surface of the oxide semiconductor film 17.

For that reason, even in the case where the oxide semiconductor film 97 is etched, the energy of the conduction band minimum EcS1 on the EcI2 side is increased and the band structure shown in FIG. 22B can be obtained in some cases.

As in the band structure shown in FIG. 22B, in observation of a cross section of a channel region, only the oxide semiconductor film 17 in the multilayer film 96 is apparently observed in some cases. However, a mixed layer that contains Ga more than the oxide semiconductor film 17 does is formed over the oxide semiconductor film 17 in fact, and thus the mixed layer can be regarded as a 1.5-th layer. Note that the mixed layer can be confirmed by analyzing a composition in the upper portion of the oxide semiconductor film 17, when the elements contained in the multilayer film 96 are measured by an EDX analysis, for example. The mixed layer can be confirmed, for example, in such a manner that the Ga content in the composition in the upper portion of the oxide semiconductor film 17 is larger than the Ga content in the oxide semiconductor film 17.

Figure 22C:
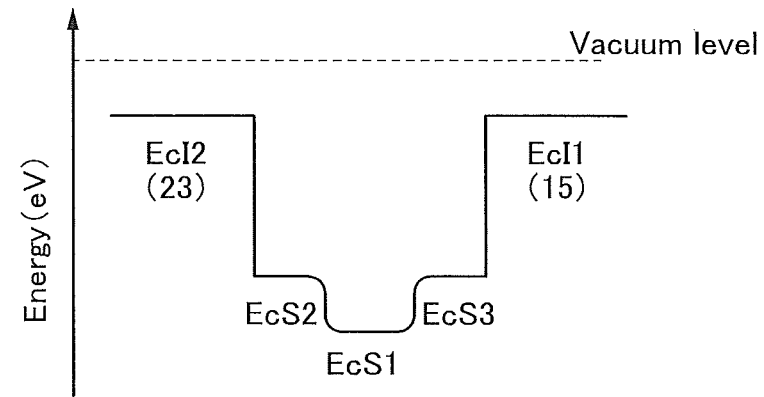

FIG. 22C schematically illustrates a part of the band structure of the multilayer film 98. Here, the case where silicon oxide films are used for the gate insulating film 15 and the oxide insulating film 23 and the silicon oxide films are in contact with the multilayer film 98 is described. In FIG. 22C, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 97; EcS3 denotes the energy of the conduction band minimum of the oxide semiconductor film 99; and EcI2 denotes the energy of the conduction band minimum of the silicon oxide film. Furthermore, EcI1 and EcI2 correspond to the gate insulating film 15 and the oxide insulating film 23 in FIG. 21D, respectively.

As illustrated in FIG. 22C, there is no energy barrier between the oxide semiconductor films 99, 17, and 97, and the conduction band minimums thereof smoothly vary. In other words, the conduction band minimums are continuous. This is because the multilayer film 98 contains an element contained in the oxide semiconductor film 17 and oxygen is transferred between the oxide semiconductor films 17 and 99 and between the oxide semiconductor films 17 and 97, so that a mixed layer is formed.

As shown in FIG. 22C, the oxide semiconductor film 17 in the multilayer film 98 serves as a well and a channel region of the transistor including the multilayer film 98 is formed in the oxide semiconductor film 17. Note that since the energy of the conduction band minimum of the multilayer film 98 is continuously changed, it can be said that the oxide semiconductor films 99, 17, and 97 are continuous.

Although trap levels due to impurities or defects might be generated in the vicinity of the interface between the multilayer film 98 and the oxide insulating film 23 and in the vicinity of the interface between multilayer film 98 and the gate insulating film 15, as illustrated in FIG. 22C, the oxide semiconductor film 17 can be distanced from the region where the trap levels are generated owing to the existence of the oxide semiconductor films 97 and 99. However, when the energy difference between EcS1 and EcS2 and the energy difference between EcS1 and EcS3 are small, electrons in the oxide semiconductor film 17 might reach the trap level across the energy difference. When the electrons are captured by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because change in the threshold voltage of the transistor is reduced and stable electrical characteristics are obtained.

Note that the structures, methods, and the like described in this embodiment can be used as appropriate in combination with any of the structures, methods, and the like described in the other embodiments.

(Embodiment 6)

In this embodiment, one embodiment that can be applied to an oxide semiconductor film in the transistor included in the semiconductor device described in the above embodiment is described.

It is preferable that the oxide semiconductor film include a CAAC-OS film. The CAAC-OS film includes crystals whose c-axes are aligned; however, no grain boundary between the crystals is clearly observed. The crystals whose c-axes are aligned are less likely to be etched, so that in a channel-etched transistor, a small amount of an oxide semiconductor film is overetched when a pair of electrodes is formed. For this reason, with the use of a CAAC-OS film for the oxide semiconductor film, a channel-etched transistor can be manufactured. Note that a channel-etched transistor can have a structure in which the distance between a pair of electrodes, that is, a channel length, is as short as greater than or equal to 0.5 μm and less than or equal to 6.5 μm, preferably greater than 1 μm and less than 6 μm.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), and an oxide semiconductor having a microcrystalline structure (hereinafter referred to as a microcrystalline oxide semiconductor). Described below are the CAAC-OS, the single-crystal oxide semiconductor, the polycrystalline oxide semiconductor, and the microcrystalline oxide semiconductor.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC-OS film is greater than or equal to 2500 nm$^2$, preferably greater than or equal to 5 μm$^2$, further preferably greater than or equal to 1000 μm$^2$. Furthermore, in a cross-sectional TEM image, when the proportion of the crystal parts is greater than or equal to 50%, preferably greater than or equal to 80%, further preferably greater than or equal to 95% of the CAAC-OS film, the CAAC-OS film is a thin film having physical properties similar to those of a single crystal.

In a transmission electron microscope (EEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is assigned to the (00x) plane (x is an integer) of an InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is assigned to the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are assigned to crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal is formed concurrently with deposition of the CAAC-OS film or is formed through crystallization treatment such as heat treatment. As described above, the c-axis of the crystal is aligned to a direction parallel to a normal vector of a formation surface of the CAAC-OS film or a normal vector of a top surface. Thus, for example, in the case where a shape of the CAAC-OS film is changed by etching or the like, the c-axis of the crystal might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a reduction in crystallinity. Further, a heavy metal such as iron or nickel, argon, carbon dioxide, or the like has a large atomic radius (or molecular radius), and thus disturbs the atomic arrangement of the oxide semiconductor film and causes a reduction in crystallinity when it is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, an oxygen vacancy in the oxide semiconductor film serves as a carrier trap or a carrier generation source in some cases when hydrogen is captured therein.

The state in which the impurity concentration is low and the density of defect states is low (few oxygen vacancies) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variations in the electrical characteristics of the transistor due to irradiation with visible light or ultraviolet light are small.

<Single Crystal Oxide Semiconductor>

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

<Polycrystalline Oxide Semiconductor>

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a grain boundary can be found in the polycrystalline oxide semiconductor film in some cases.

The polycrystalline oxide semiconductor film may include a plurality of crystal grains, and alignment of crystals may be different in the plurality of crystal grains. When the polycrystalline oxide semiconductor film is analyzed by, for example, an out-of-plane method with an XRD apparatus, one or plural peaks appear in some cases. For example, in the case of a polycrystalline IGZO film, a peak at 2θ of around 31° that shows alignment or plural peaks that show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the boundary in the polycrystalline oxide semiconductor film. Moreover, the boundary of the polycrystalline oxide semiconductor film serves as a defect state. Since the boundary of the polycrystalline oxide semiconductor film may serve as a carrier generation source or a trap level, a transistor including the polycrystalline oxide semiconductor film has larger variation in electrical characteristics and lower reliability than a transistor including a CAAC-OS film in some cases.

<Microcrystalline Oxide Semiconductor>

In an image obtained with a TEM, crystal parts cannot be found clearly in the microcrystalline oxide semiconductor in some cases. In most cases, the size of a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film obtained with a TEM, for example, a grain boundary cannot be observed clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is observed when the nc-OS film is subjected to electron diffraction (also referred to as selected-area electron diffraction) using an electron beam having a diameter (e.g., larger than or equal to 50 nm) larger than the diameter of a crystal part. Meanwhile, spots are observed when the nc-OS film is subjected to nanobeam electron diffraction using an electron beam having a diameter (e.g., larger than or equal to 1 nm and smaller than or equal to 30 nm) close to, or smaller than or equal to the diameter of a crystal part. In some cases, when the nc-OS film is subjected to nanobeam electron diffraction, regions with high luminance in a circular (ring) pattern are observed, or a plurality of spots are shown in a ring-like region.

Since an nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than a CAAC-OS film.

Note that the structures, methods, and the like described in this embodiment can be used as appropriate in combination with any of the structures, methods, and the like described in the other embodiments.

(Embodiment 7)

In the method for manufacturing any of the transistors described in Embodiments 1 to 6, after the pair of electrodes 19 and 20 is formed over the oxide semiconductor film 17, the oxide semiconductor film 17 may be exposed to plasma generated in an oxidizing atmosphere to be supplied with oxygen. Atmospheres of oxygen, ozone, dinitrogen monoxide, nitrogen dioxide, and the like can be given as examples of oxidizing atmospheres. Further, in the plasma treatment, the oxide semiconductor film 17 is preferably exposed to plasma generated with no bias applied to the substrate 11 side. Consequently, the oxide semiconductor film 17 can be supplied with oxygen without being damaged; accordingly, oxygen vacancies in the oxide semiconductor film 17 can be reduced. Moreover, impurities, e.g., halogen such as fluorine or chlorine remaining on a surface of the oxide semiconductor film 17 due to the etching treatment can be removed. The plasma treatment is preferably performed while heating is performed at a temperature higher than or equal to 300° C. Oxygen in the plasma is bonded to hydrogen contained in the oxide semiconductor film 17 to form water. Since the substrate is heated, the water is released from the oxide semiconductor film 17. Consequently, the amount of hydrogen and water in the oxide semiconductor film 17 can be reduced.

Note that the structures, methods, and the like described in this embodiment can be used as appropriate in combination with any of the structures, methods, and the like described in the other embodiments.

(Embodiment 8)

Although the oxide semiconductor film described in the above embodiment can be formed by sputtering, such a film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film that are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas that is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Note that the structures, methods, and the like described in this embodiment can be used as appropriate in combination with any of the structures, methods, and the like described in the other embodiments.

(Embodiment 9)

In this embodiment, a semiconductor device that is one embodiment of the present invention is described with reference to drawings. Note that in this embodiment, a display device is described as an example of a semiconductor device of one embodiment of the present invention.

Figure 23A:
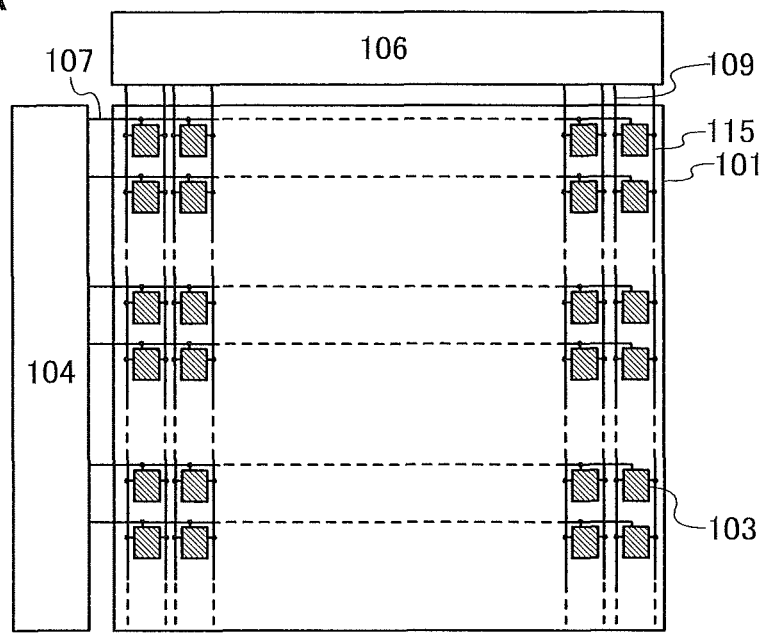
FIG. 23A is a block diagram illustrating one embodiment of a semiconductor device and FIGS. 23B and 23C are circuit diagrams each illustrating one embodiment of a semiconductor device.

FIG. 23A illustrates an example of a semiconductor device. The semiconductor device in FIG. 23A includes a pixel portion 101, a scan line driver circuit 104, a signal line driver circuit 106, m scan lines 107 that are arranged in parallel or substantially in parallel and whose potentials are controlled by the scan line driver circuit 104, and n signal lines 109 that are arranged in parallel or substantially in parallel and whose potentials are controlled by the signal line driver circuit 106. Further, the pixel portion 101 includes a plurality of pixels 103 arranged in a matrix. Furthermore, capacitor lines 115 arranged in parallel or substantially in parallel are provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Each of the scan lines 107 is electrically connected to the pixels 103 in the corresponding row among the pixels 103 arranged in m rows and n columns in the pixel portion 101. Each of the signal lines 109 is electrically connected to the in pixels 103 in the corresponding column among the pixels 103 arranged in m rows and n columns. Note that m and n are each an integer of 1 or more. Each of the capacitor lines 115 is electrically connected to the n pixels 103 in the corresponding row among the pixels 103 arranged in m rows and n columns. Note that in the case where the capacitor lines 115 are arranged in parallel or substantially in parallel along the signal lines 109, each of the capacitor lines 115 is electrically connected to the in pixels 103 in the corresponding column among the pixels 103 arranged in m rows and n columns.

Figure 23B:
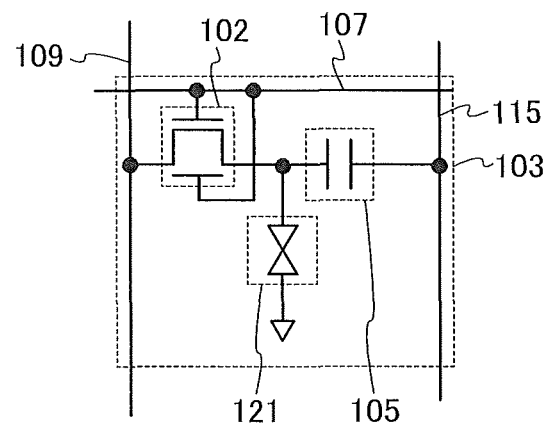
Figure 23C:
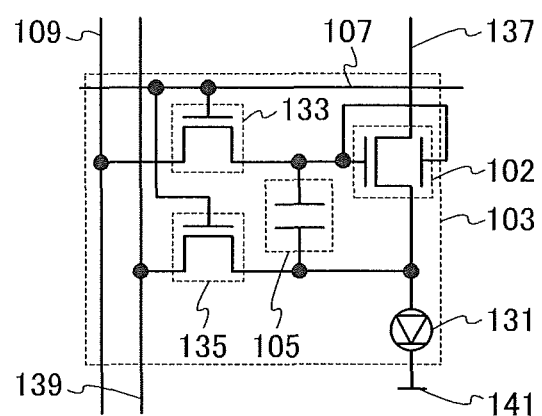

FIGS. 23B and 23C each illustrate an example of a circuit configuration that can be used for the pixels 103 in the display device illustrated in FIG. 23A.

The pixel 103 illustrated in FIG. 23B includes a liquid crystal element 121, a transistor 102, and a capacitor 105.

The potential of one of a pair of electrodes of the liquid crystal element 121 is set according to the specifications of the pixels 103 as appropriate. The alignment state of the liquid crystal element 121 depends on written data. A common potential may be applied to one of the pair of electrodes of the liquid crystal element 121 included in each of the plurality of pixels 103. Further, the potential supplied to one of a pair of electrodes of the liquid crystal element 121 in the pixel 103 in one row may be different from the potential supplied to one of a pair of electrodes of the liquid crystal element 121 in the pixel 103 in another row.

The liquid crystal element 121 is an element that controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). Note that the following can be used for the liquid crystal element 121: a nematic liquid crystal, a cholesteric liquid crystal, a smectic liquid crystal, a thermotropic liquid crystal, a lyotropic liquid crystal, a ferroelectric liquid crystal, an anti-ferroelectric liquid crystal, and the like.

As examples of a driving method of the display device including the liquid crystal element 121, any of the following modes can be given: a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, a transverse bend aligmnent (IBA) mode, and the like. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 103 illustrated in FIG. 23B, one of a source electrode and a drain electrode of the transistor 102 is electrically connected to the signal line 109, and the other is electrically connected to the other of the pair of electrodes of the liquid crystal element 121. A gate electrode of the transistor 102 is electrically connected to the scan line 107. The transistor 102 has a function of controlling whether to write a data signal by being turned on or off. Note that the transistor described in any of Embodiments 1 to 8 can be used as the transistor 102.

In the pixel 103 illustrated in FIG. 23B, one of a pair of electrodes of the capacitor 105 is electrically connected to the capacitor line 115 to which a potential is supplied, and the other is electrically connected to the other of the pair of electrodes of the liquid crystal element 121. The potential of the capacitor line 115 is set in accordance with the specifications of the pixel 103 as appropriate. The capacitor 105 serves as a storage capacitor for storing written data.

For example, in the display device including the pixel 103 in FIG. 23B, the pixels 103 are sequentially selected row by row by the scan line driver circuit 104, whereby the transistors 102 are turned on and a data signal is written.

When the transistors 102 is turned off, the pixels 103 in which the data have been written are brought into a holding state. This operation is sequentially performed row by row; thus, an image is displayed.

The pixel 103 illustrated in FIG. 23C includes a transistor 133 for switching a display element, the transistor 102 for controlling driving of a pixel, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to the scan line 107 to which a gate signal is supplied.

The transistor 133 has a function of controlling whether to write data of a data signal by being turned on or off.

One of source and drain electrodes of the transistor 102 is electrically connected to a wiring 137 serving as an anode line. The other of the source and drain electrodes of the transistor 102 is electrically connected to one of electrodes of the light-emitting element 131. A gate electrode of the transistor 102 is electrically connected to the other of the source and drain electrodes of the transistor 133 and one of electrodes of the capacitor 105.

The transistor 102 has a function of controlling current flowing in the light-emitting element 131 by being turned on or off. Note that the transistor described in any of Embodiments 1 to 8 can be used as the transistor 102.

Note that the luminance of an EL element included in a light-emitting device is proportional to the amount of current flowing in a transistor that controls the operation of the EL element. The dual-gate driving transistors described in Embodiments 1 to 8 have stable drain current $I_d$ in a saturation region in addition to high on-state current and high field-effect mobility. Accordingly, the use of a dual-gate driving transistor as the transistor 102 for driving the EL element can increase the luminance of the EL element. In addition, the use of a dual-gate driving transistor as the transistor 102 for driving the EL element can reduce the fluctuations in the luminance of the EL element due to the fluctuations in drain voltage.

One of source and drain electrodes of the transistor 135 is connected to a wiring 139 to which a data reference potential is supplied. The other of the source and drain electrodes of the transistor 135 is electrically connected to the one of the electrodes of the light-emitting element 131 and the other of the electrodes of the capacitor 105. A gate electrode of the transistor 135 is electrically connected to a scan line 107 to which a gate signal is supplied.

The transistor 135 has a function of controlling current flowing in the light-emitting element 131. For example, in the case where internal resistance of the light-emitting element 131 is increased by degradation or the like, by monitoring current flowing in the wiring 139 that is connected to the one of the source and drain electrodes of the transistor 135, current flowing in the light-emitting element 131 can be corrected. A potential that is supplied to the wiring 139 can be 0 V, for example.

The one of the electrodes of the capacitor 105 is electrically connected to the gate electrode of the transistor 102 and the other of the source and drain electrodes of the transistor 133. The other of the electrodes of the capacitor 105 is electrically connected to the other of the source and drain electrodes of the transistor 135 and the one of the electrodes of the light-emitting element 131.

In the configuration of the pixel 103 in FIG. 23C, the capacitor 105 serves as a storage capacitor storing written data.

The one of the electrodes of the light-emitting element 131 is electrically connected to the other of the source and drain electrodes of the transistor 135, the other of the electrodes of the capacitor 105, and the other of the source and drain electrodes of the transistor 102. The other of the electrodes of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to organic EL elements; an inorganic EL element including an inorganic material can be used.

A high power supply potential VDD is supplied to one of the wirings 137 and 141, and a low power supply potential VSS is supplied to the other. In the configuration illustrated in FIG. 23C, a high power supply potential VDD is supplied to the wiring 137 and a low power supply potential VSS is supplied to the wiring 141.

In the display device including the pixel 103 in FIG. 23C, the pixels 103 are sequentially selected row by row by the scan line driver circuit 104, whereby transistors 133 are turned on and a data signal is written.

When the transistor 133 is turned off, the pixel 103 in which the data have been written is brought into a holding state. The transistor 133 is connected to the capacitor 105, and thus written data can be stored for a long period. The amount of current flowing between the source and drain electrodes of the transistor 102 is controlled by the transistor 133. The light-emitting element 131 emits light with a luminance corresponding to the amount of flowing current. This operation is sequentially performed row by row; thus, an image is displayed.

Figure 24A:
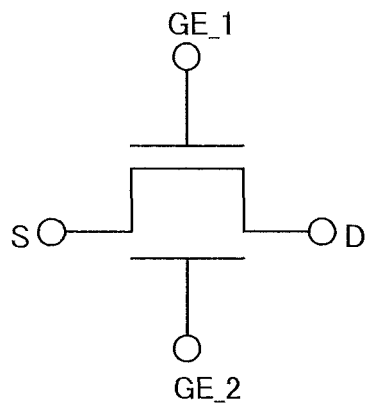
FIGS. 24A to 24E illustrate circuit symbols and structures of a transistor.

FIG. 24A illustrates a circuit symbol of the transistor 102 in the circuit diagrams illustrated in FIGS. 23B and 23C. Note that in the circuit symbol in FIG. 24A, a pair of gate electrodes, a source electrode, and a drain electrode are represented by GE_1 and GE_2, S, and D, respectively. In the circuit symbol in FIG. 24A, the positional relation between the gate electrode 91 and the pair of electrodes 19 and 20 serving as a source electrode and a drain electrode is not limited.

Figure 24B:
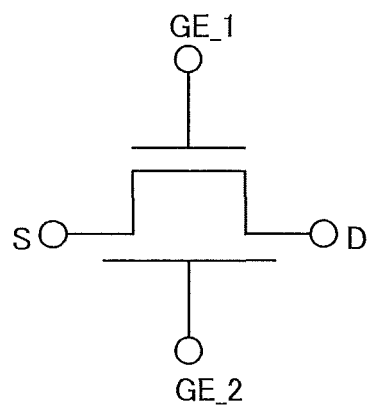

FIG. 24B illustrates a circuit symbol of the transistor 102 in the case where the pair of electrodes 19 and 20 serving as a source electrode and a drain electrode partly overlaps with the gate electrode 91 over the oxide semiconductor film 17. In the circuit symbol in FIG. 24B, as in the circuit symbol in FIG. 24A, a pair of gate electrodes, a source electrode, and a drain electrode are represented by GE_1 and GE_2, S, and D, respectively.

Figure 24C:
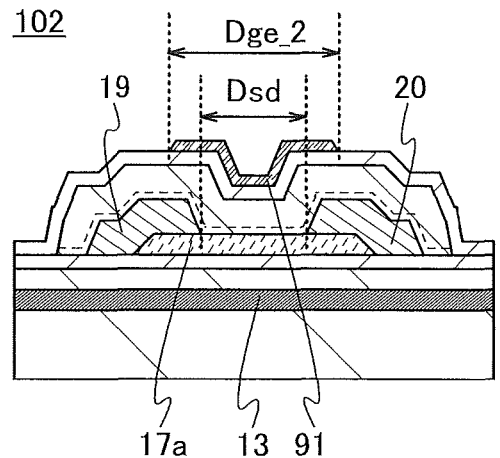

FIG. 24C illustrates an example of a cross-sectional view of the transistor 102 that corresponds to the circuit symbol in FIG. 24B. In the channel length direction of the transistor 102 illustrated in FIG. 24C, a distance Dsd between the electrode 19 and the electrode 20 is shorter than a distance Dge_2 between the opposite end portions of the gate electrode 91. Furthermore, in the cross-sectional view in the channel length direction, the end portions of the gate electrode 91 overlap with the pair of electrodes 19 and 20.

Figure 24D:
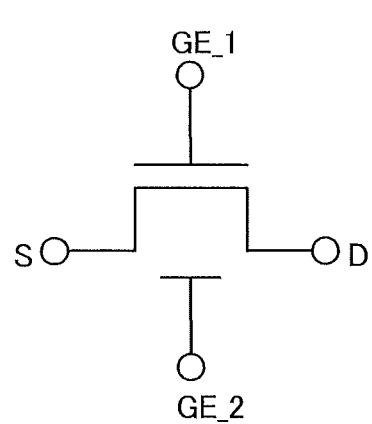

FIG. 24D illustrates a circuit symbol of the transistor 102 in the case where the pair of electrodes 19 and 20 serving as a source electrode and a drain electrode does not overlap with the gate electrode 91 over the oxide semiconductor film 17. In the circuit symbol in FIG. 24D, as in the circuit symbol in FIG. 24A, a pair of gate electrodes, a source electrode, and a drain electrode are represented by GE_1 and GE_2, S, and D, respectively.

Figure 24E:
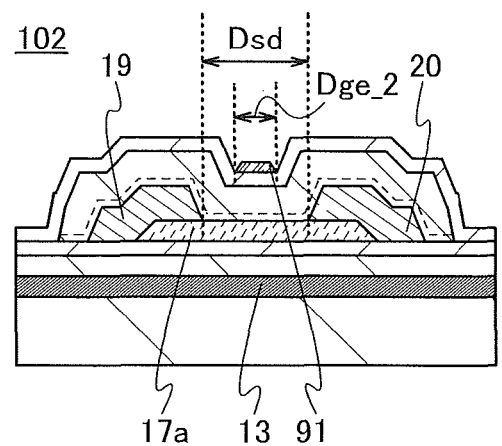

FIG. 24E illustrates an example of a cross-sectional view of the transistor 102 that corresponds to the circuit symbol in FIG. 24D. In the channel length direction of the transistor 102 illustrated in FIG. 24E, a distance Dsd between the electrode 19 and the electrode 20 is longer than a distance Dge_2 between the opposite end portions of the gate electrode 91. Furthermore, in the cross-sectional view in the channel length direction, the end portions of the gate electrode 91 do not overlap with the pair of electrodes 19 and 20.

In the drawings attached to this specification, the circuit symbol in FIG. 24A can represent the transistor 102 having a structure represented by the circuit symbol in FIG. 24B and the transistor 102 having a structure represented by the circuit symbol in FIG. 24D.

Figure 25:
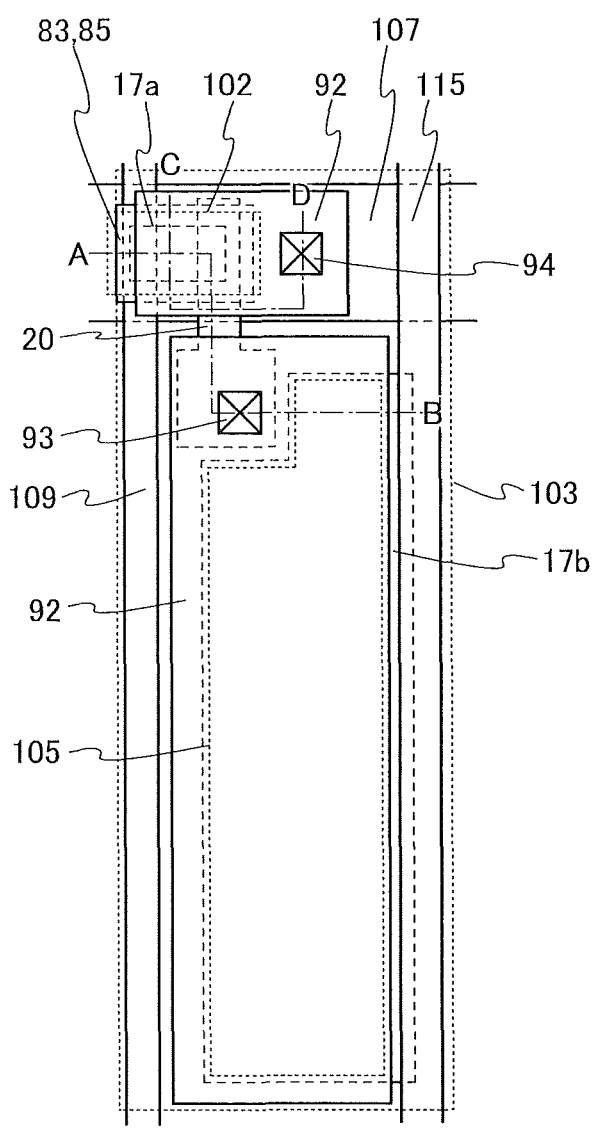
FIG. 25 is a top view illustrating one embodiment of a semiconductor device.

Next, a specific configuration of an element substrate included in the display device is described. Here, a specific example of a liquid crystal display device including a liquid crystal element in the pixel 103 is described. FIG. 25 is a top view of the pixel 103 illustrated in FIG. 23B.

In the FIG. 25, the scan line 107 extends in a direction substantially perpendicular to the signal line 109. The capacitor line 115 extends in a direction parallel to the signal line 109. Note that the scan line 107 is electrically connected to the scan line driver circuit 104 (see FIG. 23A), and the signal line 109 and the capacitor line 115 are electrically connected to the signal line driver circuit 106 (see FIG. 23A).

The transistor 102 is provided in a region where the scan line 107 and the signal line 109 cross each other. The transistor 102 can have a structure similar to that of the transistor 80 described in Embodiment 2. Note that a region of the scan line 107 which overlaps with an oxide semiconductor film 17a functions as the gate electrode of the transistor 102, which is represented as the gate electrode 13 in FIG. 26, FIGS. 27A to 27D, and FIGS. 28A to 28C. Furthermore, a region of the signal line 109 which overlaps with the oxide semiconductor film 17a functions as the source electrode or the drain electrode of the transistor 102, which is represented as the electrode 19 in FIG. 26, FIGS. 27A to 27D, and FIGS. 28A to 28C. In addition, in FIG. 25, the whole of the oxide semiconductor film 17a overlaps the scan line 107 when seen from the above. Thus, the scan line 107 functions as a light-blocking film for blocking light from a light source such as a backlight. For this reason, the oxide semiconductor film 17a included in the transistor is not irradiated with light, so that a variation in the electrical characteristics of the transistor can be suppressed.

The electrode 20 is connected to the electrode 92 in the opening portion 93. The electrode 92 is formed using a light-transmitting conductive film and functions as a pixel electrode.

The capacitor 105 is connected to the capacitor line 115. The capacitor 105 is formed using a film 17b having conductivity (also referred to as an oxide conductor film) formed over a gate insulating film, a dielectric film provided over the transistor 102, and the electrode 92. The dielectric film is formed of a nitride insulating film. The film 17b having conductivity, the nitride insulating film, and the electrode 92 each have a light-transmitting property; therefore, the capacitor 105 has a light-transmitting property.

Thanks to the light-transmitting property of the capacitor 105, the capacitor 105 can be formed large (covers a large area) in the pixel 103. Thus, a semiconductor device having charge capacity increased while improving the aperture ratio, for example, to 50% or more, preferably 55% or more, further preferably 60% or more can be obtained. For example, in a semiconductor device with high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. As a typical example, the capacitor 105 can be favorably used in a high-resolution semiconductor device with a pixel density of 200 ppi or more, 300 ppi or more, or 500 ppi or more.

Further, according to one embodiment of the present invention, the aperture ratio can be improved even in a display device with high resolution, which makes it possible to use light from a light source such as a backlight efficiently, so that power consumption of the display device can be reduced.

Figure 26:
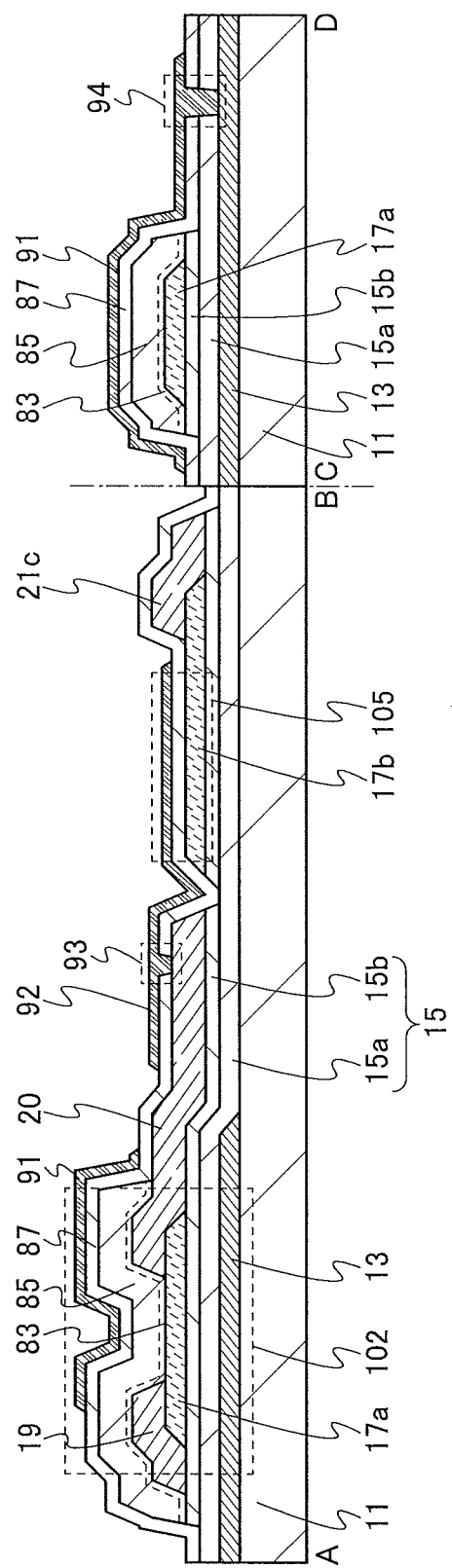
FIG. 26 is a cross-sectional view illustrating one embodiment of a semiconductor device.

Next, FIG. 26 is a cross-sectional view along dashed dotted lines A-B and C-D in FIG. 25. Note that the cross-sectional view along the dashed dotted line A-B shows a cross section of the transistor 102 in the channel length direction, a cross section of a connection portion between the transistor 102 and the electrode 92 functioning as a pixel electrode, and a cross section of a capacitor 105; the cross-sectional view along the dashed dotted line C-D shows a cross section of the transistor 102 in the channel width direction and a cross section of a connection portion between the gate electrode 13 and the gate electrode 91.

The transistor 102 illustrated in FIG. 26 is a channel-etched transistor, including the gate electrode 13 provided over the substrate 11, the gate insulating film 15 formed over the substrate 11 and the gate electrode 13, the oxide semiconductor film 17a overlapping the gate electrode 13 with the gate insulating film 15 positioned therebetween, and the pair of electrodes 19 and 20 in contact with the oxide semiconductor film 17a. The oxide insulating film 83 is formed over the gate insulating film 15, the oxide semiconductor film 17a, and the pair of electrodes 19 and 20, and the oxide insulating film 85 is formed over the oxide insulating film 83. The nitride insulating film 87 is formed over the gate insulating film 15, the oxide semiconductor film 17a, the oxide insulating film 83, the oxide insulating film 85, and the electrodes 19 and 20. The electrode 92 and the gate electrode 91 that are in contact with one of the pair of electrodes 19 and 20 (here, the electrode 20) are formed over the nitride insulating film 87. Note that the electrode 92 serves as a pixel electrode.

The gate insulating film 15 includes the nitride insulating film 15a and the oxide insulating film 15b. The oxide insulating film 15b is formed in a region overlapping with the oxide semiconductor film 17a, the pair of electrodes 19 and 20, or the oxide insulating film 83.

As shown in the cross-sectional view along the line C-D, the gate electrode 91 is connected to the gate electrode 13 in the opening portion 94 provided in the nitride insulating film 15a and the nitride insulating film 87. That is, the gate electrode 13 has the same potential as the gate electrode 91.

The oxide insulating film 83 and the oxide insulating film 85 which are isolated from each other are formed over the transistor 102 described in this embodiment. The isolated oxide insulating films 83 and 85 overlap with the oxide semiconductor film 17a. In the cross-sectional view along the line C-D in the channel width direction, end portions of the oxide insulating film 83 and the oxide insulating film 85 are positioned on the outer side of the oxide semiconductor film 17a. In the channel width direction, on the outer side of each of one side surface and the other side surface of the oxide semiconductor film 17a, the gate electrode 91 and the side surface of the oxide semiconductor film 17a are provided so that the oxide insulating film 83, the oxide insulating film 85, and the nitride insulating film 87 are positioned therebetween. Furthermore, the nitride insulating film 87 is formed to cover the top surfaces and side surfaces of the oxide insulating film 83 and the oxide insulating film 85 and in contact with the nitride insulating film 15a.

In the transistor 102 described in this embodiment, the oxide semiconductor film 17a and the oxide insulating film 85 are surrounded by the nitride insulating film 15a and the nitride insulating film 87. The nitride insulating film 15a and the nitride insulating film 87 each have a small oxygen diffusion coefficient and have a barrier property against oxygen. Thus, part of oxygen contained in the oxide insulating film 85 can be moved to the oxide semiconductor film 17a, so that oxygen vacancies in the oxide semiconductor film 17a can be reduced. In addition, the nitride insulating film 15a and the nitride insulating film 87 each have a small diffusion coefficient of water, hydrogen, and the like and have a barrier property against water, hydrogen, and the like, which can prevent diffusion of water, hydrogen, and the like from the outside into the oxide semiconductor film 17a. For these reason, the transistor 102 has high reliability.

The capacitor 105 includes the film 17b having conductivity formed over the gate insulating film 15, the nitride insulating film 87, and the electrode 92. The film 17b having conductivity in the capacitor 105 is formed at the same time as the oxide semiconductor film 17a and has increased conductivity by containing an impurity. Alternatively, the film 17b having conductivity is formed at the same time as the oxide semiconductor film 17a and has increased conductivity by containing an impurity and including oxygen vacancy which is generated owing to plasma damage.

The oxide semiconductor film 17a and the film 17b having conductivity are formed over the gate insulating film 15 and have different impurity concentrations. Specifically, the film 17b having conductivity has a higher impurity concentration than the oxide semiconductor film 17a. For example, the concentration of hydrogen contained in the oxide semiconductor film 17a is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, yet still further preferably lower than or equal to $1 \times 10^{16}$ atoms/cm$^3$. The concentration of hydrogen contained in the film 17b having conductivity is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the film 17b having conductivity is greater than or equal to 2 times, preferably greater than or equal to 10 times that in the oxide semiconductor film 17a.

By exposing an oxide semiconductor film formed concurrently with the oxide semiconductor film 17a to plasma, the oxide semiconductor film can be damaged, so that an oxygen vacancy can be formed. For example, when a film is formed over the oxide semiconductor film by a plasma CVD method or a sputtering method, the oxide semiconductor film is exposed to plasma, thereby forming an oxygen vacancy. Alternatively, in etching process for forming the oxide insulating film 83 and the oxide insulating film 85, the oxide semiconductor film is exposed to plasma, thereby forming an oxygen vacancy. Further alternatively, the oxide semiconductor film is exposed to plasma of, for example, hydrogen, a rare gas, ammonia, a mixed gas of oxygen and hydrogen, thereby forming an oxygen vacancy. As a result, the conductivity of the oxide semiconductor film is increased, so that the oxide semiconductor film becomes the film 17b having conductivity.

That is, the film 17b having conductivity can also be referred to as an oxide semiconductor film having high conductivity. Furthermore, the film 17b having conductivity can also be referred to as a metal oxide film having high conductivity.

The nitride insulating film 87 contains hydrogen. When hydrogen in the nitride insulating film 87 is diffused into the oxide semiconductor film formed concurrently with the oxide semiconductor film 17a, hydrogen is bonded to oxygen and electrons serving as carriers are generated in the oxide semiconductor film. When the nitride insulating film 87 is formed by a plasma CVD method or a sputtering method, the oxide semiconductor film is exposed to plasma and oxygen vacancies are generated in the oxide semiconductor film. When hydrogen contained in the nitride insulating film 87 enters the oxygen vacancies, electrons serving as carriers are generated. As a result, the conductivity of the oxide semiconductor film is increased, so that the oxide semiconductor film becomes the film 17b having conductivity.

The film 17b having conductivity has lower resistivity than the oxide semiconductor film 17a. The resistivity of the film 17b having conductivity is preferably greater than or equal to $1 \times 10^{-8}$ times and less than $1 \times 10^{-1}$ times the resistivity of the oxide semiconductor film 17a; as a typical example, the resistivity of the film 17b having conductivity is greater than or equal to $1 \times 10^{-3}$ Ωcm and less than $1 \times 10^{4}$ Ωcm, preferably greater than or equal to $1 \times 10^{-3}$ Ωcm and less than $1 \times 10^{-1}$ Ωcm.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

Next, a method for manufacturing the transistor 102 and the capacitor 105 illustrated in FIG. 26 will be described with reference to FIGS. 27A to 27D and FIGS. 28A to 28C

As illustrated in FIG. 27A, the gate electrode 13 is formed over the substrate 11. The gate electrode 13 can be formed by a photolithography process using a first photomask.

Next, as illustrated in FIG. 27B, the nitride insulating film 14a to be the nitride insulating film 15a and the oxide insulating film 14b to be the oxide insulating film 15b are farmed over the gate electrode 13. Subsequently, the oxide semiconductor film 17a and an oxide semiconductor film 17c to be the film 17b having conductivity are formed over the oxide insulating film 14b. The oxide semiconductor films 17a and 17c can be formed by a photolithography process using a second photomask.

Then, as illustrated in FIG. 27C, the pair of electrodes 19 and 20 and a conductive film 21c serving as a capacitor line are formed. The pair of electrodes 19 and 20 and the conductive film 21c can be formed by a photolithography process using a third photomask.

After that, as illustrated in FIG. 27D, the oxide insulating films 83 and 85 are formed. The oxide insulating films 83 and 85 can be formed by a photolithography process using a fourth photomask.

As illustrated in the cross-sectional view along the line C-D in FIG. 27D, in the channel width direction, the oxide insulating films 83 and 85 are fainted so that side surfaces of the oxide insulating films 83 and 85 are positioned on outer sides of the side surfaces of the oxide semiconductor film 17a. Note that the oxide insulating film 14b is partly etched by etching for forming the oxide insulating film 83, so that the oxide insulating film 15b is formed. As a result, the nitride insulating film 14a is exposed. Furthermore, the oxide semiconductor film 17c is damaged by plasma in this etching step; thus, oxygen vacancies are formed in the oxide semiconductor film 17c.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

By the heat treatment, part of oxygen contained in the oxide insulating film 85 can be moved to the oxide semiconductor film 17a, so that oxygen vacancies in the oxide semiconductor film 17a can be repaired. Thus, oxygen vacancies contained in the oxide semiconductor film 17a can be further reduced.

Then, as illustrated in FIG. 28A, the nitride insulating film 26 to be the nitride insulating film 87 is formed.

The nitride insulating film 26 is formed by a sputtering method, a CVD method, or the like, so that the oxide semiconductor film 17c is exposed to plasma; thus, oxygen vacancies in the oxide semiconductor film 17c can be increased.

Through the step, the nitride insulating film 15a and the nitride insulating film 26 are in contact with each other so as to surround the oxide semiconductor film 17a, the oxide insulating film 83, and the oxide insulating film 85. In addition, the oxide semiconductor film 17c becomes the film 17b having conductivity. Note that in the case where a silicon nitride film is formed as the nitride insulating film 26 by a plasma CVD method, hydrogen contained in the silicon nitride film is diffused into the oxide semiconductor film 17c, which increases the conductivity.

Next, heat treatment may be performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C. Since the oxide semiconductor film 17a and the oxide insulating films 83 and 85 are provided in a region surrounded by the nitride insulating films 15a and 87 which are in contact with each other, the diffusion of oxygen from the oxide semiconductor film 17a and the oxide insulating films 83 and 85 to the outside can be prevented.

Next, a mask is formed over the nitride insulating film 26 by a photolithography process using a fifth photomask. Then, the nitride insulating film 14a and the nitride insulating film 26 are etched using the mask to form the nitride insulating film 87 having the opening portions 93 and 94 and the nitride insulating film 15a having the opening portion 94 as illustrated in FIG. 28B.

After that, the gate electrode 91 and the electrode 92 serving as a pixel electrode are formed as illustrated in FIG. 28C. Note that the gate electrode 91 and the electrode 92 serving as a pixel electrode can be formed by a photolithography process using a sixth photomask. Accordingly, the electrode 20 and the electrode 92 are connected to each other through the opening portion 93. In addition, the gate electrode 13 and the gate electrode 91 are connected to each other through the opening portion 94.

Through the above process, the transistor 102 illustrated in FIG. 26 can be manufactured and the capacitor 105 can also be manufactured.

In the transistor described in this embodiment, the oxide semiconductor film 17a and the oxide insulating films 83 and 85 are surrounded by the nitride insulating film 15a and the nitride insulating film 87. At least one of the oxide insulating films 83 and 85 is formed using an oxide insulating film which contains more oxygen than that in the stoichiometric composition. Thus, the nitride insulating film 15a and the nitride insulating film 87 can prevent oxygen contained in the oxide insulating film 83 or the oxide insulating film 85 from moving to the outside. As a result, oxygen contained in the oxide insulating film 83 or the oxide insulating film 85 can be moved to the oxide semiconductor film 17a efficiently, and oxygen vacancies in the oxide semiconductor film can be reduced.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

From the above, a semiconductor device which includes an oxide semiconductor film and has improved electrical characteristics can be obtained.

Note that the structures, methods, and the like described in this embodiment can be used as appropriate in combination with any of the structures, methods, and the like described in the other embodiments.

(Embodiment 10)

A semiconductor device (also referred to as a display device) having a display function can be manufactured using the transistor examples of which are shown in the above embodiments. Moreover, some or all of the driver circuits that include the transistor can be formed over a substrate where the pixel portion is formed, whereby a system-on-panel can be obtained. In this embodiment, an example of a display device using the transistor examples of which are shown in the above embodiments is described with reference to FIGS. 29A to 29C and FIGS. 30A and 30B. FIGS. 30A and 30B are cross-sectional views illustrating cross-sectional structures taken along dashed-dotted line M-N in FIG. 19B.

Figure 29A:
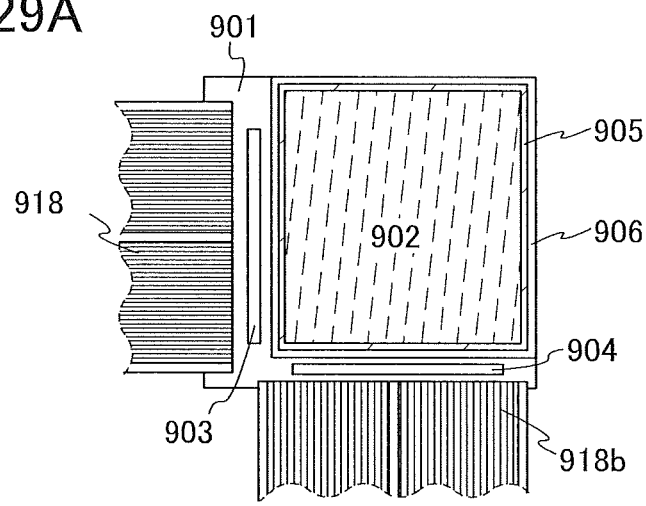
FIGS. 29A to 29C are top views each illustrating one embodiment of a semiconductor device.

In FIG. 29A, a sealant 905 is provided so as to surround a pixel portion 902 provided over a first substrate 901, and the pixel portion 902 is sealed with a second substrate 906. In FIG. 29A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuit (FPC) 918.

Figure 29B:
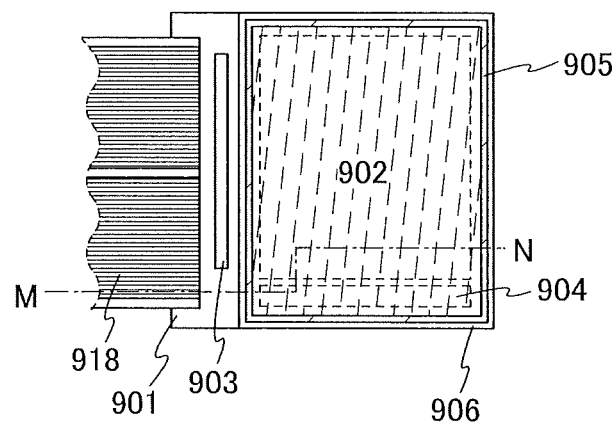
Figure 29C:
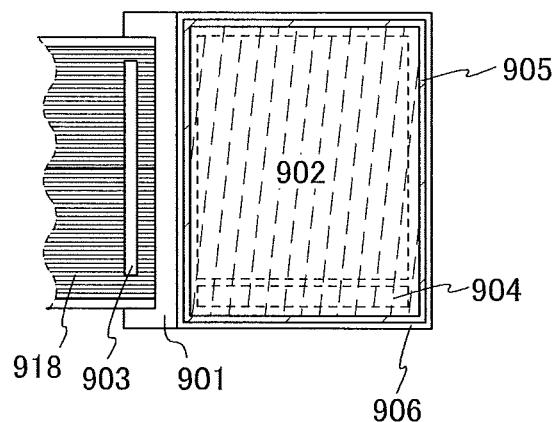

In FIGS. 29B and 29C, the sealant 905 is provided so as to surround the pixel portion 902 and the scan line driver circuit 904 that are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 29B and 29C, a signal line driver circuit 903 that is formed using a single crystal semiconductor or a polycrystalline semiconductor over a substrate separately prepared is mounted in a region different from the region surrounded by the sealant 905 over the first substrate 901. In FIGS. 29B and 29C, various signals and potentials are supplied to the signal line driver circuit 903, the scan line driver circuit 904, and the pixel portion 902 from an FPC 918.

Although FIGS. 29B and 29C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 29A shows an example in which the signal line driver circuit 903 and the scan line driver circuit 904 are mounted by a COG method. FIG. 29B shows an example in which the signal line driver circuit 903 is mounted by a COG method. FIG. 29C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device or a display device. Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors that are described in the above embodiments can be used. Any of the transistors described in the above embodiments can be applied to a buffer circuit included in the scan line driver circuit.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. FIG. 30A illustrates an example of a liquid crystal display device using a liquid crystal element as the display element and FIG. 30B illustrates an example of a light-emitting display device using a light-emitting element as the display element.

As illustrated in FIGS. 30A and 30B, the display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

Each of the pixel portion 902 and the scan line driver circuit 904 that are provided over the first substrate 901 includes a plurality of transistors. FIGS. 30A and 30B illustrate the transistor 910 included in the pixel portion 902 and the transistor 911 included in the scan line driver circuit 904. In FIG. 30A, an oxide insulating film 924 is provided over the transistor 910, and a nitride insulating film 927 is provided over the oxide insulating film 924. In FIG. 30B, a planarization film 921 is further provided over the nitride insulating film 927.

In this embodiment, any of the transistors described in Embodiments 1 to 9 is used as the transistors 910 and 911 as appropriate, whereby a display device with high image quality can be fabricated.

Moreover, FIGS. 30A and 30B each show an example in which a conductive film 917 is provided over the nitride insulating film 927 so as to overlap with a channel region of an oxide semiconductor film 926 of the transistor 911 for the driver circuit. In this embodiment, the conductive film 917 is formed using the conductive film that is used as the first electrode 930. By providing the conductive film 917 so as to overlap with the channel region of the oxide semiconductor film, the amount of change in the threshold voltage of the transistor 911 between before and after a BT stress test can be further reduced. The conductive film 917 preferably has the same potential as a gate electrode of the transistor 911 because the field-effect mobility of the transistor and the on-state current are increased, in which case the area of the scan line driver circuit 904 can be reduced, allowing the display device to have a narrow frame.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent change in electrical characteristics of the transistor due to the influence of an external electric field such as static electricity.

In the display panel, the transistor 910 included in the pixel portion 902 is electrically connected to a display element. There is no particular limitation on the kind of the display element as long as display can be performed, and various kinds of display elements can be used.

In FIG. 30A, a liquid crystal element 913 that is a display element includes the first electrode 930, a second electrode 931, and a liquid crystal layer 908. Note that an insulating film 932 and an insulating film 933 that serve as alignment films are provided so that the liquid crystal layer 908 is provided therebetween. The second electrode 931 is provided on, the second substrate 906 side. The second electrode 931 overlaps with the first electrode 930 with the liquid crystal layer 908 provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition that includes a liquid crystal showing a blue phase and a chiral material has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by a sealant 925. As the sealant 925, an organic resin such as a thermosetting resin or a photocurable resin can be used.

Furthermore, the transistor including an oxide semiconductor film used in the above embodiments has excellent switching characteristics. In addition, relatively high field-effect mobility is obtained, which enables high-speed operation. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. One embodiment of the present invention is not limited to the application to a display device for color display but can also be applied to a display device for monochrome display.

In FIG. 30B, a light-emitting element 963 that is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, for example.

A partition wall 960 can be formed using an organic insulating material or an inorganic insulating material. It is particularly preferable that the partition wall 960 be formed using a photosensitive resin material to have an opening portion over the first electrode 930 so that a sidewall of the opening portion has an inclined surface with a continuous curvature.

The light-emitting layer 961 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space that is sealed with the first substrate 901, the second substrate 906, and a sealant 936, a filler 964 is provided and sealed. It is preferable that, in this manner, the light-emitting element be packaged (sealed) with a protective film (such as a laminate film or an ultraviolet curable resin film) or a cover material with high air-tightness and little degasification so that the light-emitting element is not exposed to the outside air.

As the sealant 936, an organic resin such as a thermosetting resin or a photocurable resin, fitted glass including low-melting glass, or the like can be used. The fritted glass is preferable because of its high barrier property against impurities such as water and oxygen. Further, in the case where the fritted glass is used as the sealant 936, as illustrated in FIG. 30B, the fitted glass is provided over the oxide insulating film 924, whereby adhesion of the oxide insulating film 924 to the fritted glass becomes high, which is preferable.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, a copolymer of two or more of aniline, pyrrole, and thiophene, and the like can be given.

Since the transistor is easily broken owing to static electricity or the like, a protective circuit for protecting the driver circuit is preferably provided. The protection circuit is preferably formed using a nonlinear element.

As described above, by using any of the transistors described in the above embodiments, a highly reliable semiconductor device having a display function can be provided.

Note that the structures, methods, and the like described in this embodiment can be used as appropriate in combination with any of the structures, methods, and the like described in the other embodiments and examples.

Example 1

In this example, examination results of the $I_d$-$V_g$ characteristics and the reliabilities of fabricated transistors will be described.

[Fabrication of Samples]

In this example, samples 1 and 2 each of which is one embodiment of the present invention, and a sample 3 for comparison were fabricated. Specifically, a transistor having the structure of the transistor 10 in FIGS. 1A to 1D in Embodiment 1 was fabricated as the sample 1 of one embodiment of the present invention. In addition, a transistor having the structure of the transistor 80 in FIGS. 16A to 16C in Embodiment 2 was fabricated as the sample 2 of one embodiment of the present invention. Furthermore, as the sample 3 for comparison, a transistor having a structure similar to that of the transistor 10 in FIGS. 1A to 1D in Embodiment 1, except that the gate electrode 31 was not included, was fabricated.

<Sample 1>

First, a glass substrate was used as the substrate 11, and the gate electrode 13 was formed over the substrate 11.

The gate electrode 13 was formed in the following manner: a 200-nm-thick tungsten film was formed by a sputtering method, a mask was formed over the tungsten film by a photolithography process, and the tungsten film was partly etched using the mask.

Next, the gate insulating film 15 was formed over the gate electrode 13.

As the gate insulating film 15, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to have a thickness of 50 nm under the following conditions: silane at a flow rate of 200 sccm, nitrogen at a flow rate of 2000 sccm, and an ammonia gas at a flow rate of 100 sccm were supplied to a reaction chamber of a plasma CVD apparatus as a source gas; the pressure in the reaction chamber was controlled to 100 Pa, and power of 2000 W was supplied with the use of a 27.12 MHz high-frequency power source. The second silicon nitride film was formed to have a thickness of 300 nm under the following conditions: silane at a flow rate of 200 sccm, nitrogen at a flow rate of 2000 sccm, and an ammonia gas at a flow rate of 2000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. The third silicon nitride film was formed to have a thickness of 50 nm under the following conditions: silane at a flow rate of 200 sccm and nitrogen at a flow rate of 5000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane at a flow rate of 20 sccm and dinitrogen monoxide at a flow rate of 3000 sccm were supplied to the reaction chamber of the plasma CVD apparatus as a source gas; the pressure in the reaction chamber was controlled to 40 Pa, and power of 100 W was supplied with the use of a 27.12 MHz high-frequency power source. Note that the silicon oxynitride film was formed at a substrate temperature of 350° C.

Next, the oxide semiconductor film 17 was formed to overlap with the gate electrode 13 with the gate insulating film 15 positioned therebetween.

Here, over the gate insulating film 15, the oxide semiconductor film 17 was formed to have a thickness of 35 nm by a sputtering method.

The oxide semiconductor film 17 was formed under the following conditions: a sputtering target containing In, Ga, and Zn at an atomic ratio of 1:1:1 was used; oxygen at a flow rate of 100 sccm was supplied as a sputtering gas into a reaction chamber of a sputtering apparatus; the pressure in the reaction chamber was controlled to 0.6 Pa; and direct-current power of 5 kW was supplied. Note that the oxide semiconductor film was formed at a substrate temperature of 170° C.

Next, the pair of electrodes 19 and 20 in contact with the oxide semiconductor film 17 was formed.

First, a conductive film was formed over the gate insulating film and the oxide semiconductor film. As the conductive film, a 400-nm-thick aluminum film was formed over a 50-nm-thick tungsten film, and a 200-nm-thick titanium film was formed over the aluminum film. Then, a mask was formed over the conductive film by a photolithography process, and the conductive film was partly etched using the mask. Through the above steps, the pair of electrodes 19 and 20 was formed.

Next, the substrate was transferred to a reaction chamber in a reduced pressure and heated at 350° C. Then, the oxide semiconductor film 17 was exposed to oxygen plasma that was generated in a dinitrogen monoxide atmosphere by supply of a high-frequency power of 150 W to an upper electrode in the reaction chamber with the use of a 27.12 MHz high-frequency power source.

After that, the gate insulating film 28 was formed over the oxide semiconductor film 17 and the pair of electrodes 19 and 20. In this case, the gate insulating film 28 was formed to have a three-layer structure of a first oxide insulating film, a second oxide insulating film, and a nitride insulating film.

The first oxide insulating film was formed by a plasma CVD method under the following conditions: silane at a flow rate of 20 sccm and dinitrogen monoxide at a flow rate of 3000 sccm were used as a source gas; the pressure in the reaction chamber was 200 Pa; the substrate temperature was 350° C.; and high-frequency power of 100 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the reaction chamber was 200 Pa, the substrate temperature was 220° C., and high-frequency power of 1500 W was supplied to the parallel-plate electrodes. Under the above conditions, it is possible to form a silicon oxynitride film which contains oxygen at a higher proportion than the stoichiometric composition so that part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas, the pressure in the reaction chamber was 100 Pa, the substrate temperature was 350° C., and high-frequency power of 1000 W was supplied to the parallel-plate electrodes.

Subsequently, in a region where the oxide semiconductor film 17 and the pair of electrodes 19 and 20 were not provided, an opening portion that reaches the gate electrode 13 was formed in the gate insulating films 15 and 28. The opening portion was formed in the following manner: a mask was formed over the gate insulating film 28 by a photolithography process, and the gate insulating films 15 and 28 were partly etched using the mask.

After that, the gate electrode 31 was formed over the gate insulating film 28. The gate electrode 31 was electrically connected to the gate electrode 13 through the opening portion provided in the gate insulating films 15 and 28.

Here, as the gate electrode 31, a 100-nm-thick conductive film of an indium oxide-tin oxide compound (ITO—$SiO_2$) containing silicon oxide was formed by a sputtering method. Note that the composition of a target used for forming the conductive film was $In_2O_3$:$SnO_2$:$SiO_2$=85:10:5 [wt %]. After that, heat treatment was performed at 250° C. in a nitrogen atmosphere for one hour.

Through the above process, the sample 1 of this example was fabricated.

<Sample 2>

The sample 2 includes a gate insulating film and a gate electrode having structures different from those in the sample 1. Specifically, as illustrated in FIG. 16C, the sample 2 has a structure in which the gate electrode 31 covers side surfaces of a first oxide insulating film and a second oxide insulating film in the channel width direction of the transistor.

In the fabrication process of the sample 2, the first oxide insulating film and the second oxide insulating film were formed, heat treatment was performed, and then a mask was formed over the second oxide insulating film by a photolithography process. Subsequently, the first oxide insulating film and the second oxide insulating film were partly etched using the mask. Other steps of fabricating the sample 2 are similar to those for fabricating the sample 1; thus, the descriptions for the sample 1 can be referred to.

<Sample 3>

The sample 3 for comparison is different from the sample 1 in that the gate electrode 31 is not included.

The sample 3 was fabricated using the above-described fabrication process of the sample 1, excluding the step of forming the gate electrode 31. Other steps of fabricating the sample 3 are similar to those for fabricating the sample 1; thus, the descriptions for the sample 1 can be referred to.

Note that as each of the samples 1 to 3, three kinds of transistors were fabricated in which channel widths W were 50 μm and channel lengths L were 2 μm, 3 μm, and 6 μm.

<$I_d$-$V_g$ Characteristics>

Next, the initial $I_d$-$V_g$ characteristics of the samples 1 to 3 used as transistors were measured. Here, changes in current flowing between a source electrode and a drain electrode (hereinafter referred to as drain current: $I_d$), that is, $I_d$-$V_g$ characteristics were measured under the following conditions: the substrate temperature was 25° C., the potential difference between the source and drain electrodes (hereinafter referred to as drain voltage: $V_d$) was 1 V or 10 V, and the potential difference between the source and the gate electrodes (hereinafter referred to as gate voltage: $V_g$) was changed from −15 V to 15 V.

Here, the sample 1 and the sample 2 were driven by a method in which gate voltage is applied in a state where the gate electrode 13 and the gate electrode 31 are electrically short-circuited. Such a driving method is called dual-gate driving. In the dual-gate driving, the gate electrode 13 always has the same gate voltage as the gate electrode 31.

Figure 31A:
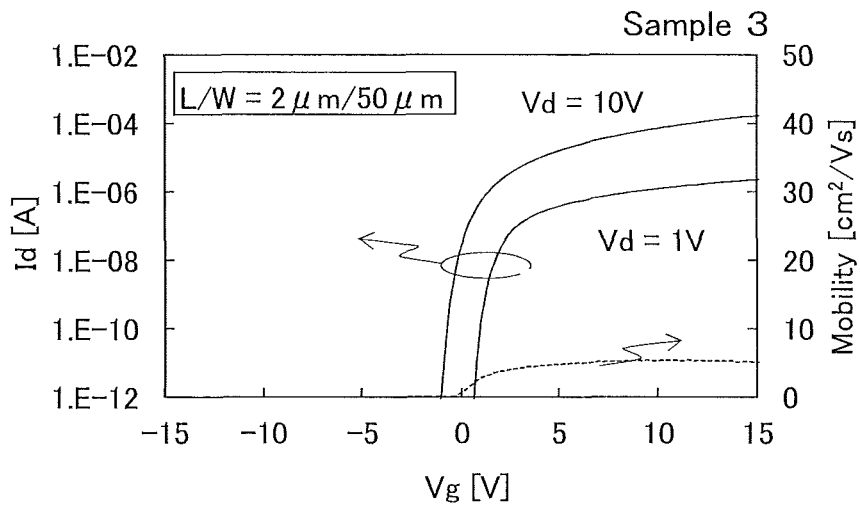
FIGS. 31A to 31C each show $I_d$-$V_g$ characteristics of a transistor of Example.
Figure 31B:
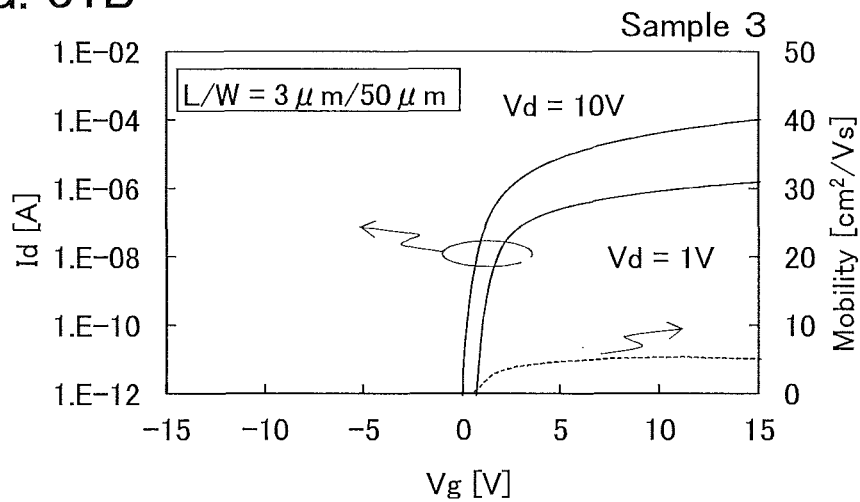
Figure 31C:
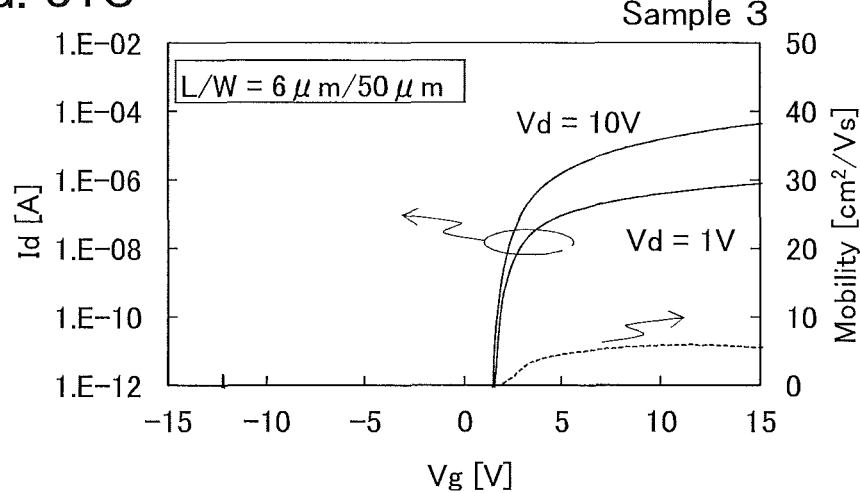
Figure 32A:
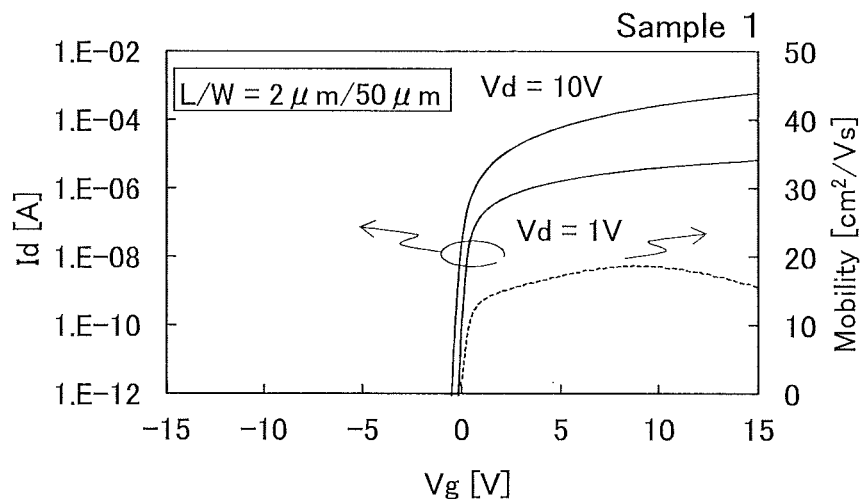
FIGS. 32A to 32C each show $I_d$-$V_g$ characteristics of a transistor of Example.
Figure 32B:
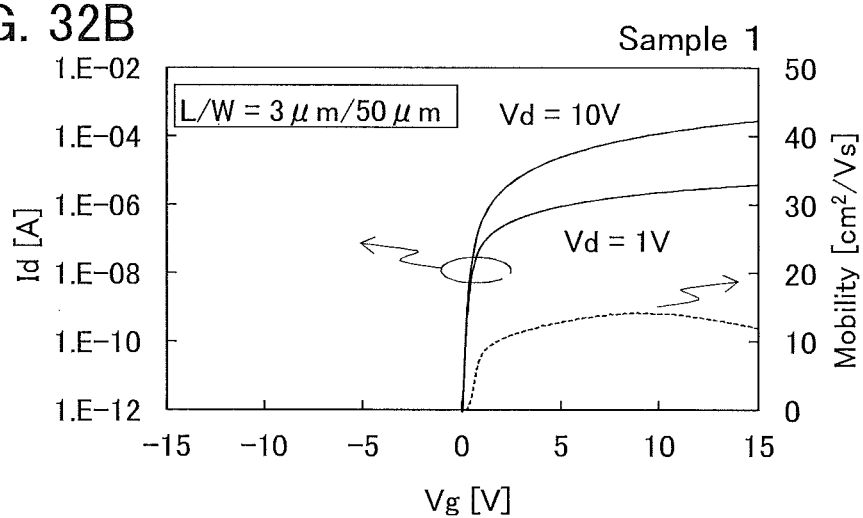
Figure 32C:
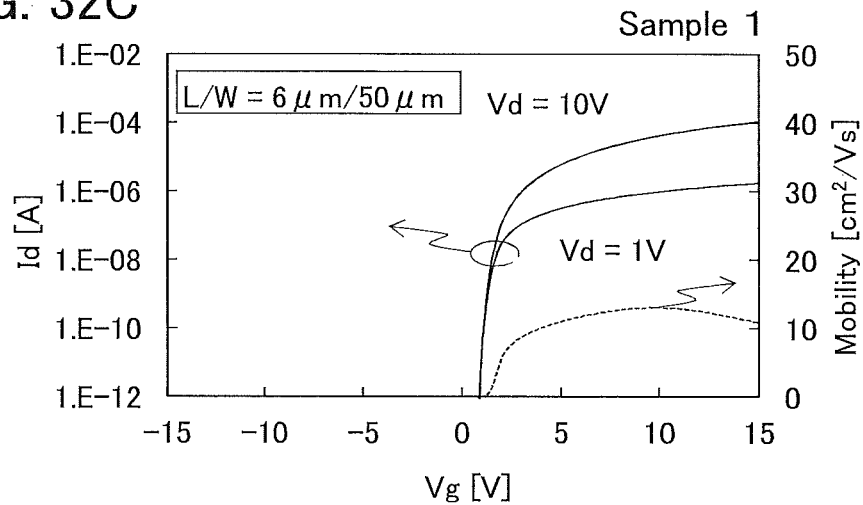
Figure 33A:
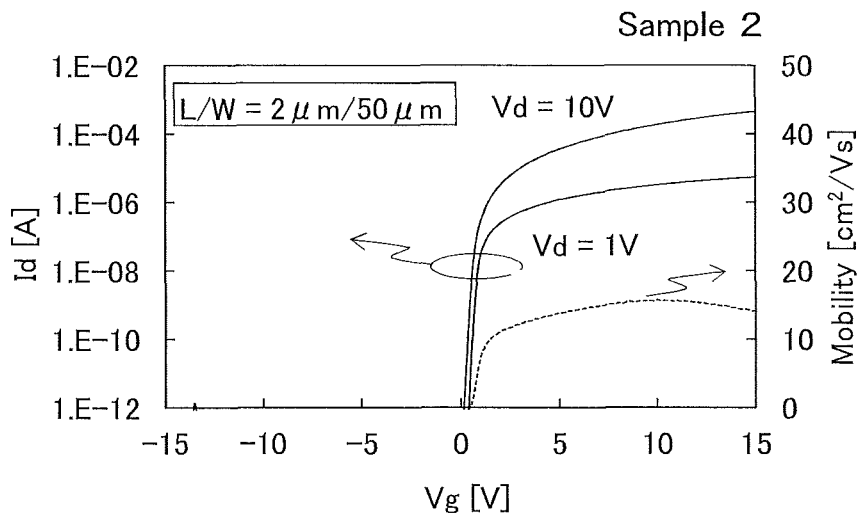
FIGS. 33A to 33C each show $I_d$-$V_g$ characteristics of a transistor of Example.
Figure 33B:
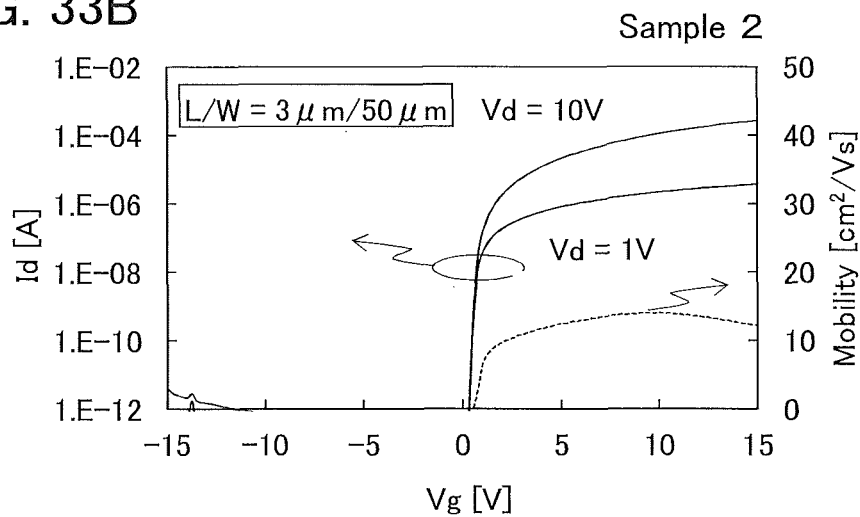
Figure 33C:
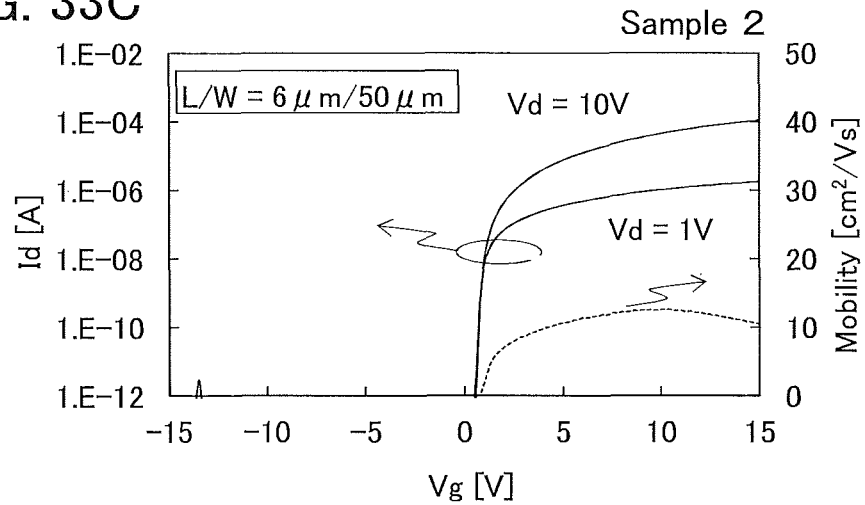

FIGS. 31A to 31C show the $I_d$-$V_g$ characteristics of the sample 3. FIGS. 31A to 31C show results of the transistors with channel lengths L of 2 μm, 3 μm, and 6 μm, respectively. FIGS. 32A to 32C show the $I_d$-$V_g$ characteristics of the sample 1 and FIGS. 33A to 33C show the $I_d$-$V_g$ characteristics of the sample 2.

In each of FIGS. 31A to 31C, FIGS. 32A to 32C, and FIGS. 33A to 33C, the horizontal axis, the left vertical axis, and the right vertical axis represent gate voltage $V_g$, drain current $I_d$, and field-effect mobility, respectively. Here, to show field-effect mobility in a saturation region, field-effect mobility calculated when $V_d$=10 V is shown.

As shown in FIGS. 31A to 31C, the field-effect mobility hardly changes regardless of the channel length L in the sample 3 for comparison. It is shown that as the channel length L becomes smaller and the drain voltage $V_d$ is increased, a shift in the threshold voltage in a negative direction proceeds.

As shown in FIGS. 32A to 32C, the field-effect mobility of the sample 1, which is one embodiment of the present invention, is improved in comparison with the sample 3 regardless of the channel length L. In addition, the field-effect mobility is further improved as the channel length L becomes smaller. Furthermore, even in the case of the smallest channel length L (i.e., L=2 μm), a change in the threshold voltage with respect to the drain voltage $V_d$ in the sample 1 is much smaller than that in the sample 3.

As shown in FIGS. 33A to 33C, the field-effect mobility of the sample 2, which is one embodiment of the present invention, is improved in comparison with the sample 3 regardless of the channel length L. In addition, the field-effect mobility is further improved as the channel length L becomes smaller. Furthermore, even in the case of the smallest channel length L (i.e., L=2 μm), a change in the threshold voltage with respect to the drain voltage $V_d$ in the sample 2 is much smaller than that in the sample 3.

Owing to the dual-gate driving, an electric field can be applied to an oxide semiconductor film where a channel is formed more effectively in the samples 1 and 2 than in the sample 3; consequently, a change in the threshold voltage with respect to the drain voltage $V_d$ can be small in each of the samples 1 and 2 even when the channel length L is small. For the same reason, owing to the dual-gate driving, the samples 1 and 2 are less likely to be affected by the drain voltage $V_d$, and the threshold voltage can be further saturated in the saturation region.

The above results suggest that in the transistor of one embodiment of the present invention, the field-effect mobility of a transistor is increased as the channel length L becomes smaller, and the threshold voltage can have a favorable value even in the case of a small channel length L. The use of such a transistor enables a semiconductor display device to have a narrower frame width.

<BT Stress Test>

A BT stress test and a BT photostress test were performed on each of the samples 1 and 2.

First, a gate BT stress test and a gate BT photostress test were performed.

A measurement method of the gate BT stress test is described. First, initial $I_d$-$V_g$ characteristics of the transistor were measured as described above.

Next, the substrate temperature was kept constant at a given temperature (hereinafter referred to as stress temperature), the pair of electrodes serving as a source electrode and a drain electrode of the transistor was set at the same potential, and the gate electrode was supplied with a potential different from that of the pair of electrodes for a certain period of time (hereinafter referred to as stress time). Next, the substrate temperature was set as appropriate, and the electrical characteristics of the transistor were measured. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (Dark –GBT); whereas a stress test where positive voltage is applied is called positive gate BT stress test (Dark +GBT). Note that a stress test where negative voltage is applied to a gate electrode while light emission is performed is called negative gate BT photostress test (Photo –GBT); whereas a stress test where positive voltage is applied while light emission is performed is called positive gate BT photostress test (Photo +GBT).

Here, the gate BT stress conditions were as follows: stress temperature was 60° C., stress time was 3600 seconds, –30 V or +30 V was applied to the gate electrode, and 0 V was applied to the pair of electrodes serving as the source electrode and the drain electrode. The electric field intensity applied to the gate insulating film was 0.66 MV/cm.

Under the same conditions as those of the above BT stress test, the gate BT photostress test was performed where the transistor was irradiated with white light with 10000 lx using an LED. Note that the $I_d$-$V_g$ characteristics of the transistor were measured at a temperature of 60° C. after each of the BT stress tests.

FIGS. 34A and 34B show a difference between threshold voltage in the initial characteristics and threshold voltage after the BT stress test (i.e., the amount of change in threshold voltage ($\Delta V_{th}$)) and a difference in shift value (i.e., the amount of change in shift value ($\Delta_{Shift}$)) of respective transistors included in the samples 1 and 2. FIGS. 34A and 34B each show the amounts of change due to the positive gate BT stress test (Dark +GBT), the negative gate BT stress test (Dark –GBT), the positive gate BT photostress test (Photo +GBT), and the negative gate BT photostress test (Photo –GBT).

Here, a threshold voltage and a shift value in this specification are described. Threshold voltage $V_{th}$ is defined as, in the $I_d$-$V_g$ curve where the horizontal axis represents gate voltage $V_g$ [V] and the vertical axis represents the square root of drain current $I_d$ ($I_d^{1/2}$)[$A^{1/2}$], gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 10 V.

Furthermore, shift value Shift in this specification is defined as, in the $I_d$-$V_g$ curve where the horizontal axis represents the gate voltage $V_g$ [V] and the vertical axis represents the logarithm of the drain current $I_d$ [A], gate voltage at the intersection point of the line of $I_d$=1.0×10$^{-12}$ [A] and the tangent to the curve at a point where the slope of the curve is the steepest. Note that here, the shift value is calculated with a drain voltage $V_d$ of 10 V.

FIG. 34A shows that the shorter the channel length L of the sample 1 is, the smaller the amounts of changes in threshold voltage and shift value are. The amounts of changes are the smallest in the positive gate BT stress test and the positive gate BT photostress test when the channel length L is the shortest, i.e., 2 µm.

FIG. 34B shows that the shorter the channel length L of the sample 2 is, the smaller the amounts of changes in threshold voltage and shift value are. The amounts of changes are the smallest in the positive gate BT stress test and the positive gate BT photostress test when the channel length L is the shortest, i.e., 2 µm.

The above results show that the transistor of one embodiment of the present invention is a highly reliable transistor in which variations in transistor characteristics are smaller as the channel length L becomes shorter.

The positive gate BT stress tests (Dark +GBT) were performed on the samples 1 to 3. Here, the stress temperature was set to 60° C. and the stress time was set to 100 seconds, 500 seconds, 1500 seconds, 2000 seconds, and 3600 seconds to measure the amount of change in threshold voltage.

Figure 35A:
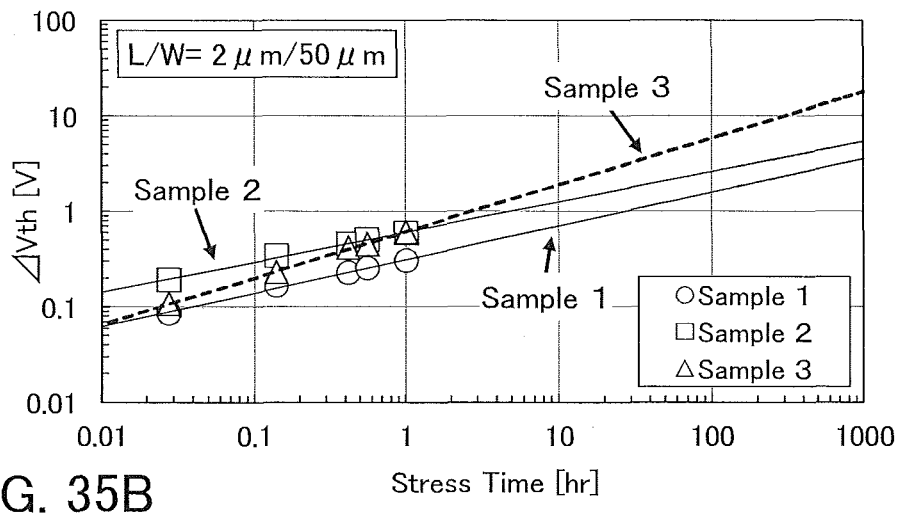
FIGS. 35A to 35C each show results of gate BT stress tests performed on transistors of Example.
Figure 35B:
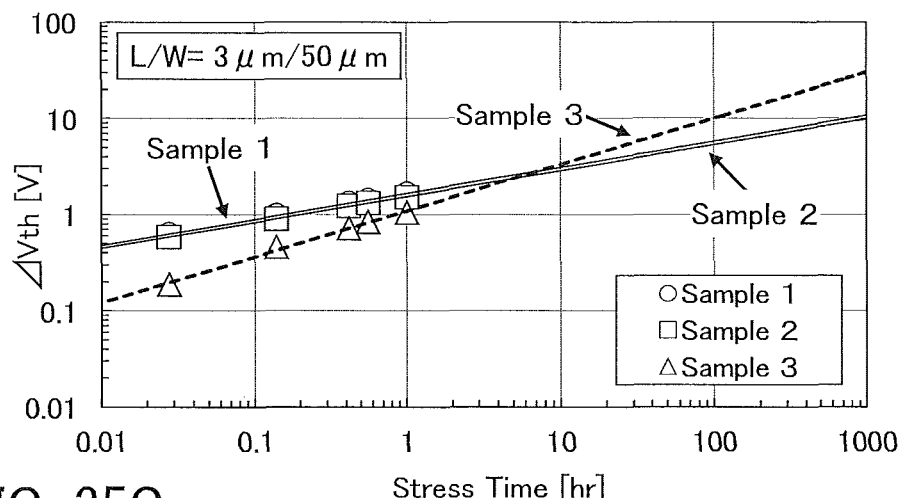
Figure 35C:
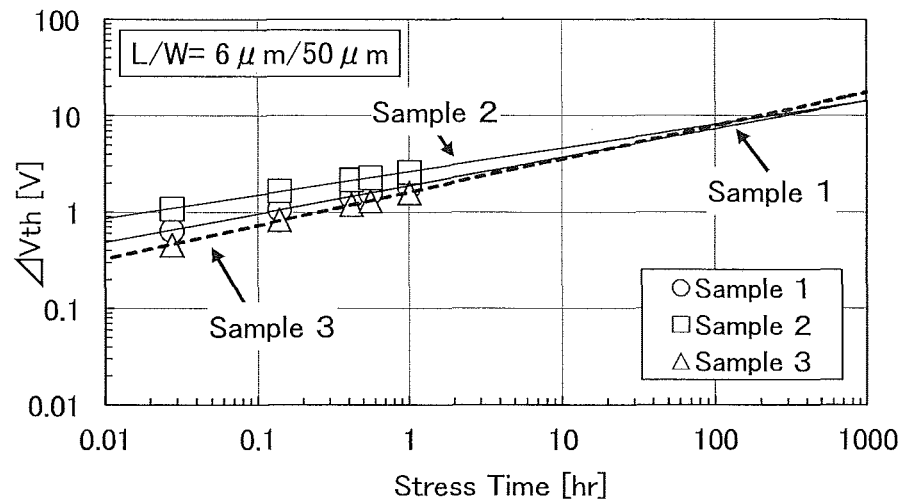

FIGS. 35A to 35C show the amounts of changes in the threshold voltage of transistors with channel lengths L of 2 µm, 3 µm, and 6 µm and approximate lines obtained from the amounts of changes. Note that the graphs in FIGS. 35A to 35C are log-log graphs. In each of the graphs, the horizontal axis represents stress time and the vertical axis represents the amount of change in threshold voltage ($\Delta V_{th}$).

In FIG. 35A, when the stress time is short (e.g., 300 seconds or shorter), the amount of change in the threshold voltage of the sample 3 for comparison is large than or equal to that in the case of the sample 1, which is one embodiment of the present invention. However, the slope of the amount of change in the threshold voltage of the sample 3 to the stress time is steeper than that in the case of the sample 1 and that in the case of the sample 2. Thus, the amount of change in the threshold voltage of the sample 3 is more likely to be smaller than that in the case of the sample 1 and that in the case of the sample 2 as the stress time becomes longer (e.g., 3600 seconds or longer).

In FIGS. 35B and 35C, although the amount of change in the threshold voltage of the sample 3 for comparison is smaller than that in the case of the sample 1 and that in the case of the sample 2 in the measurement range (3600 seconds or shorter), the slope of the amount of change in the threshold voltage of the sample 3 to the stress time is steeper than that in the case of the sample 1 and that in the case of the sample 2. As a result, the amount of change in the threshold voltage of the sample 3 becomes larger than that in the case of the sample 1 and that in the case of the sample 2 as the stress time becomes longer.

The above results show that the transistor of one embodiment of the present invention is a highly reliable transistor with a small change in threshold voltage over time. Furthermore, the reliability can be increased as the channel length L becomes smaller.

Next, the amount of change in the threshold voltage of the sample 1 and that in the case of the sample 2 when the positive gate BT stress tests (Dark +GBT) and the negative gate BT stress tests (Dark −GBT) were alternately performed were measured. Here, the $I_d$-$V_g$ characteristics of the transistors were measured first. Then, the positive gate BT stress test and the negative gate BT stress test were alternately performed four times in total. Each of the gate BT stress tests was performed at a stress temperature of 60° C. at a stress time of 3600 seconds. Here, the channel lengths L of the transistors were 2 μm.

Figure 36A:
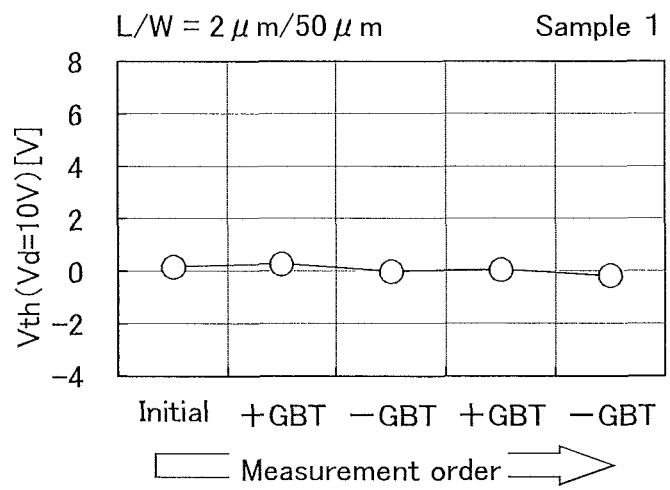
FIGS. 36A and 36B each show results of gate BT stress tests performed on a transistor of Example.
Figure 36B:
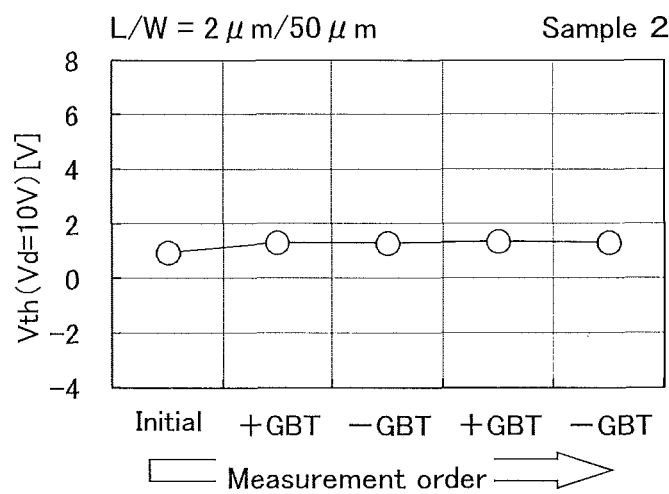

FIGS. 36A and 36B show the threshold voltages of the samples 1 and 2 before the stress tests (Initial) and the threshold voltages after each gate BT stress test. In each of FIGS. 36A and 36B, the vertical axis represents the threshold voltage $V_{th}$, and the horizontal axis represents the measurement order: before the stress tests, after a first positive gate BT stress test, after a first negative gate BT stress test, after a second positive gate BT stress test, and after a second negative gate BT stress test from the left.

In the case where the threshold voltage alternately increases and decreases when positive gate BT stress tests and negative gate BT stress tests are alternately performed, it is assumed that the threshold voltage changes because of trap and detrap of carriers by a trap level at the time of application of voltage to a gate electrode. In the case where the threshold voltage gradually increases or decreases, for example, it is assumed that the threshold voltage changes because carriers trapped by a trap level serve as fixed charges.

FIGS. 36A and 36B show that, in each of the samples 1 and 2, there is almost no difference between the threshold voltage before the stress tests and the threshold voltage after each stress test. This suggests that carriers are hardly trapped by a trap level at the time of application of voltage to the gate electrode.

From the above results, the transistor of one embodiment of the present invention can be regarded as a highly reliable transistor in which the threshold voltage hardly varies even when driven by alternate application of positive voltage and negative voltage to a gate electrode.

This application is based on Japanese Patent Application serial no. 2013-119146 filed with Japan Patent Office on Jun. 5, 2013, Japanese Patent Application serial no. 2014-004227 filed with Japan Patent Office on Jan. 14, 2014, and Japanese Patent Application serial no. 2014-054449 filed with Japan Patent Office on Mar. 18, 2014, the entire contents of which are hereby incorporated by reference.

What is claimed is:

1. A semiconductor device comprising:
   a first gate electrode;
   a first gate insulating film over the first gate electrode;
   an oxide semiconductor film over the first gate insulating film;
   a second gate insulating film over the oxide semiconductor film;
   a second gate electrode over the second gate insulating film; and
   a source electrode and a drain electrode electrically connected to the oxide semiconductor film,
   wherein a first opening portion is provided in the first gate insulating film and the second gate insulating film,
   wherein a second opening portion is provided in the first gate insulating film and the second gate insulating film,
   wherein the oxide semiconductor film is positioned between the first opening portion and the second opening portion, and
   wherein the first gate electrode and the second gate electrode are electrically connected to each other through the first opening portion and the second opening portion.

2. The semiconductor device according to claim 1,
   wherein the source electrode and the drain electrode are over the oxide semiconductor film, and
   wherein the second gate insulating film is over the source electrode and the drain electrode.

3. The semiconductor device according to claim 2, wherein the second gate insulating film is in contact with the oxide semiconductor film.

4. The semiconductor device according to claim 1, wherein a whole of the oxide semiconductor film overlaps the first gate electrode.

5. The semiconductor device according to claim 1,
   wherein the first gate insulating film comprises a first oxide insulating film and a first nitride insulating film,
   wherein the second gate insulating film comprises a second oxide insulating film and a second nitride insulating film, and
   wherein the first nitride insulating film is in contact with the second nitride insulating film.

6. The semiconductor device according to claim 1,
   wherein the oxide semiconductor film comprises a crystal region, and
   wherein a c-axis of a crystal in the crystal region is aligned in a direction parallel to a normal vector of a top surface of the oxide semiconductor film.

7. The semiconductor device according to claim 1, wherein the second gate electrode has a light-transmitting property.

8. The semiconductor device according to claim 1,
   wherein the oxide semiconductor film comprises a channel region, and
   wherein a channel length of the channel region is greater than or equal to 0.5 μm and less than or equal to 6.5 μm.

* * * * *

UNITED STATES PATENT AND TRADEMARK OFFICE
CERTIFICATE OF CORRECTION

| | |
|---|---|
| PATENT NO. | : 9,306,074 B2 |
| APPLICATION NO. | : 14/293484 |
| DATED | : April 5, 2016 |
| INVENTOR(S) | : Shunpei Yamazaki et al. |

It is certified that error appears in the above-identified patent and that said Letters Patent is hereby corrected as shown below:

In the Specification:

Column 2, Line 33; Change "4 still" to --4 µm still--.

Column 7, Line 18; Change "50 nm" to --50 nm.--.

Column 9, Line 12; Change "1 µM" to --1 µm--.

Column 9, Line 13; Change "4 µM," to --4 µm,--.

Column 17, Line 3; Change "GU" to --GI_1--.

Column 18, Line 26; Change "$V_g\_1/$" to --$V_g\_1$--.

Column 21, Line 6; Change "$cm^2 V \cdot sec$" to --$cm^2 V/sec$--.

Column 21, Line 7; Change "$cm^2 V \cdot sec$" to --$cm^2 V/sec$--.

Column 24, Line 15; Change "Ruined" to --formed--.

Column 26, Line 32; Change "mm/min," to --nm/min,--.

Column 27, Line 56; Change "haying" to --having--.

Column 28, Line 6; Change "oxide, insulating" to --oxide insulating--.

Column 41, Lines 54 to 55; Change "In:M:Zn=[atomic ratio]" to --In:M:Zn=$x_1$:$y_1$:$z_1$[atomic ratio]--.

Column 42, Line 1; Change "Zn=$x_1$ is" to --Zn=$x_1$:$y_1$:$z_1$ is--.

Column 42, Line 16; Change "$x_1/y_r$," to --$x_1/y_1$,--.

Column 46, Line 26; Change "farmed" to --formed--.

Column 48, Line 12; Change "(EEM)" to --(TEM)--.

Column 48, Line 60; Change "when 28 is" to --when 20 is--.

Column 50, Line 53; Change "aligmnent" to --alignment--.

Column 50, Line 60; Change "aligmnent" to --alignment--.

Column 53, Line 41; Change "in scan" to --m scan--.

Signed and Sealed this
Ninth Day of August, 2016

Michelle K. Lee
*Director of the United States Patent and Trademark Office*

CERTIFICATE OF CORRECTION (continued)
U.S. Pat. No. 9,306,074 B2

In the Specification:

Column 53, Lines 54 to 55; Change "to the pixels" to --to the n pixels--.

Column 53, Lines 57 to 58; Change "the in pixels" to --the m pixels--.

Column 53, Line 66; Change "the in pixels" to --the m pixels--.

Column 54, Line 35; Change "alignment (IBA)" to --alignment (TBA)--.

Column 60, Line 47; Change "farmed" to --formed--.

Column 60, Line 65; Change "fainted" to --formed--.

Column 64, Line 50; Change "on, the" to --on the--.

Column 66, Line 14; Change "fitted" to --fritted--.

Column 66, Line 18; Change "fitted" to --fritted--.

Column 71, Line 44; Change "10000 l×" to --10000 lx--.

Column 71, Line 52; Change "($\Delta_{Shift}$)" to --($\Delta$Shift)--.